(12) United States Patent
Stam

(10) Patent No.: US 7,653,215 B2
(45) Date of Patent: Jan. 26, 2010

(54) SYSTEM FOR CONTROLLING EXTERIOR VEHICLE LIGHTS

(75) Inventor: Joseph S. Stam, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 607 days.

(21) Appl. No.: 11/251,554

(22) Filed: Oct. 14, 2005

(65) Prior Publication Data

US 2006/0177098 A1    Aug. 10, 2006

Related U.S. Application Data

(60) Continuation-in-part of application No. 11/231,230, filed on Sep. 20, 2005, now abandoned, which is a (Continued)

(60) Provisional application No. 60/339,762, filed on Dec. 10, 2001.

(51) Int. Cl.
*G06K 9/00* (2006.01)
*H04N 7/00* (2006.01)

(52) U.S. Cl. ..................... 382/104; 348/118

(58) Field of Classification Search .............. 382/104, 382/291; 315/77–80, 82; 340/457.2, 901, 340/930, 933, 458, 815.73; 701/23, 36, 45, 701/49, 53, 72, 74; 362/465, 466, 467; 250/201.9, 250/552, 591; 348/118
See application file for complete search history.

(56) References Cited

U.S. PATENT DOCUMENTS 2,131,888 A    10/1938    Harris
2,632,040 A     3/1953    Rabinow (Continued)

FOREIGN PATENT DOCUMENTS

DE    2946561    5/1981
FR    2641237    7/1990

(Continued)

OTHER PUBLICATIONS

JP Abstract of Patent No. 60-015237, "Headlight Device," (Jan. 25, 1985).

(Continued)

*Primary Examiner*—Abolfazl Tabatabai
(74) *Attorney, Agent, or Firm*—Price, Heneveld, Cooper, DeWitt & Litton, LLP

(57) ABSTRACT

A system and method of automatically controlling exterior vehicle lights includes an image sensor and a controller to generate control signals. The control signals are derived based on information obtained from the image sensor as well as other detected parameters pertaining to the detected light source(s), the vehicle having the inventive control system, and the ambient environment. The control circuit may simply turn certain exterior lights on or off, or change the brightness, aim, focus, etc. to produce various beam patterns that maximize the illuminated area in front of the vehicle without causing excessive glare in the eyes of other drivers.

11 Claims, 40 Drawing Sheets

Related U.S. Application Data

(60) continuation of application No. 10/316,511, filed on Dec. 11, 2002, now Pat. No. 6,928,180, which is a continuation of application No. 09/800,460, filed on Mar. 5, 2001, now Pat. No. 6,587,573, which is a continuation-in-part of application No. 09/528,389, filed on Mar. 20, 2000, now Pat. No. 6,611,610, which is a continuation-in-part of application No. 09/151,487, filed on Sep. 11, 1998, now Pat. No. 6,255,639, which is a continuation of application No. 08/831,232, filed on Apr. 2, 1997, now Pat. No. 5,837,994, application No. 11/251,554, which is a continuation-in-part of application No. 10/274,637, filed on Oct. 21, 2002, now Pat. No. 7,432,967, which is a continuation of application No. 09/448,364, filed on Nov. 23, 1999, now Pat. No. 6,469,739, which is a continuation of application No. 08/933,210, filed on Sep. 16, 1997, now Pat. No. 5,990,469, which is a continuation-in-part of application No. 08/831,232, filed on Apr. 2, 1997, now Pat. No. 5,837,994, application No. 11/251,554, which is a continuation-in-part of application No. 11/144,971, filed on Jun. 3, 2005, now abandoned, which is a continuation of application No. 10/617,323, filed on Jul. 10, 2003, now Pat. No. 6,906,467, which is a continuation of application No. 10/197,834, filed on Jul. 18, 2002, now Pat. No. 6,593,698, which is a continuation of application No. 09/938,774, filed on Aug. 24, 2001, now Pat. No. 6,429,594, which is a continuation of application No. 09/546,858, filed on Apr. 10, 2000, now Pat. No. 6,281,632, which is a continuation of application No. 09/157,063, filed on Sep. 18, 1998, now Pat. No. 6,049,171, application No. 11/251,554, which is a continuation-in-part of application No. 11/081,036, filed on Mar. 15, 2005, now Pat. No. 7,149,613, and a continuation-in-part of application No. 10/999,175, filed on Nov. 29, 2004, now Pat. No. 6,946,639, which is a continuation of application No. 10/289,239, filed on Nov. 6, 2002, now abandoned, which is a continuation of application No. 09/878,799, filed on Jun. 12, 2001, now Pat. No. 6,495,815, which is a continuation of application No. 09/592,896, filed on Jun. 13, 2000, now Pat. No. 6,262,410, which is a continuation of application No. 09/347,093, filed on Jul. 2, 1999, now Pat. No. 6,097,024, which is a continuation of application No. 08/931,118, filed on Sep. 16, 1997, now Pat. No. 5,923,027, said application No. 11/081,036 is a continuation of application No. 10/639,112, filed on Aug. 12, 2003, now Pat. No. 6,868,322, which is a continuation of application No. 09/799,310, filed on Mar. 5, 2001, now Pat. No. 6,631,316, said application No. 11/251,554 and a continuation-in-part of application No. 10/759,359, filed on Jan. 19, 2004, now Pat. No. 7,019,275, is a continuation-in-part of application No. 10/289,239, filed on Nov. 6, 2002, now abandoned, which is a continuation of application No. 09/878,799, filed on Jun. 12, 2001, now Pat. No. 6,495,815, which is a continuation of application No. 09/592,896, filed on Jun. 13, 2000, now Pat. No. 6,262,410, which is a continuation of application No. 09/347,093, filed on Jul. 2, 1999, now Pat. No. 6,097,024, which is a continuation of application No. 08/931,118, filed on Sep. 16, 1997, now Pat. No. 5,923,027, said application No. 10/759,359 and a continuation of application No. 09/970,728, filed on Oct. 4, 2001, now Pat. No. 6,681,163, , said application No. 11/251,554 and a continuation-in-part of application No. 10/993,765, filed on Nov. 19, 2004, now abandoned, is a continuation of application No. 10/235,476, filed on Sep. 5, 2002, now Pat. No. 6,861,809, said application No. 10/993,765 and a continuation-in-part of application No. 10/197,834, filed on Jul. 18, 2002, now Pat. No. 6,593,698, is a continuation of application No. 09/938,774, filed on Aug. 24, 2001, now Pat. No. 6,429,594, which is a continuation of application No. 09/546,858, filed on Apr. 10, 2000, now Pat. No. 6,281,632, which is a continuation of application No. 09/157,063, filed on Sep. 18, 1998, now Pat. No. 6,049,171, said application No. 11/251,554 and a continuation-in-part of application No. 10/914,732, filed on Aug. 9, 2004, now abandoned, is a continuation of application No. 10/208,142, filed on Jul. 30, 2002, now Pat. No. 6,774,988, said application No. 11/251,554 and a continuation-in-part of application No. 11/143,150, filed on Jun. 2, 2005, now Pat. No. 7,408,136, is a continuation of application No. 10/640,851, filed on Aug. 14, 2003, now Pat. No. 6,924,470, which is a continuation of application No. 09/952,521, filed on Sep. 12, 2001, now Pat. No. 6,653,615, which is a continuation of application No. 09/677,906, filed on Oct. 3, 2000, now Pat. No. 6,291,812, which is a division of application No. 09/093,993, filed on Jun. 9, 1998, now Pat. No. 6,130,421.

(56) References Cited

U.S. PATENT DOCUMENTS

| | | |
|---|---|---|
| 2,827,594 A | 3/1958 | Rabinow |
| 3,179,845 A | 4/1965 | Kulwiec |
| 3,581,276 A | 5/1971 | Newman |
| 3,663,819 A | 5/1972 | Hicks et al. |
| 4,117,453 A * | 9/1978 | Hodgson et al. ............... 315/82 |
| 4,139,801 A | 2/1979 | Linares |
| 4,151,526 A | 4/1979 | Hinachi et al. |
| 4,236,099 A | 11/1980 | Rosenblum |
| 4,258,979 A | 3/1981 | Mahin |
| 4,286,308 A | 8/1981 | Wolff |
| 4,357,558 A | 11/1982 | Massoni et al. |
| 4,376,909 A | 3/1983 | Tagami et al. |
| 4,599,544 A | 7/1986 | Martin |
| 4,645,975 A | 2/1987 | Meitzler et al. |
| 4,665,321 A | 5/1987 | Chang et al. |
| 4,692,798 A | 9/1987 | Seko et al. |
| 4,716,298 A | 12/1987 | Etoh |
| 4,727,290 A | 2/1988 | Smith et al. |
| 4,768,135 A | 8/1988 | Kretschmer et al. |
| 4,862,037 A | 8/1989 | Farber et al. |
| 4,891,559 A | 1/1990 | Matsumoto et al. |
| 4,930,742 A | 6/1990 | Schofield et al. |
| 4,934,273 A | 6/1990 | Endriz |
| 4,967,319 A | 10/1990 | Seko |
| 5,008,946 A | 4/1991 | Ando |
| 5,036,437 A | 7/1991 | Macks |
| 5,072,154 A | 12/1991 | Chen |
| 5,086,253 A | 2/1992 | Lawler |
| 5,096,287 A | 3/1992 | Kakinami et al. |
| 5,124,549 A | 6/1992 | Michaels et al. |
| 5,166,681 A | 11/1992 | Bottesch et al. |
| 5,182,502 A | 1/1993 | Slotkowski et al. |
| 5,187,383 A | 2/1993 | Taccetta et al. |
| 5,235,178 A | 8/1993 | Hegyi |
| 5,329,206 A | 7/1994 | Slotkowski et al. |
| 5,347,261 A | 9/1994 | Adell |
| 5,347,459 A | 9/1994 | Greenspan et al. |
| 5,355,146 A | 10/1994 | Chiu et al. |
| 5,379,104 A | 1/1995 | Takao |
| 5,396,054 A | 3/1995 | Krichever et al. |

| | | |
|---|---|---|
| 5,402,170 A | 3/1995 | Parulski et al. |
| 5,416,318 A | 5/1995 | Hegyi |
| 5,426,294 A | 6/1995 | Kobayashi et al. |
| 5,428,464 A | 6/1995 | Silverbrook |
| 5,430,450 A | 7/1995 | Holmes |
| 5,434,407 A | 7/1995 | Bauer et al. |
| 5,451,822 A | 9/1995 | Bechtel et al. |
| 5,452,004 A | 9/1995 | Roberts |
| 5,471,515 A | 11/1995 | Fossum et al. |
| 5,475,441 A | 12/1995 | Parulski et al. |
| 5,479,173 A | 12/1995 | Yoshioka et al. |
| 5,481,268 A | 1/1996 | Higgins |
| 5,483,346 A | 1/1996 | Butzer |
| 5,485,155 A | 1/1996 | Hibino |
| 5,508,592 A | 4/1996 | Lapatovich et al. |
| 5,537,003 A | 7/1996 | Bechtel et al. |
| 5,541,724 A | 7/1996 | Hoashi |
| 5,550,551 A * | 8/1996 | Alesio ............... 342/457 |
| 5,550,677 A | 8/1996 | Schofield et al. |
| 5,554,912 A | 9/1996 | Thayer et al. |
| 5,574,463 A | 11/1996 | Shirai et al. |
| 5,587,929 A | 12/1996 | League et al. |
| 5,592,146 A | 1/1997 | Kover, Jr. |
| 5,614,788 A | 3/1997 | Mullins et al. |
| 5,621,460 A | 4/1997 | Hatlestad et al. |
| 5,660,454 A | 8/1997 | Mori et al. |
| 5,666,028 A | 9/1997 | Bechtel et al. |
| 5,684,473 A | 11/1997 | Hibino et al. |
| 5,707,129 A | 1/1998 | Kobayashi |
| 5,710,565 A | 1/1998 | Shirai et al. |
| 5,714,751 A | 2/1998 | Chen |
| 5,715,093 A | 2/1998 | Schierbeek et al. |
| 5,736,816 A * | 4/1998 | Strenke et al. ............ 315/82 |
| 5,751,832 A | 5/1998 | Panter et al. |
| 5,781,105 A * | 7/1998 | Bitar et al. ............... 340/468 |
| 5,786,787 A | 7/1998 | Eriksson et al. |
| 5,796,094 A | 8/1998 | Schofield et al. |
| 5,798,727 A | 8/1998 | Shirai et al. |
| 5,811,888 A | 9/1998 | Hsieh |
| 5,812,321 A | 9/1998 | Schierbeek et al. |
| 5,835,613 A | 11/1998 | Breed et al. |
| 5,837,994 A | 11/1998 | Stam et al. |
| 5,841,126 A | 11/1998 | Fossum et al. |
| 5,845,000 A | 12/1998 | Breed et al. |
| 5,867,214 A | 2/1999 | Anderson et al. |
| 5,877,897 A | 3/1999 | Schofield et al. |
| 5,905,457 A | 5/1999 | Rashid |
| 5,912,534 A | 6/1999 | Benedict |
| 5,923,027 A | 7/1999 | Stam et al. |
| 5,942,853 A * | 8/1999 | Piscart ............... 315/82 |
| 5,990,469 A | 11/1999 | Bechtel et al. |
| 6,008,486 A | 12/1999 | Stam et al. |
| 6,018,308 A | 1/2000 | Shirai |
| 6,049,171 A | 4/2000 | Stam et al. |
| 6,097,023 A | 8/2000 | Schofield et al. |
| 6,102,546 A | 8/2000 | Carter |
| 6,130,421 A | 10/2000 | Bechtel et al. |
| 6,140,933 A | 10/2000 | Bugno et al. |
| 6,144,158 A | 11/2000 | Beam |
| 6,166,698 A | 12/2000 | Turnbull et al. |
| 6,184,781 B1 | 2/2001 | Ramakesavan |
| 6,255,639 B1 | 7/2001 | Stam et al. |
| 6,281,632 B1 | 8/2001 | Stam et al. |
| 6,329,925 B1 | 12/2001 | Skiver et al. |
| 6,349,782 B1 | 2/2002 | Sekiya et al. |
| 6,356,376 B1 | 3/2002 | Tonar et al. |
| 6,379,013 B1 | 4/2002 | Bechtel et al. |
| 6,396,040 B1 * | 5/2002 | Hill ............... 250/205 |
| 6,396,397 B1 | 5/2002 | Bos et al. |
| 6,403,942 B1 | 6/2002 | Stam |
| 6,442,465 B2 | 8/2002 | Breed et al. |
| 6,443,602 B1 * | 9/2002 | Tanabe et al. ............... 362/465 |
| 6,465,962 B1 * | 10/2002 | Fu et al. ............... 315/77 |
| 6,469,739 B1 * | 10/2002 | Bechtel et al. ............... 348/302 |
| 6,483,438 B2 | 11/2002 | DeLine et al. |
| 6,491,416 B1 | 12/2002 | Strazzanti |
| 6,507,779 B2 | 1/2003 | Breed et al. |
| 6,550,943 B2 | 4/2003 | Strazzanti |
| 6,558,026 B2 | 5/2003 | Strazzanti |
| 6,617,564 B2 | 9/2003 | Ockerse et al. |
| 6,902,307 B2 | 6/2005 | Strazzanti |
| 6,913,375 B2 | 7/2005 | Strazzanti |
| 2002/0040962 A1 | 4/2002 | Schofield et al. |
| 2003/0202357 A1 | 10/2003 | Strazzanti |
| 2004/0145905 A1 | 7/2004 | Strazzanti |

FOREIGN PATENT DOCUMENTS

| | | |
|---|---|---|
| FR | 2726144 | 4/1996 |
| GB | 2313973 | 12/1997 |
| JP | 5744541 | 3/1982 |
| JP | 6015237 | 1/1985 |
| JP | 62131837 | 6/1987 |
| JP | 01233129 A | 9/1989 |
| JP | 5139203 | 6/1993 |
| JP | 5342901 | 12/1993 |
| JP | 06151067 | 5/1994 |
| JP | 06267304 | 9/1994 |
| JP | 6276524 | 9/1994 |
| JP | 6295601 | 10/1994 |
| JP | 6321007 | 11/1994 |
| JP | 732936 | 2/1995 |
| JP | 747878 | 2/1995 |
| JP | 7052706 | 2/1995 |
| JP | 769125 | 3/1995 |
| JP | 8166221 | 6/1996 |
| JP | 08221700 A | 8/1996 |
| WO | WO 8605147 | 9/1986 |
| WO | WO 9735743 | 10/1997 |
| WO | WO 9843850 | 10/1998 |
| WO | WO 9947396 | 9/1999 |
| WO | WO 0022881 | 4/2000 |

OTHER PUBLICATIONS

JP Abstract of Patent No. 01233129 A, "Optical Axis Changing Device for Illuminating Lamp," (Sep. 18, 1989).

Christopher M. Kormanyos, "SAE Paper No. 980003 entitled "HID System with Adpative Vertical Aim Control"," p. 13-18.

J.P. Lowenau et al., "SAE Paper No. 980007 entitled "Adaptive Light Control—A New Light Concept Controlled by Vehicle Dynamics and Navigation"," p. 33-38.

Franz-Josef Kalze, "SAE Paper No. 980005 entitled "Xenon Light for Main and Dipped Beam"," p. 23-26.

Tohru Shimizu et al., "SAE Paper No. 980322 entitled "Development of PWM DRL with Low RF Emissions and Low Heat"," p. 113-117.

JP Abstract of Patent No. 5342901, "Projection Headlamp for Vehicles," p. 1.

JP Abstract for Patent No. 6321007, "Vehicular Dazzle Sensor," p. 1.

JP Abstract of Patent No. 08221700 A, "Stop Lamp Recognition Device," p. 1.

* cited by examiner

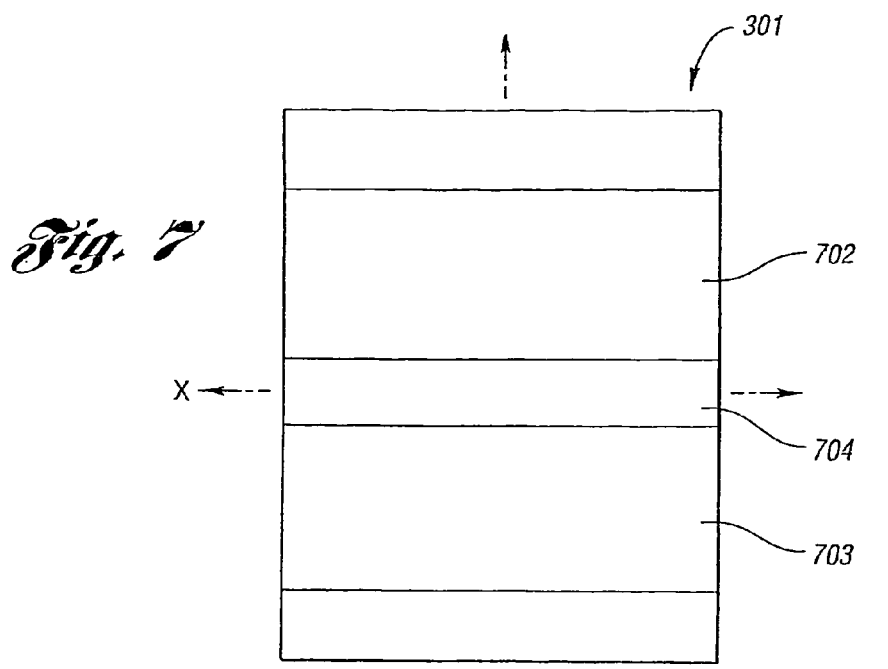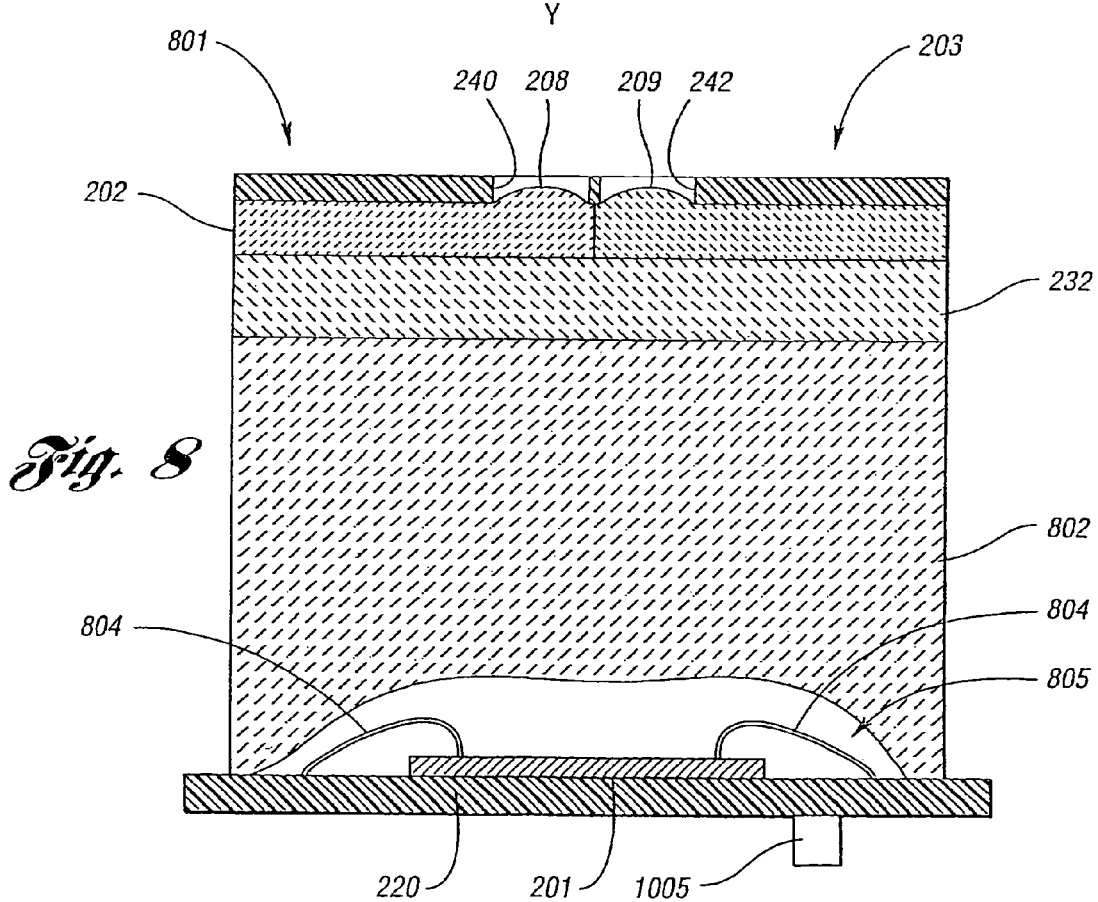

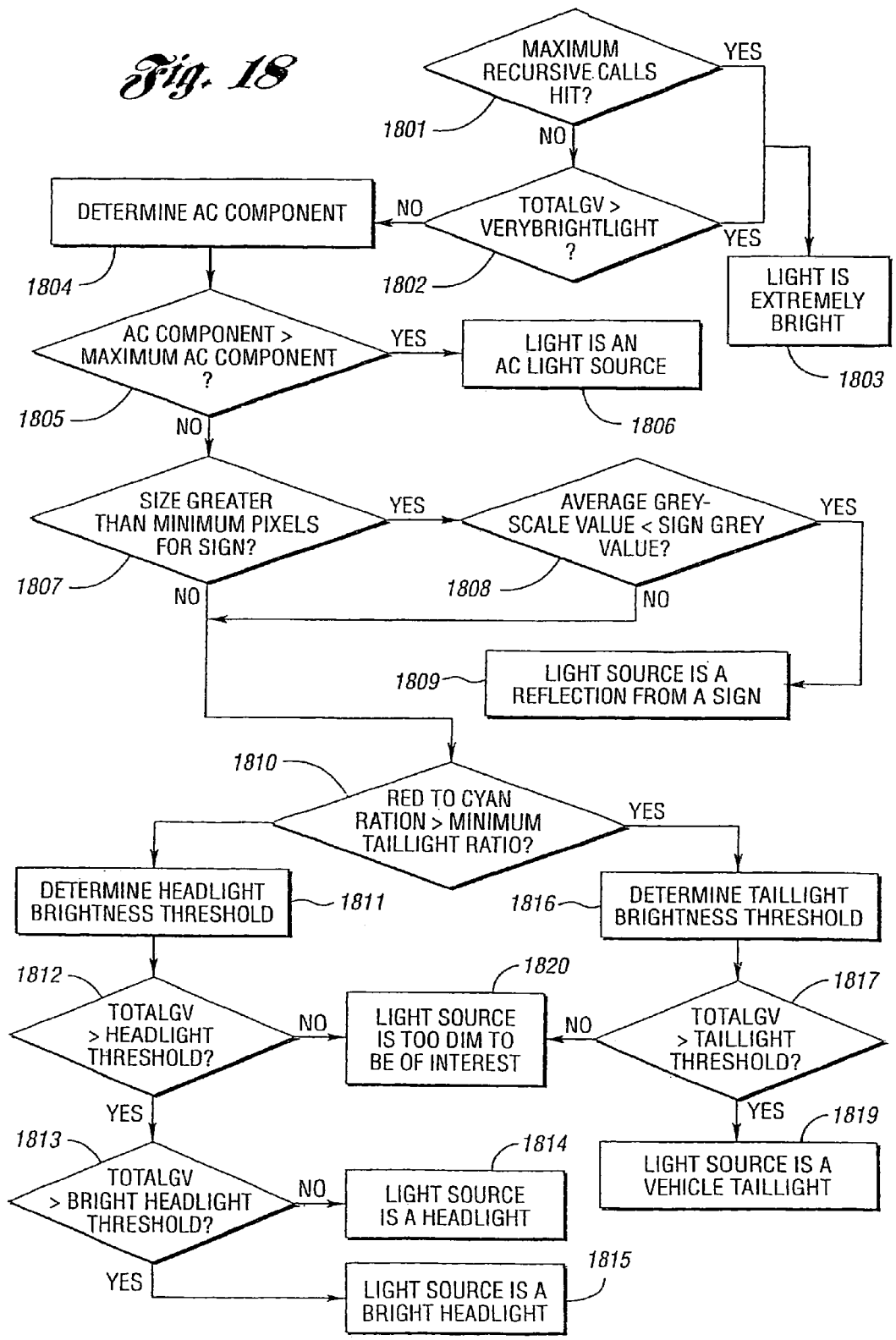

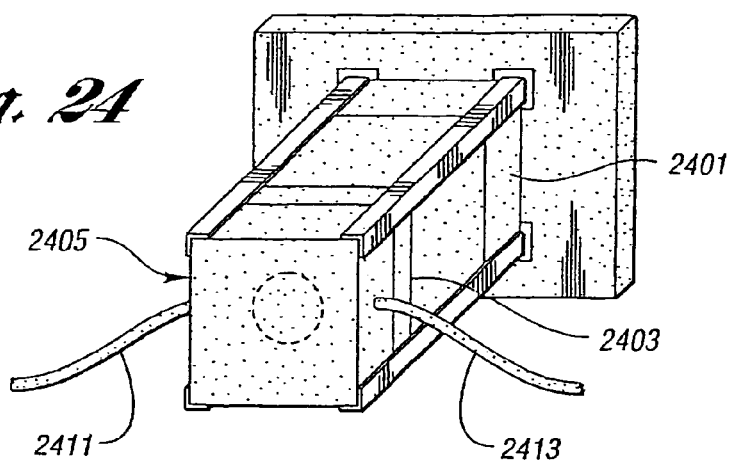
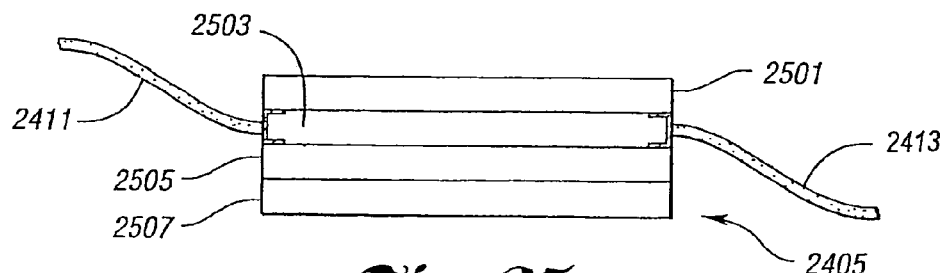
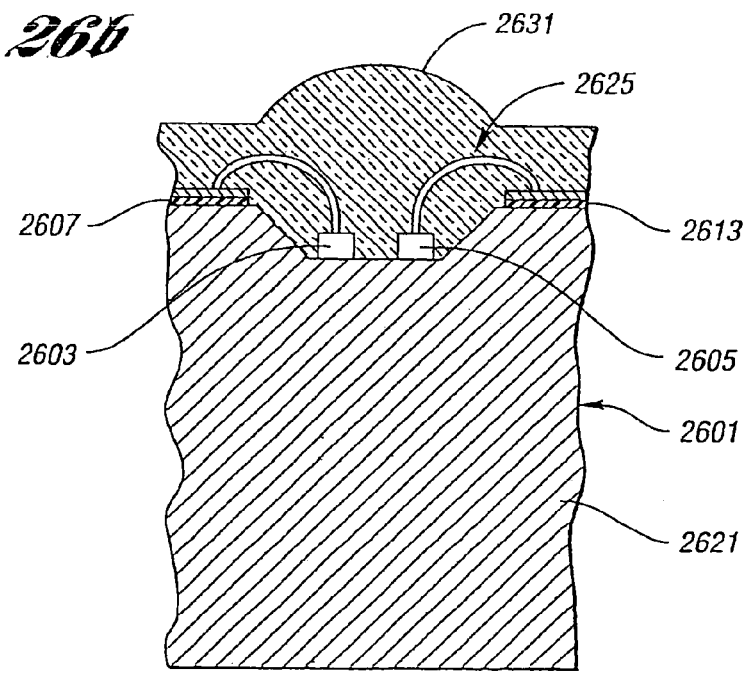

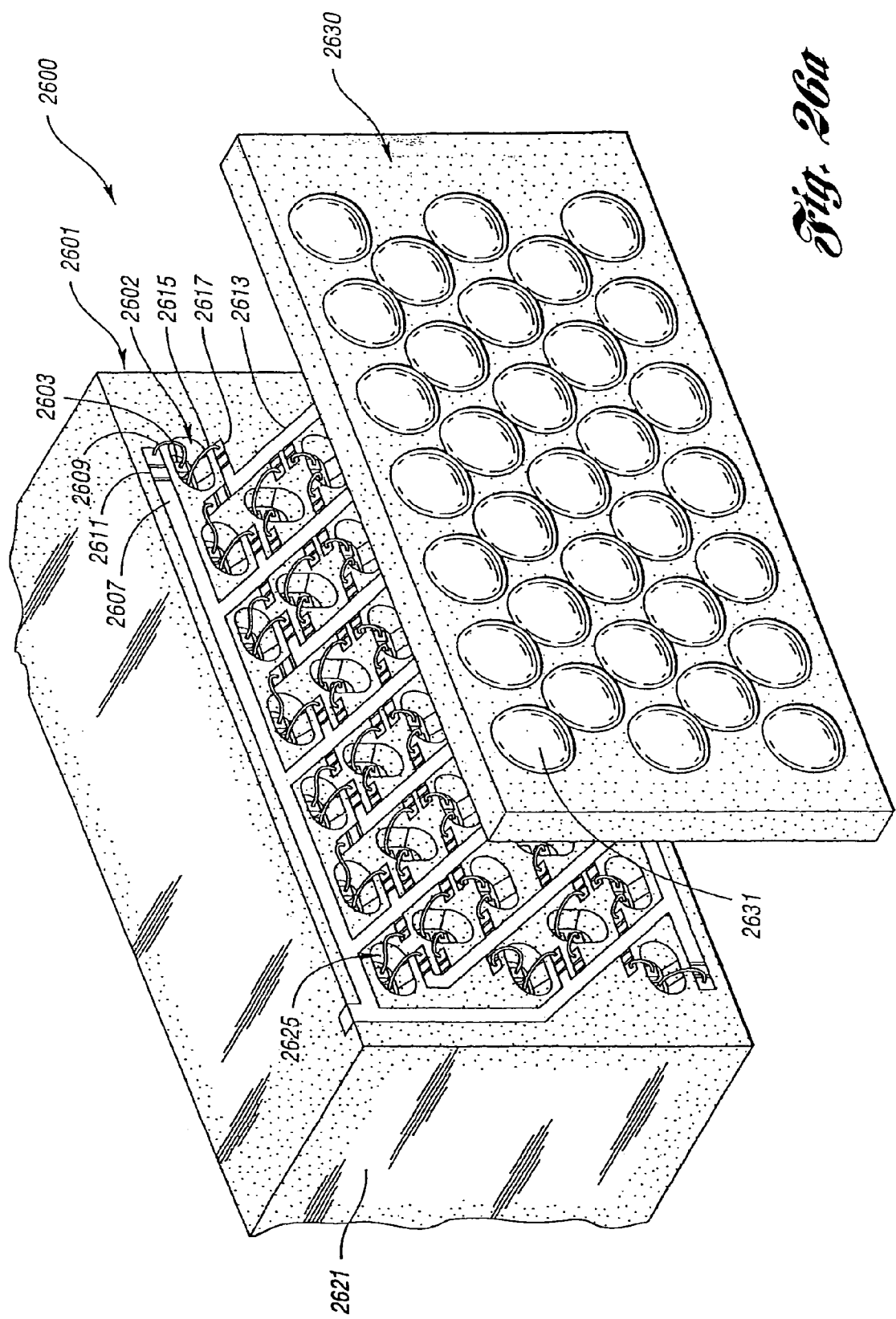

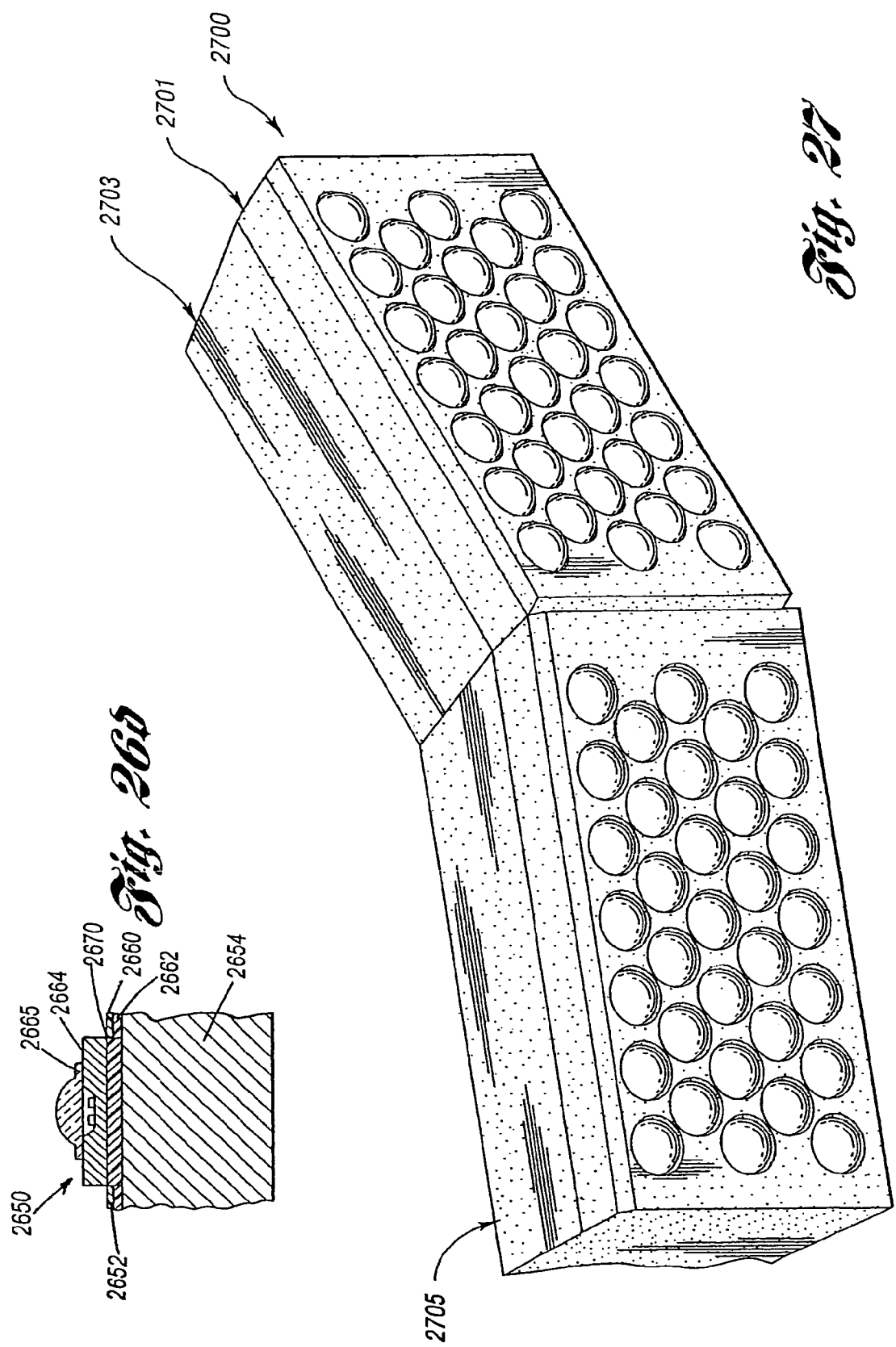

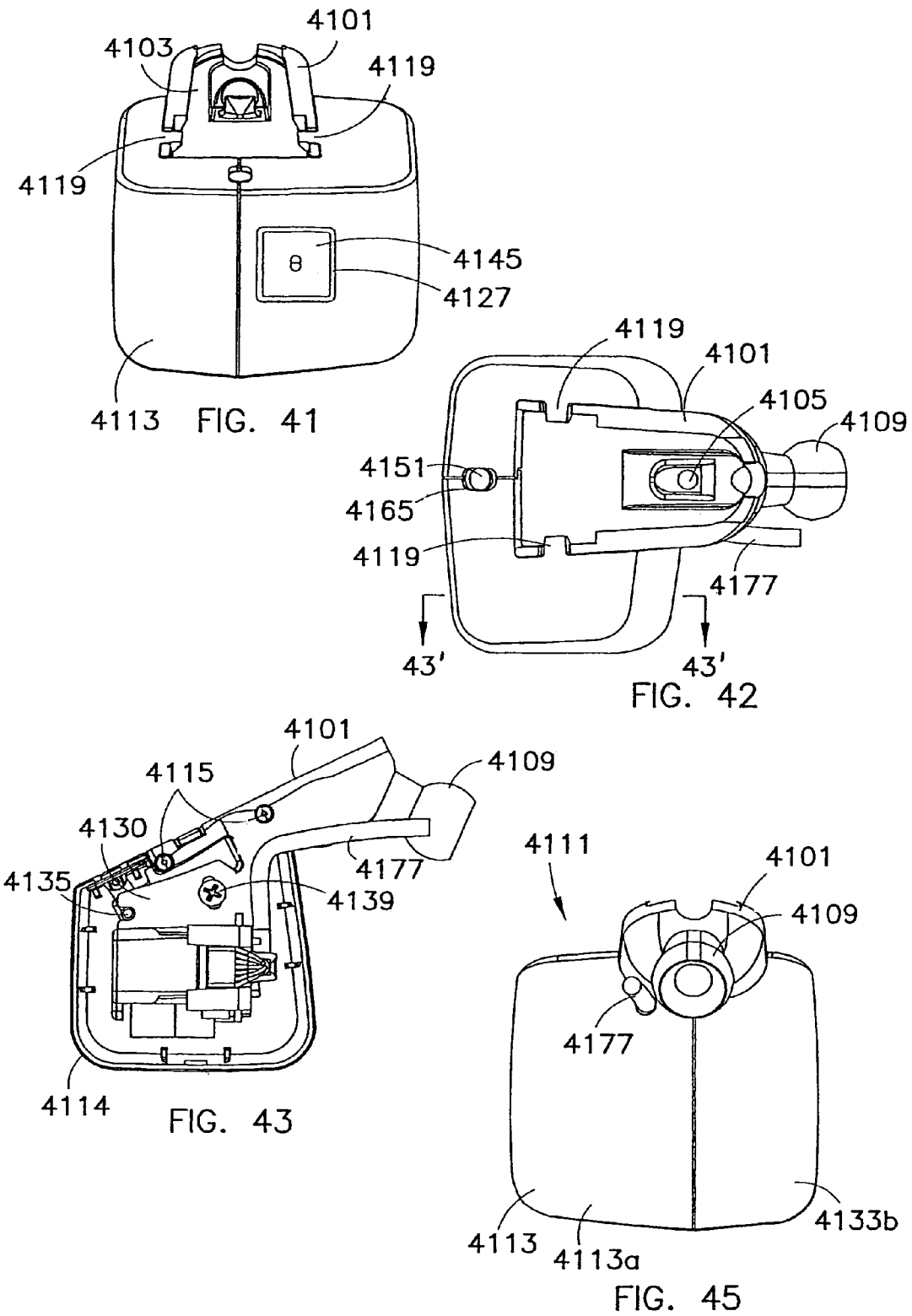

SYSTEM FOR CONTROLLING EXTERIOR VEHICLE LIGHTS

CROSS-REFERENCE TO RELATED APPLICATIONS

This application is a continuation-in-part of U.S. patent application Ser. No. 11/231,230 (unofficial) filed Sep. 20, 2005, by Stam et al. and entitled "SYSTEM FOR CONTROLLING EXTERIOR VEHICLE LIGHTS," now abandoned, which is a continuation of U.S. patent application Ser. No. 10/316,511 filed Dec. 11, 2002, now U.S. Pat. No. 6,928,180, which is a continuation of U.S. patent application Ser. No. 09/800,460 filed Mar. 5, 2001, now U.S. Pat. No. 6,587,573, which is a continuation-in-part of U.S. patent application Ser. No. 09/528,389 filed Mar. 20, 2000, now U.S. Pat. No. 6,611,610, which is a continuation-in-part of U.S. patent application Ser. No. 09/151,487, filed Sep. 11, 1998, now U.S. Pat. No. 6,255,639, which is a continuation of U.S. patent application Ser. No. 08/831,232 filed Apr. 2, 1997, now U.S. Pat. No. 5,837,994.

This application is also a continuation-in-part of U.S. patent application Ser. No. 10/274,637 filed Oct. 21, 2002, now U.S. Pat. No. 7,432,967, which is a continuation of U.S. patent application Ser. No. 09/448,364 filed Nov. 23, 1999, now U.S. Pat. No. 6,469,739, which is a continuation of U.S. patent application Ser. No. 08/933,210 filed Sep. 16, 1997, now U.S. Pat. No. 5,990,469, which is a continuation-in-part of U.S. patent application Ser. No. 08/831,232 filed Apr. 2, 1997, now U.S. Pat. No. 5,837,994.

This application is also a continuation-in-part of U.S. patent application Ser. No. 11/144,971 filed on Jun. 3, 2005, now abandoned, which is a continuation of U.S. patent application Ser. No. 10/617,323 filed on Jul. 10, 2003, now U.S. Pat. No. 6,906,467, which is a continuation of U.S. patent application Ser. No. 10/197,834 filed on Jul. 18, 2002, now U.S. Pat. No. 6,593,698, which is a continuation of U.S. patent application Ser. No. 09/938,774 filed on Aug. 24, 2001, now U.S. Pat. No. 6,429,594, which is a continuation of U.S. patent application Ser. No. 09/546,858 filed on Apr. 10, 2000, now U.S. Pat. No. 6,281,632, which is a continuation of U.S. patent application Ser. No. 09/157,063, filed on Sep. 18, 1998, by Joseph S. Stam et al., now U.S. Pat. No. 6,049,171.

This application is also a continuation-in-part of U.S. patent application Ser. No. 11/081,036 filed Mar. 15, 2005, now U.S. Pat. No. 7,149,613, which is a continuation of U.S. patent application Ser. No. 10/639,112, filed Aug. 12, 2003, now U.S. Pat. No. 6,868,322, which is a continuation of U.S. patent application Ser. No. 09/799,310, filed Mar. 5, 2001, now U.S. Pat. No. 6,631,316.

This application is also a continuation-in-part of U.S. patent application Ser. No. 11/231,234, entitled "MOISTURE SENSOR AND WINDSHIELD FOG DETECTOR," filed Sep. 20, 2005 by Stam et al., now U.S. Pat. No. 7,199,346, which is a continuation of U.S. patent application Ser. No. 10/999,175 filed Nov. 29, 2004, now U.S. Pat. No. 6,946,639, which is a continuation of U.S. patent application Ser. No. 10/289,239 filed Nov. 6, 2002, now abandoned, which is a continuation of U.S. patent application Ser. No. 09/878,799 filed Jun. 12, 2001, now U.S. Pat. No. 6,495,815, which is a continuation of U.S. patent application Ser. No. 09/592,896 filed Jun. 13, 2000, now U.S. Pat. No. 6,262,410, which is a continuation of U.S. patent application Ser. No. 09/347,093, filed on Jul. 2, 1999, now U.S. Pat. No. 6,097,024, which is a continuation of U.S. patent application Ser. No. 08/931,118, filed on Sep. 16, 1997, now U.S. Pat. No. 5,923,027.

This application is also a continuation-in-part of U.S. patent application Ser. No. 10/759,359 filed Jan. 19, 2004, now U.S. Pat. No. 7,019,275, which is a continuation-in-part of U.S. patent application Ser. No. 10/289,239 filed on Nov. 6, 2002, now abandoned, which is a continuation of U.S. patent application Ser. No. 09/878,799 filed on Jun. 12, 2001, now U.S. Pat. No. 6,495,815, which is a continuation of U.S. patent application Ser. No. 09/592,896 filed Jun. 13, 2000, now U.S. Pat. No. 6,262,410, which is a continuation of U.S. patent application Ser. No. 09/347,093, filed on Jul. 2, 1999, now U.S. Pat. No. 6,097,024, which is a continuation of U.S. patent application Ser. No. 08/931,118 filed on Sep. 16, 1997, now U.S. Pat. No. 5,923,027. Said U.S. patent application Ser. No. 10/759,359 is also a continuation of U.S. patent application Ser. No. 09/970,728 filed on Oct. 4, 2001, now 6,681,163.

This application is also a continuation-in-part of U.S. patent application Ser. No. 10/993,765 filed Nov. 19, 2004, now abandoned, which is a continuation of U.S. patent application Ser. No. 10/235,476, filed on Sep. 5, 2002, now U.S. Pat. No. 6,861,809, which claims the benefit of U.S. Provisional Patent Application Ser. No. 60/339,762, entitled "HEADLAMP CONTROL TO PREVENT GLARE," which was filed Dec. 10, 2001. Said U.S. patent application Ser. No. 10/993,765 is a continuation-in-part of U.S. patent application Ser. No. 10/197,834, entitled "CONTINUOUSLY VARIABLE HEADLAMP CONTROL," filed Jul. 18, 2002, now U.S. Pat. No. 6,593,698, which is a continuation of U.S. patent application Ser. No. 09/938,774, entitled "CONTINUOUSLY VARIABLE HEADLAMP CONTROL," filed on Aug. 24, 2001, now U.S. Pat. No. 6,429,594, which is a continuation of U.S. patent application Ser. No. 09/546,858, entitled "CONTINUOUSLY VARIABLE HEADLAMP CONTROL," filed on Apr. 10, 2000, now U.S. Pat. No. 6,281,632, which is a continuation of U.S. patent application Ser. No. 09/157,063, entitled "CONTINUOUSLY VARIABLE HEADLAMP CONTROL," filed on Sep. 18, 1998, now U.S. Pat. No. 6,049,171.

This application is a continuation-in-part of U.S. patent application Ser. No. 10/914,732 filed on Aug. 9, 2004, now abandoned, which is a continuation of U.S. patent application Ser. No. 10/208,142, filed on Jul. 30, 2002, now U.S. Pat. No. 6,774,988.

This application is also a continuation-in-part of U.S. Pat. application Ser. No. 11/143,150 filed on Jun. 2, 2005, now U.S. Pat. No. 7,408,136, which is a continuation of U.S. patent application Ser. No. 10/640,851 filed on Aug. 14, 2003, now U.S. Pat. No. 6,924,470, which is a continuation of U.S. patent application Ser. No. 09/952,521, filed on Sep. 12, 2001, now U.S. Pat. No. 6,653,615, which is a continuation of U.S. patent application Ser. No. 09/677,906, filed on Oct. 3, 2000, now U.S. Pat. No. 6,291,812, which is a divisional of U.S. patent application Ser. No. 09/093,993, filed on Jun. 9, 1998, now U.S. Pat. No. 6,130,421.

The entire disclosure of each of the above-noted applications is incorporated herein by reference. Priority under 35 U.S.C. § 120 is hereby claimed to the filing dates of each of the above-identified applications.

BACKGROUND OF THE INVENTION

The present invention pertains to control systems for controlling the exterior lights of a vehicle and components that can be used with such a control system.

Modern automotive vehicles include a variety of different lamps to provide illumination under different operating conditions. Headlamps are typically controlled to alternately generate low beams and high beams. Low beams provide less illumination and are used at night to illuminate the forward path when other vehicles are present. High beams output significantly more light and are used to illuminate the vehicle's forward path when other vehicles are not present. Daytime running lights have also begun to experience widespread acceptance. In addition, super bright high beams have been proposed for use on fast rural roads. Foul weather lights, such as fog lights, are also commonly used. Other exterior vehicle lights include tail lights, brake lights, center-mounted stop lights (CHMSLs), turn signals, back-up lights, cargo lights, puddle lights, license plate illuminators, etc.

Laws in various countries regulate vehicle illumination, and vehicle manufacturers must build cars that comply with these regulations. For example, regulations set forth by the United States Department of Transportation (DOT) regulate the light emissions of a vehicle's high beam headlamps. Various state regulations are used to control the amount of glare experienced by drivers due to preceding vehicles (other vehicles traveling in the same direction) and oncoming vehicles (vehicles traveling in the opposite direction).

Known vehicle high beam headlamp emissions in accordance with the DOT regulations limit the intensity to 40,000 cd at 0°, 10,000 cd at 3°, 3250 cd at 6°, 1500 cd at 9°, and 750 cd at 12°. An example of an emission pattern meeting this regulation is illustrated in FIG. 1 of U.S. Pat. No. 5,837,994, entitled CONTROL SYSTEM TO AUTOMATICALLY DIM VEHICLE HEADLAMPS, issued to Joseph Scott Stam et al. on Nov. 17, 1998, the disclosure of which is incorporated herein by reference. In order to avoid an illuminance of 0.1 foot candles (fc) incident on another vehicle at these angles, the vehicle high beam headlamps should be dimmed within 700 feet of another vehicle if the vehicles are at an angle of 0°, within 350 feet of another vehicle if the vehicles are at a horizontal position of 3°, and 200 feet of the other vehicle if the position of the other vehicle is at an angle of 60 to the longitudinal axis of the controlled vehicle. It can thus be seen that a preceding vehicle directly in front of the controlled vehicle (i.e., at an angle of 0°) will need to be identified well prior to the controlled vehicle catching up to the preceding vehicle, although the distance by which the controlled vehicle's headlamps must be dimmed for a preceding vehicle can be somewhat less than for an oncoming vehicle because glare from behind is usually less disruptive than oncoming glare.

In order to automatically control the vehicle headlamps, various headlamp dimmer control systems have been proposed. In order to prevent drivers of other vehicles from being subjected to excessive glare levels, an automatic headlamp dimmer system must sense both the headlamps of oncoming vehicles as well as the tail lights of preceding vehicles. Some systems that effectively detect headlamps are unable to adequately detect tail lights. Most prior systems are unable to distinguish nuisance light sources, such as reflectors, street signs, streetlights, house lights, or the like, from light sources that require headlight control. Accordingly, these systems are subject to undesirable dimming of the high beams when no other traffic is present and turning on the high beams when other vehicles are present. In addition to the undesirable performance, it is difficult for prior systems to comply with the legal requirements as described above for high beam control while avoiding unnecessary dimming of the vehicle headlamps.

Fog lights are examples of other vehicle lights that are difficult to control automatically. Vehicles are known to include forward and rearward directed fog lights. In Europe, it is known to provide a very bright red or white light on the back of the vehicle, which is illuminated under foggy conditions. The fog lights must be turned ON as soon as the fog reduces visibility by a predetermined amount and must turn OFF when the fog drops below that density. A reliable method of automatically controlling such fog lights has not been available.

Accordingly, there is a need for a more reliable and intelligent automatic lamp control for a vehicle.

SUMMARY OF THE INVENTION

According to one aspect of the present invention, a control system is provided to control exterior lights of a controlled vehicle. The control system comprises an imaging system configured to image the scene forward of the controlled vehicle, and a control circuit for processing the image of the scene obtained from the imaging system and for controlling the exterior lights to change their beam pattern in response to objects detected in the processed scene, the control circuit disables automatic control of the exterior lights in response to activation of the vehicle windshield wipers.

According to another aspect of the present invention, a control system is provided to control exterior lights of a controlled vehicle. The control system comprises an imaging system configured to image the scene forward of the controlled vehicle, and a control circuit for processing the image of the scene obtained from the imaging system and for controlling the exterior lights to change their beam pattern in response to objects detected in the processed scene, the control circuit disables automatic control of the exterior lights when the vehicle windshield defroster is operating at full speed.

According to another aspect of the present invention, a control system is provided to control exterior lights of a controlled vehicle. The control system comprises an imaging system configured to image the scene forward of the controlled vehicle, and a control circuit for processing the image of the scene obtained from the imaging system and for controlling the exterior lights to change their beam pattern in response to objects detected in the processed scene, the control circuit disables automatic control of the exterior lights when snow is detected.

According to yet another embodiment, a method of detecting snowfall or fog outside a vehicle is accomplished. The method comprises the steps of: sensing light levels forward above the vehicle; comparing the relative brightness of the light levels forward and above the vehicle; and determining that it is snowing or foggy when a ratio of the relative brightness forward of the vehicle to that above the vehicle reaches a threshold.

According to another aspect of the present invention, a control system is provided to control the headlamps of a vehicle. The control system comprises an ambient light sensor for sensing the ambient light outside of the vehicle, and a control circuit for varying the beam pattern of daytime running lamps in response to the ambient light level sensed by the ambient light sensor.

According to another aspect of the present invention, a control system is provided to control the brightness of the tail lamps of a vehicle. The control system comprises an ambient light sensor for sensing the ambient light outside of the vehicle, and a control circuit for varying the brightness of the tail lamps in response to the ambient light level sensed by the ambient light sensor.

According to yet another aspect of the invention, a headlamp control system is provided for controlling the headlamps of a controlled vehicle that comprises: an imaging system configured to image the scene forward of the controlled vehicle; a control circuit coupled to the imaging system for identifying and determining the brightness of light sources in images obtained from the imaging system and for controlling the headlamps to vary a beam pattern of the headlamps as a function of the brightness of light sources within the images; and a user input mechanism coupled to the control circuit for allowing a user to adjust a sensitivity at which the control circuit will control the headlamps in response to light sources within the images.

According to yet another aspect of the invention, a headlamp control system is provided for controlling the headlamps of a controlled vehicle that comprises an imaging system configured to image the scene forward of the controlled vehicle and to detect an ambient light level outside the vehicle, and a control circuit coupled to the imaging system for determining an ambient light level outside the vehicle, for identifying and determining the brightness of light sources in images obtained from the imaging system, and for controlling the headlamps to vary a beam pattern of the headlamps as a function of the brightness of light sources within the images when the ambient light level is above a threshold level.

According to another aspect of the present invention, a control system is provided to control exterior lights of a vehicle. The control system comprises an image array sensor including a plurality of pixels, an optical system configured to image the scene forward of the controlled vehicle onto the image array sensor, the optical system including a forwardmost surface, and a control circuit for processing the image of the scene obtained from the image array sensor and for controlling the exterior lights in response to objects detected in the processed scene, wherein the optical system includes a hydrophilic coating on the forwardmost surface.

According to yet another aspect of the present invention, a vehicle control system is provided to control the brightness of continuously variable headlamps that have a brightness that varies continuously between a high beam state and a low beam state. The control system comprises an imaging system configured to image the scene forward of the controlled vehicle, a control circuit for identifying and determining the brightness of light sources in images obtained from the imaging system and for controlling the brightness of the headlamps as a function of the brightness of light sources within the images, and an indicator coupled to the control circuit and positioned inside the vehicle for indicating to the driver the relative brightness of the headlamps.

According to another aspect of the invention, an imaging system for a vehicle is provided that comprises an image sensor having an array of pixels and at least one other component, and an optical baffle disposed between the image sensor and a scene to be imaged for preventing light from the scene from reaching the at least one other component.

According to a further aspect of the invention, a headlamp control system for a vehicle is provided that comprises an imaging system configured to image the scene forward of the controlled vehicle, a switching mechanism for manual input of a driver's selection of a feature affecting the control of the vehicle headlamps, and a control circuit coupled to the switching mechanism and the imaging system for identifying and determining the brightness of light sources in images obtained from the imaging system and for controlling the brightness of the headlamps as a function of the brightness of light sources within the images and as a function of the status of the switching mechanism.

Another aspect of the present invention is to provide a headlamp control system for a vehicle that comprises a control circuit coupled to the vehicle headlamps for fading the headlamps of the vehicle to an off state in response to the turning off of the vehicle ignition or exiting the vehicle.

According to another aspect of the invention, a control system is provided to control exterior lights of a vehicle. The control system comprises an image array sensor including a plurality of pixels, an optical system configured to image the scene forward of the controlled vehicle onto the image array sensor, the optical system including a forwardmost surface, and a control circuit for processing the image of the scene obtained from the image array sensor and for controlling the exterior lights in response to objects detected in the processed scene, the optical system includes a photocatalytic coating on the forwardmost surface.

Another aspect of the present invention is to provide a control system to control the headlamps of a vehicle. The control system comprises a manually actuated switch mechanism for receiving input from a driver to temporarily increase the brightness of the vehicle headlamps in a flash-to-pass state, an ambient light sensor for sensing the ambient light outside the vehicle, and a control circuit coupled to the ambient light sensor and the manually actuated switch mechanism for varying the beam pattern of the headlamps during the flash-to-pass state in response to the ambient light level sensed by the ambient light sensor.

According to yet another aspect of the present invention, a control system is provided to control the headlamps of a vehicle where the vehicle has a microwave receiver for receiving signals from satellites. The control system comprises a control circuit for receiving signals from the microwave receiver indicative of the location of the vehicle, the control circuit controls the headlamps to limit the perceived brightness of the headlamps from exceeding a predetermined level less than their capacity when the vehicle is traveling on a residential street.

These and other features, advantages, and objects of the present invention will be further understood and appreciated by those skilled in the art by reference to the following specification, claims, and appended drawings.

BRIEF DESCRIPTION OF THE DRAWINGS

The subject matter that is regarded as the invention is particularly pointed out and distinctly claimed in the claim portion that concludes the specification. The invention, together with further objects and advantages thereof, may best be understood by reference to the following description taken in conjunction with the accompanying drawings, where like numerals represent like components, and in which:

FIG. 7 shows a light sensitive surface of the image sensor and illustrates the regions of the image array which are impacted by the light from each of the lenses;

FIG. 8 is a cross section illustrating another image sensor assembly taken along the same plane as the assembly in FIG. 2a;

FIG. 9 is a cross section illustrating yet another light sensor assembly taken along the same plane as the assembly in FIG. 2a;

FIG. 18 is a flow chart illustrating operation to determine if light sources are from oncoming or preceding vehicles;

FIG. 24 is a front perspective view illustrating an image sensor assembly including an electronically alterable filter;

FIG. 25 is a side elevation view of the liquid crystal filter in the image sensor assembly according to FIG. 24;

FIG. 26a is an exploded perspective view illustrating an LED headlamp;

FIG. 26b is a fragmentary cross section taken along plane 26b-26b in FIG. 26a;

FIG. 26d is a fragmentary cross section taken along plane 26d-26d in FIG. 26c;

FIG. 27 is a top, front perspective view of an LED headlamp for projecting light in more than one horizontal direction;

FIGS. 29a-29d illustrate a method of manufacturing surface mounted filters for an image sensor;

FIG. 41 is front elevational view of a mirror mount accessory housing according to another embodiment of the present invention;

FIG. 42 is top plan view of the mirror mount accessory housing shown in FIG. 41;

FIG. 43 is a cross-sectional view of the mirror mount accessory housing shown in FIGS. 41 and 42 taken along line 43-43' in FIG. 42;

FIG. 45 is rear elevational view of the mirror mount accessory housing;

DETAILED DESCRIPTION OF THE INVENTION

Figure 50A:
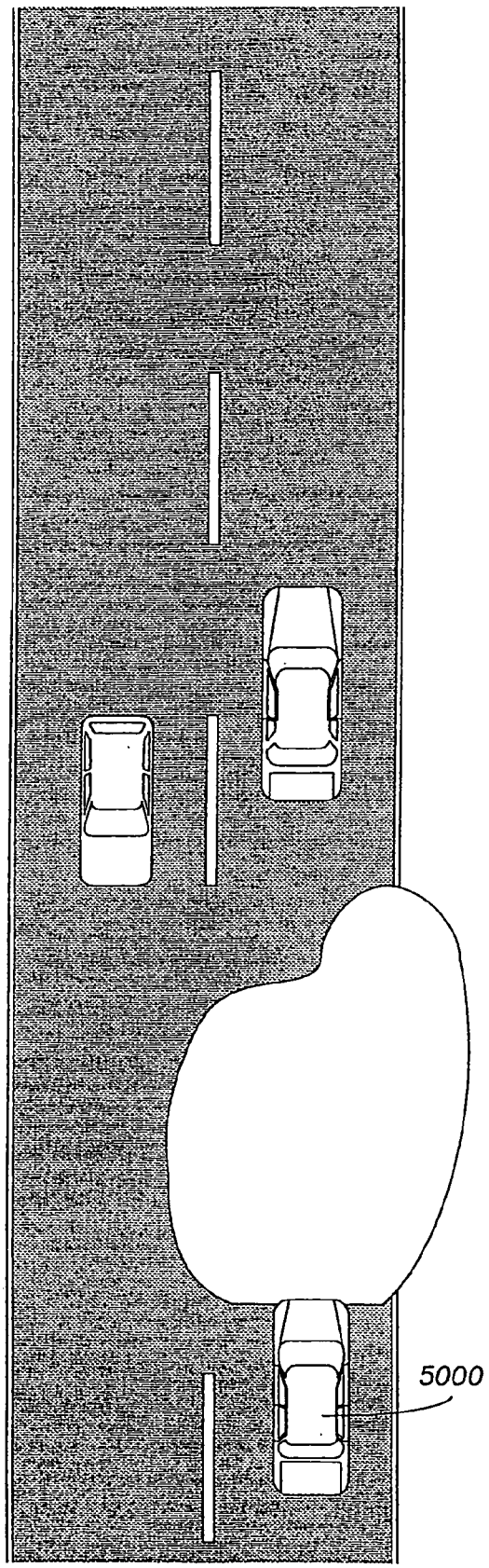
FIGS. 50A-50C are pictorial representations of various illumination patterns produced by exterior lights of a vehicle.
Figure 50B:
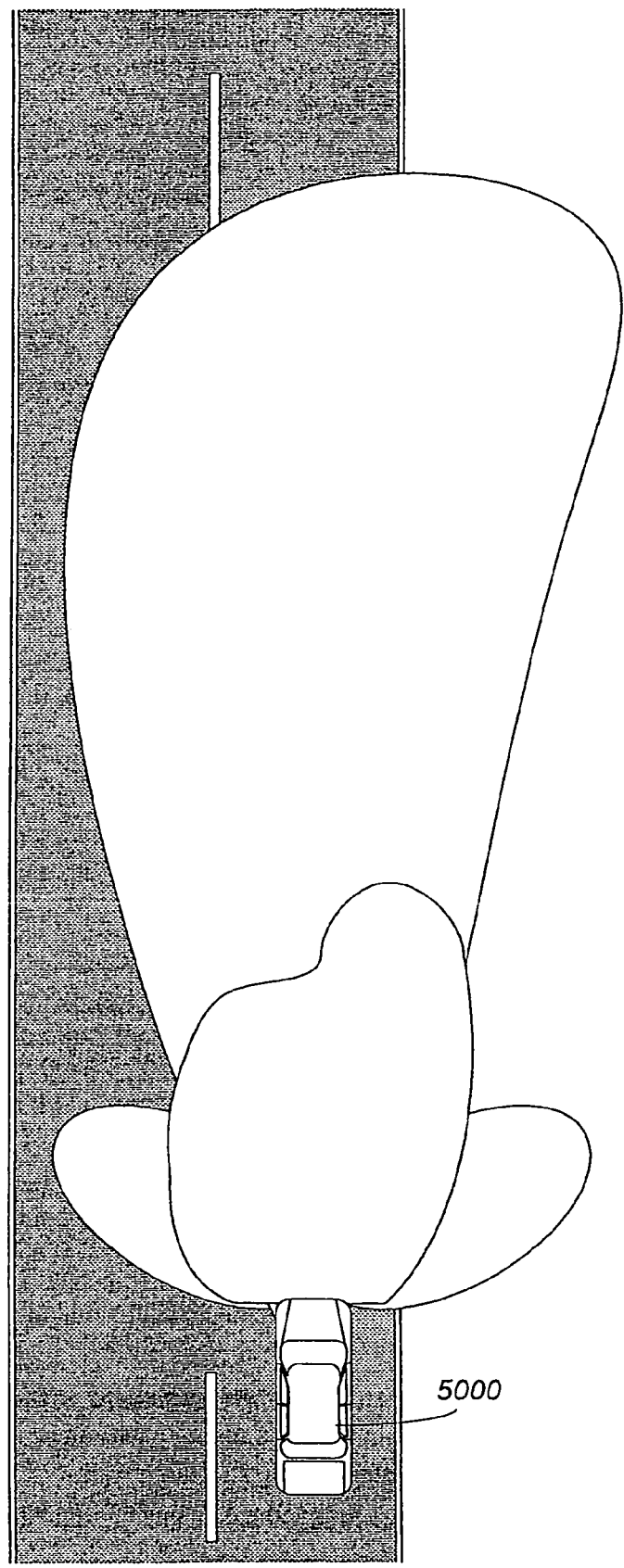
Figure 50C:
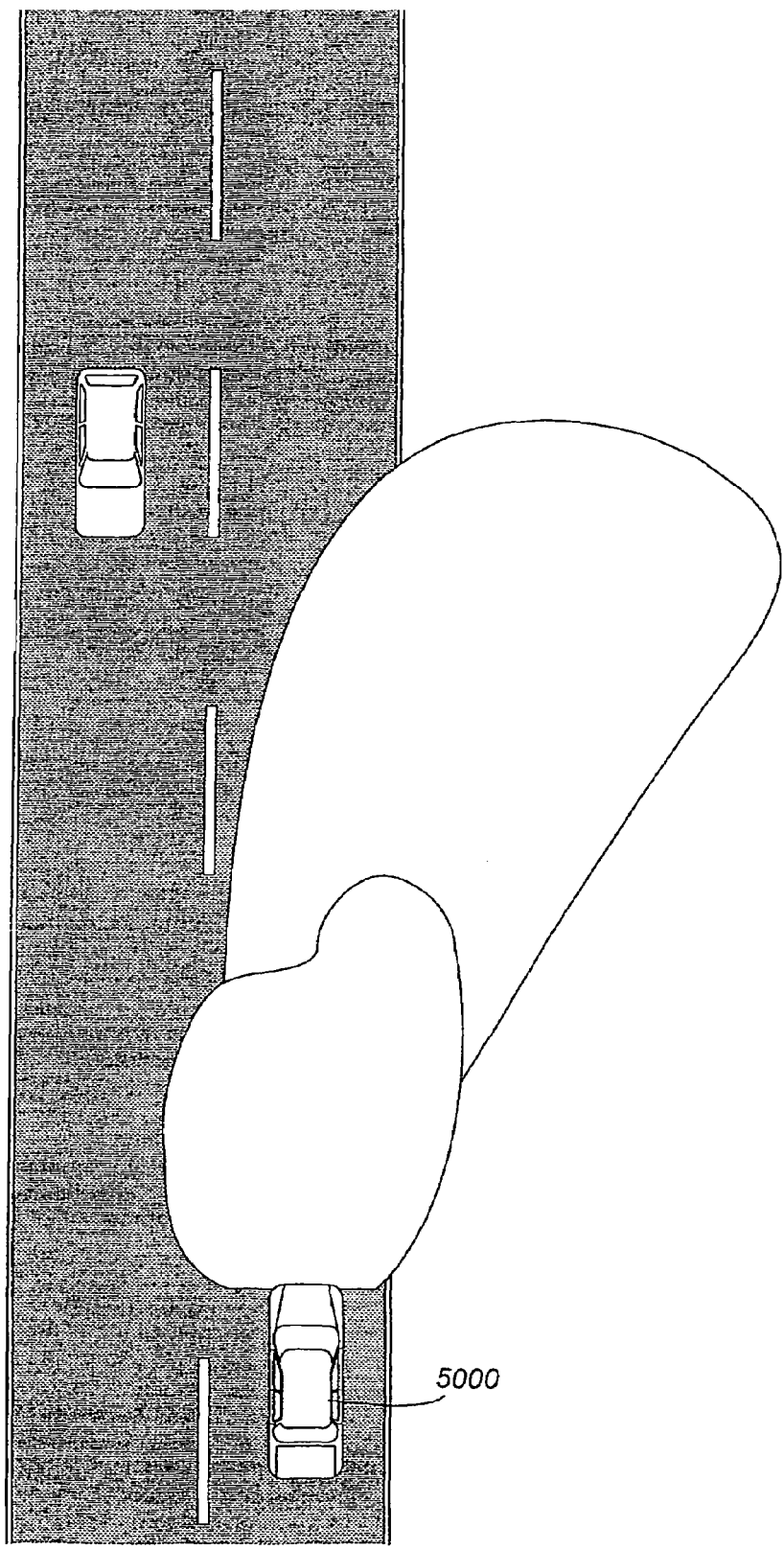

The present invention generally pertains to a control system for controlling the exterior lights of a vehicle. As noted above, such exterior lights may include headlamps, tail lights, foul weather lights such as fog lights, brake lights, center-mounted stop lights (CHMSLs), turn signals, back-up lights, cargo lights, puddle lights, license plate illuminators, etc. The headlamps may be operated in several different modes including conventional low-beam and high-beam states. They may also be operated as daytime running lights, and additionally as super-bright high beams in those countries where they are permitted. The headlamp brightness may also be continuously varied between the low, high, and super-high states. Separate lights may be provided for obtaining each of these headlamp states or the actual brightness of the headlamps may be varied to provide these different headlamp states. In either case, the "perceived brightness" of the headlamps is varied. As used herein, the term "perceived brightness" means the brightness of the headlamps as perceived by an observer outside the vehicle. Most typically, such observers will be drivers or passengers in a preceding vehicle or in a vehicle traveling along the same street in the opposite direction. Ideally, the exterior lights are controlled such that if an observer is located in a vehicle within a "glare area" relative to the vehicle (i.e., the area in which the observer would perceive the brightness of the exterior lights as causing excessive glare), the beam illumination pattern is varied such that the observer is no longer in the glare area. The perceived brightness and/or glare area of the headlamps (and/or other exterior lights) may be varied by changing the illumination output of one or more lights forming the headlamps, by steering one or more lights to change the aim of one or more of the lights forming the headlamps, activating or deactivating some or all of the lights, altering the illumination pattern forward of the vehicle, or a combination of the above. FIG. 50A shows a typical low beam pattern as would be used when other vehicles are nearby and forward of the controlled vehicle 5000. FIG. 50B shows an exemplary composite beam pattern including both high and low beam patterns and side bending light patterns, which may be individually activated as the vehicle 5000 approaches a turn. FIG. 50C illustrates another composite beam pattern including a low beam pattern and an intermediate, side-aimed pattern, which may be produced by changing the focus or aim of the high beams as well as the brightness of the high beams. The composite beam pattern shown in FIG. 50C is useful when another vehicle is approaching in an oncoming and adjacent lane. As will be apparent to those skilled in the art, a large number of other beam patterns can be achieved using known headlamp mechanisms. Other mechanisms for adjusting the perceived brightness and glare area of the headlamps will also be apparent to those skilled in the art.

Although the present invention primarily addresses the control of the vehicle headlamps, embodiments are described below for controlling the tail lights and foul weather lights. In some embodiments, the present invention is generally described as controlling the "exterior lights," which broadly includes any exterior lighting on the vehicle. For example, the present invention may be used in some circumstances to control the perceived brightness of a turn signal mounted in an outside rearview mirror assembly so as to provide sufficient light output for signaling a driver in another vehicle without causing excessive glare in the eyes of the driver of the vehicle having the signal mirrors. Also, the present invention may be employed to control the instrument panel lights as well as other interior display lights based upon the sensed ambient light. Other examples will be apparent to those skilled in the art.

A controlled vehicle 100 (FIG. 1) having an automatic headlamp dimmer includes an optical sensor system 102 for detecting the headlamps 104 of an oncoming vehicle 105 and the tail lights 108 of a preceding vehicle 110. The headlamps 111 of the controlled vehicle 100 are controlled automatically to avoid shining the high beams, or bright lights, directly into the eyes of a driver of oncoming vehicle 105 or by reflection into the eyes of the driver of the preceding vehicle 110. The optical sensor assembly 102 is illustrated as being mounted in the windshield area of the vehicle, but those skilled in the art will recognize that the sensor could be mounted at other locations that provide the sensor with a view of the scene in front of the vehicle. One particularly advantageous mounting location is high on the vehicle windshield to provide a clear view, which view can be achieved by mounting the optical sensor assembly 102 in a rearview mirror mount, a vehicle headliner, a visor, or in an overhead console. Other views that may be advantageously employed include mounting the optical sensor assembly 102 on the A-pillar, the dashboard, or at any other location providing a forward viewing area. However, the most advantageous mounting locations are those that position the image sensor to view a forward scene through an area kept clean by the vehicle's windshield wipers.

Figure 2A:
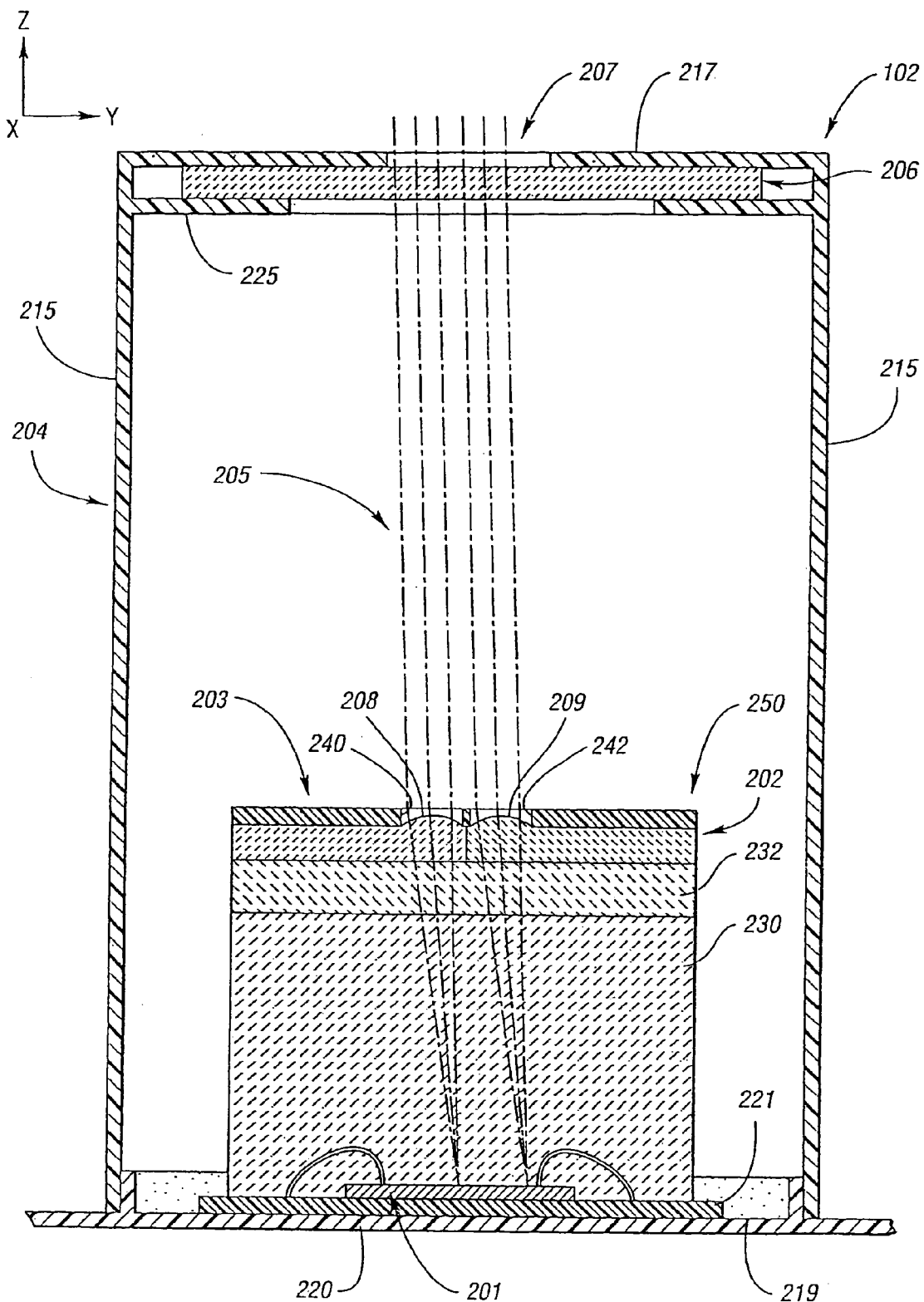
FIGS. 2a and 2b illustrate an optical sensor system, FIG. 2b showing a perspective view and FIG. 2a showing a cross section of the optical sensor system taken along plane 2a-2a in FIG. 2b.
Figure 2B:
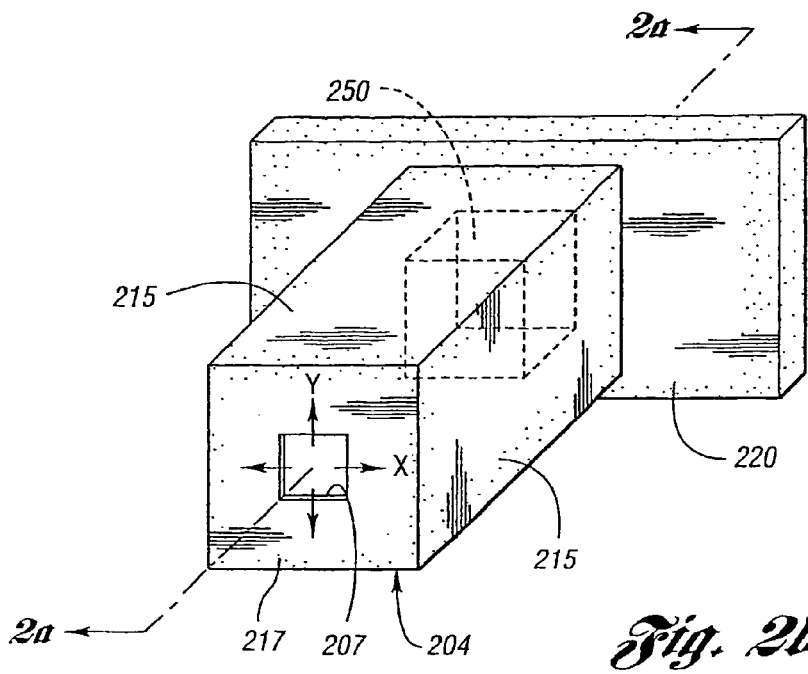

With reference to FIGS. 2a and 2b, the optical sensor assembly 102 includes an electronic image sensor 201 and an optical system to direct light onto the image sensor 201. The image sensor 201 generally comprises an array of light sensitive components and associated circuitry to output electronic pixel light level signals responsive to light impacting on the surface of the image sensor 201. The optical system generally contains four components: lens structure 202; aperture stop member 203; far field baffle 204; and optional infrared filter 206. The optical system controls the scene viewed by the image sensor 201. In particular, the optical system focuses light rays 205 passing through opening 207 of the far field baffle onto the array 201 contained within the image sensor assembly 201.

The Image Sensor

Figure 3:
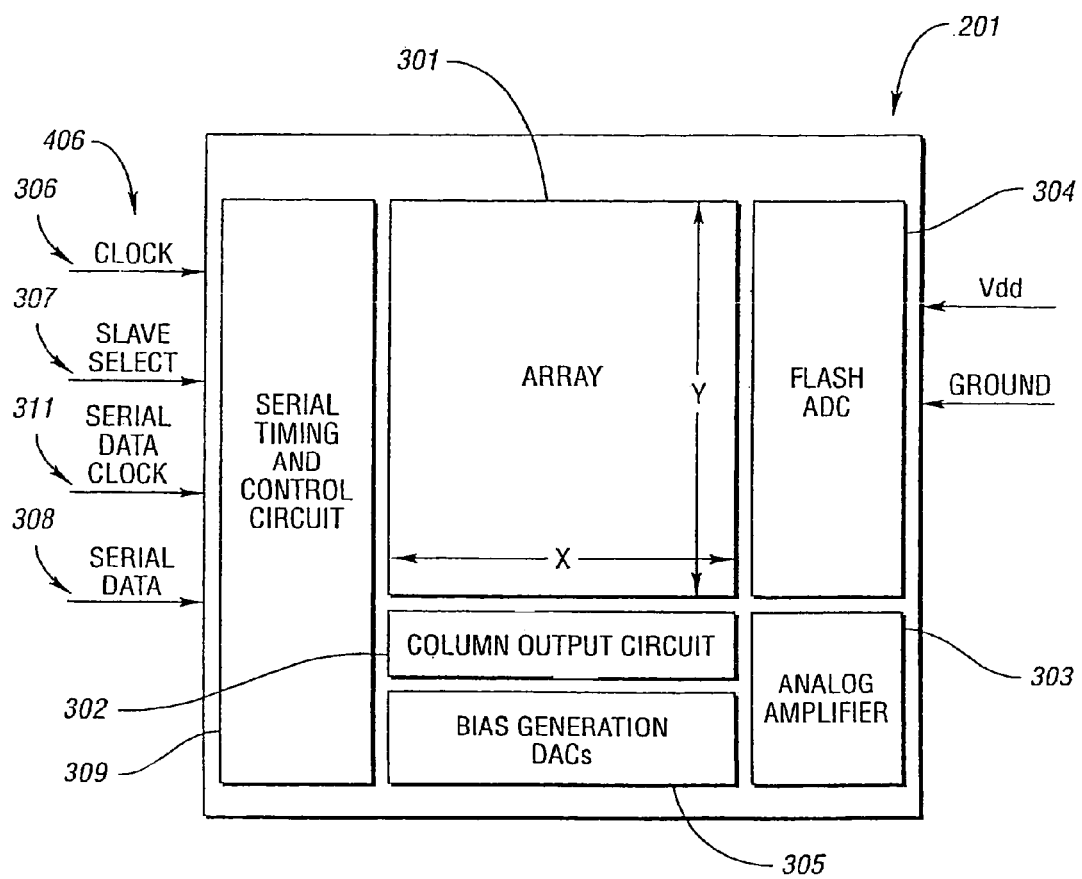
FIG. 3 is a plan view illustrating an image sensor used in the optical sensor system according to FIGS. 2a and 2b.

The configuration of the image sensor 201 is illustrated in FIG. 3. The image sensor includes an image array 301 (FIG. 3) that can be made from any one of a variety of sensors, such as CMOS image sensors, charge coupled device (CCD) image sensors, or any other suitable image sensor. In one embodiment, the image sensor is a CMOS photogate active pixel image sensor. A CMOS photogate active pixel image sensor is described in U.S. Pat. No. 5,471,515, entitled ACTIVE PIXEL SENSOR WITH INTER-PIXEL CHARGE TRANSFER, issued to Eric R. Fossum et al., on Nov. 28, 1995, the disclosure of which is incorporated herein by reference thereto. Sensor systems including arrays are disclosed in U.S. patent application Ser. No. 09/448,364, entitled CONTROL CIRCUIT FOR IMAGE SENSORS, filed Nov. 23, 1999, by Jon Bechtel et al., now U.S. Pat. No. 6,469,739; U.S. patent application Ser. No. 08/933,210, entitled CONTROL CIRCUIT FOR IMAGE SENSORS, filed on Sep. 16, 1997, by Jon Bechtel et al., now U.S. Pat. No. 5,990,469; and U.S. patent application Ser. No. 08/831,232, filed Apr. 2, 1997, entitled CONTROL SYSTEM TO AUTOMATICALLY DIM VEHICLE HEADLAMPS, by Joseph Stam et al., now U.S. Pat. No. 5,837,994, the disclosures of this application and patents are incorporated herein by reference thereto.

The array 301 e may, for example, comprise photogate active pixels, such as 10 to 50 µm pixels. It is advantageous for the array to be a low resolution array, which is an array that has a resolution of less than 7000 pixels per square millimeter and more preferably less than 2500 pixels per square millimeter. The array may have 25 µm or larger photogate active pixels. In particular, the array may include 30 µm or larger pixels arranged in a grid smaller than 200 rows by 200 columns, and may advantageously comprise a rectangular array having 64 columns and 80 rows of pixels. Such an image sensor is described in detail in U.S. Pat. No. 5,471,515 incorporated herein above by reference thereto. The optically active region of array 301 is approximately 1.9 mm in the X direction by 2.4 mm in the Y direction. Using such a low resolution image sensor array to monitor the forward field of the controlled vehicle 100 results in a relatively low resolution sensor system that can be supported by high speed processing in a cost effective manner while enabling a vehicle headlamp control to be highly reliable and accurate. The low resolution array reduces the memory and processor requirements of associated circuitry. The use of such larger pixels increases sensitivity and thus allows the use of slower, and thus lower cost, optics. However, one skilled in the art will recognize that the use of a higher resolution array with smaller pixels may be advantageous to reduce the area of the sensor array and thus potentially reduce the cost of the array itself. In the case where a high resolution image sensor is employed, faster components and higher quality optics may be required to accommodate the high resolution image sensor. With advances in optical manufacturing, such optics may become cost effective such that use of a higher resolution array becomes economically practical. Additionally, it is expected that in future years the cost of a processor and memory required to process an image containing more pixels will be reduced making a higher resolution system feasible. A higher resolution array may improve the ability to detect distant tail lamps. However, at this time, it is preferred to use a low resolution array with relatively few pixels to maintain the economy of the invention and thus enable widespread acceptance in the market place.

An image sensor and control circuit therefore will be described in greater detail herein below, and such a system is disclosed in U.S. Pat. No. 5,990,469, the disclosure of which is incorporated herein above by reference.

In addition to the array 301, the image sensor 201 includes: serial timing and control circuit 309; column output circuit 302; bias generating digital-to-analog converters (DACs) 305; flash analog-to-digital converters (ADCs) 304; and analog amplifier 303. Serial timing and control circuitry 309 provides a high-speed synchronous bi-directional interface between a microcontroller 1105 (FIG. 11) and the image sensor 201. As described in U.S. Pat. No. 5,990,469, the control circuit 309 allows the microcontroller 1105 to output parameters that control the selection of pixels exposed for measurement (i.e., selects the area of array 301 exposed; which area is referred to herein as the "window"); exposure time which affects sensitivity; bias voltages generated by the bias voltage generation DACs 305; and the analog gain of amplifier 303. Additional features include the ability to expose two windows simultaneously, using the same or different gain settings for the amplifier 303 for pixels of the respective windows, and the ability to acquire a sequence of multiple frames. The control circuit 309 also enables a sleep feature that disables the analog components of the image sensor assembly 201 to reduce power consumption when the image sensor is not in use. The image sensor also includes: a power supply input $V_{dd}$; a ground input; serial data bus input/output (I/O) 308; serial data clock I/O 311; slave select input 307; and clock input 306.

The Lens Structure

Lens structure 202 (FIG. 2a) includes lenses 208 and 209. Although two lenses are disclosed, the image sensor 201 could use a single lens or more than two lenses. The two lenses 208, 209 are used to produce two different images of the same scene through different color filters to assist in properly discriminating headlamps from tail lamps using the image sensor 201 as described below and in U.S. Pat. Nos. 5,837,994 and 5,990,469, the disclosures of which are incorporated herein above by reference. The image system allows the acquisition of an image of a scene through at least one color filter 208, 209. In one embodiment, the lens structure is constructed to image the forward scene onto one region of the image array 301 through a first color filter and to image the forward scene onto another region of the image array through a second filter. For example, filter 209 (FIGS. 2a and 2b) may be a red filter and filter 208 may be either a blue filter, a green filter, a cyan filter, a clear filter (which is, for example, the absence of a color filter), or any other suitable filter. There are various places within the optical system that the filters could be incorporated other than the lens 208, 209, such as on the image sensor surface. However, incorporating the filters into the lens structure has the advantage that the light is not focused at the point of the filter. Locating the filter in the image plane, i.e., on the sensor, would leave an organic filter susceptible to thermal damage should the sun fall within the sensor's field of view such that the sun's rays are focused on the filters. Typically, filter materials are much more vulnerable to thermal damage than the image sensor itself. A possible exception would be dichroic interference filters, which are highly resistant to thermal damage. A method by which such thermal resistant filters can be deposited onto a semiconductor image sensor surface is described in greater detail herein below with respect to an alternate embodiment of the present invention.

An example of a filter that could be incorporated on the image sensor surface is a dichroic filter array of the type disclosed in U.S. Pat. No. 5,711,889 to Philip E. Buchsbaum, the entire disclosure of which is incorporated herein by reference. The dichroic filter array disclosed in this U.S. patent is resistant to thermal damage and therefore would be suitable for use in an image sensor used for detecting light sources in the control of a vehicle's headlamps. Such a dichroic filter array may include a checkerboard or mosaic pattern and may be deposited onto the array such that neighboring pixels are exposed to separate bands of light. A technique for depositing interference filters of different colors onto neighboring pixels is disclosed in the above-referenced U.S. Pat. No. 5,711,889. In one embodiment, neighboring pixels are alternatively coated with a red filter (R) and no filter (clear (C)) as illustrated in the table below.

| | | | |
|---|---|---|---|
| R | C | R | C |
| C | R | C | R |
| R | C | R | C |
| C | R | C | R |

In this embodiment, the optics do not include the lens structure and color filters discussed above, since the color filtering function is performed by the filter pattern. Likewise, the optics do not need to separately image the forward scene onto two portions of the image sensor. Thus, twice as much of the image sensor array may be used to image a single image of the forward scene. It should be noted, however, that in accordance with yet another embodiment of the present invention, the optics may still image the forward scene onto two separate portions of the image sensor array as discussed above, but instead of incorporating the color filter into the lens, the color filter may be provided as a patterned or non-patterned multi-layer interference filter on the sensor.

The optics in this embodiment are slightly defocused such that the spot size from a distant point light source covers at least two pixels. In this way, an accurate reading of the red component of the object can be determined. The inventors have discovered that common color filter array technologies, typically employing polymer filters, will not withstand direct focused sunlight. In many automotive applications, the sun may be focused onto the array if a vehicle is traveling or parked such that the sun is within the field of view of the camera. Interference filters are far more robust and reflect the unwanted spectral bands of light rather than absorb them. As a result, their use overcomes the limitations of the prior filtering technologies and allows the construction of an automotive camera. These filters can be used not only with cameras which are used in applications which control vehicle equipment, but also in applications where images are acquired and displayed to the driver for visual assistance.

In another embodiment, three-color interference filters can be used to construct a red, green, and blue (RGB) pixel array (or their complements) as illustrated in the table below.

| | | | |
|---|---|---|---|
| G | R | G | R |
| B | G | B | G |
| G | R | G | R |
| B | G | B | G |

A full color value for each pixel is determined by using the color of the current pixel and interpolating the other two colors from neighboring pixels with different filter colors. Techniques for performing this interpolation are well known in the art. In a simpler scheme, groups of four pixels are treated as one "super pixel." The lens is defocused enough such that the image of a point light source is blurred over a 2×2 block of pixels. For each block of 2×2 pixels, the red, green, and blue color components are determined from the individual pixels. This data can be represented either as three separate values or as an intensity and color value.

The use of a 2×2 super pixel simplifies processing and reduces the total number of values stored. This technique can be combined with any of the other techniques in an application requiring color imaging. For an application such as a high beam headlamp control system, traditional color interpolation can be used near the center of the image for increased resolution and the technique of using super pixels can be used away from center. Super pixels larger than 2×2 blocks can be used where substantially decreased resolution is acceptable.

The lens structure 202 will now be described in greater detail with reference to FIGS. 2a, 4, 5, and 7. The lens structure 202 includes a first lens 208 and a second lens 209 that focus light from other vehicles onto the image array 301 (FIG. 7). The two lens elements 208, 209 image the forward scene onto different respective regions 702, 703 of the image sensor image array 301. Each lens element 208, 209 contains a spectral band pass filter, such that the forward image scene projected onto the respective regions of the image array 301 represents a different color component of the image, where it is advantageous to determine the relative color of objects in the field of view. It is particularly advantageous for the lens elements 208 (FIG. 2a) and 209 to comprise cyan and red filters, respectively, as mentioned above and shown in FIGS. 4 and 5. Alternatively, it may be advantageous for lens 209 to contain a red spectral filter and for lens 208 to be clear.

Figure 4:
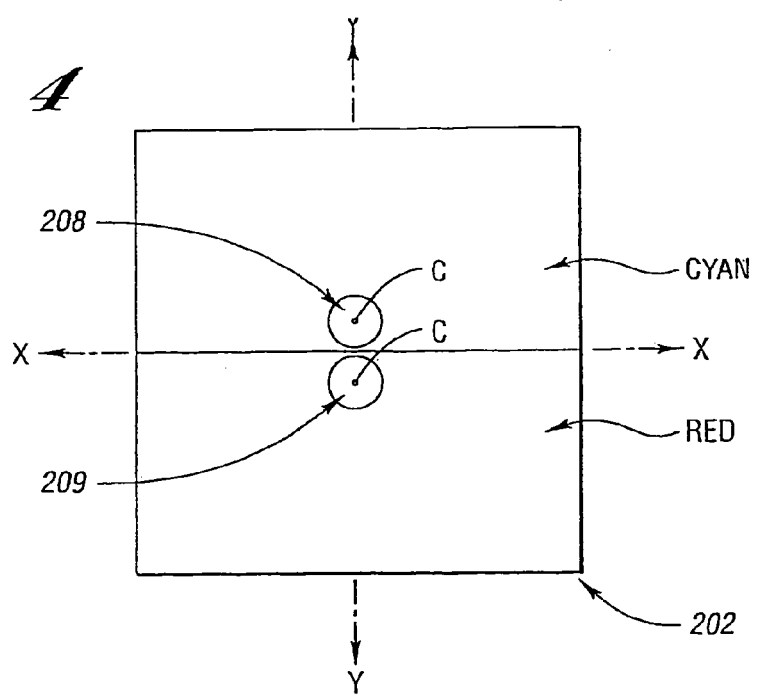
FIG. 4 is a top plan view illustrating a lens structure used in the optical sensor system according to FIGS. 2a and 2b.
Figure 5:
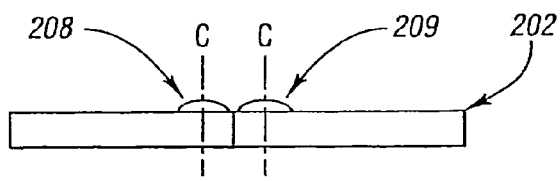
FIG. 5 is a side elevation view illustrating the lens structure according to FIG. 4.

The sensor system may, for example, employ lens elements 208 and 209 that are 0.5 mm to 2.5 mm in diameter, and may advantageously comprise lenses that are 1.0 to 2.5 mm in diameter, such as being 2.2 mm in diameter. In the Y direction, the lens center axes $C_1$ and $C_2$ may be spaced by 0.6 to 1.6 mm, and may, for example, be spaced by 1.1 to 1.4 mm, and may advantageously be spaced 1.3 mm in the Y direction (as indicated in FIG. 5). A portion of the lens may be truncated on one side to achieve this spacing. The lens center $C_1$, $C_2$ may be aligned in the X direction as shown in FIG. 4, or be offset. Lens element 208 may, for example, include a cyan filter with an aspheric lens having a curvature of 0.446 $mm^{-1}$ and a conic constant of −0.5 to achieve the desired focal length. Lens element 209 may, in contrast, be a red filter, aspheric lens with a curvature of 0.450 $mm^{-1}$ and a conic constant of −0.5 to achieve the same desired focal length. At the center, each lens is 0.5 to 1.5 mm thick, and may advantageously be 1.0 mm thick. The difference in curvature of the two lenses compensates for the dispersion in the lens material and optimizes each lens for the spectral band passed by the filter. These parameters result in a lens with an effective focal length of 4.5 mm and thus have an F# of 2. It will be recognized that these optics are exemplary, and that other optics could be provided, such that the focal length and F# could be different.

Figure 6:
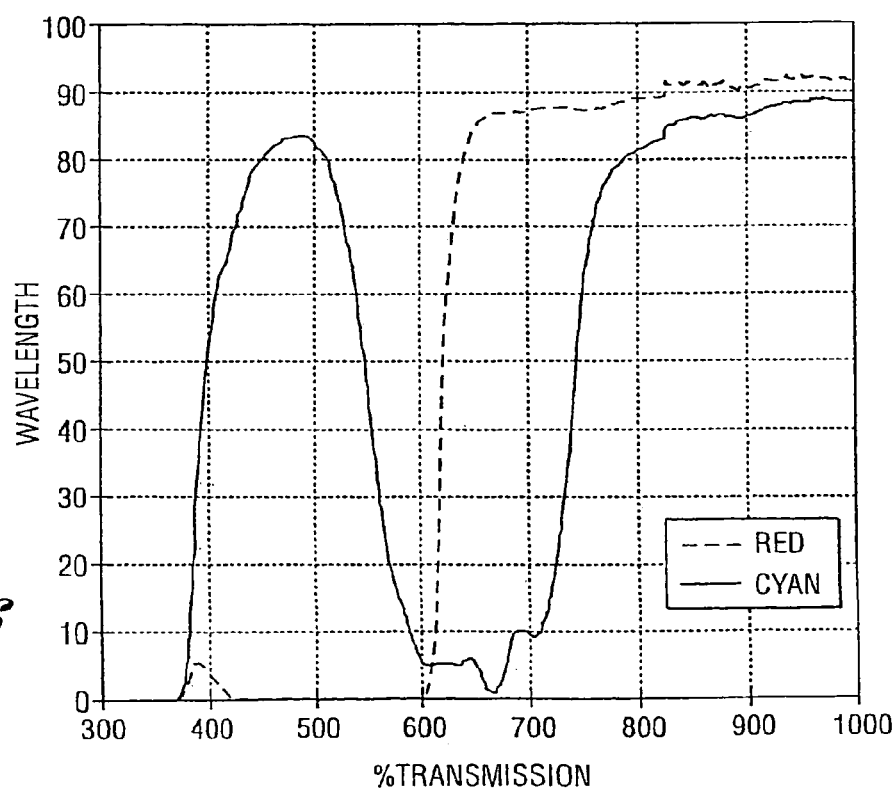
FIG. 6 is a graph illustrating wave transmissivity as a function of light wavelength for the lens.

The lens structure 202 may be molded out of a light-transmissive plastic such as acrylic, manufactured from glass, or may be produced by any other suitable construction. Where the lenses 208, 209 are molded from plastic, the filters may be formed integrally with the plastic by the inclusion of dyes within the material or they may be molded of a clear transparent material, particularly where the image sensor has a surface-mounted filter as described herein below. An example of an acrylic material, which includes a red filter dye, is part number RD-130 available from OptiColor, Inc. of Huntington Beach, Calif., USA. An acrylic material incorporating a cyan filter is OptiColor part number BL-152. The spectral transmission of these two materials is shown in FIG. 6. Using the optional infrared filter 206 will remove light with wavelengths greater than approximately 700 nm.

The lens structure 202 including integral filters may be manufactured using a bi-color injection molding process. The first one-half of the lens, for example, the red half including lens 209, is molded in a tool containing features to form the red half of the lens. Next, the molded red half of the lens is inserted into a tool containing features for the cyan half of the lens structure 202 in addition to features to hold the red lens 209. The cyan lens 208 half of the lens structure 202 is then injection molded against the red lens 209 half forming one bi-color lens. Alternatively, each of the lenses 208 and 209 can be provided by lens elements such as disclosed in copending U.S. Pat. No. 6,130,421, entitled IMAGING SYSTEM FOR VEHICLE HEADLAMP CONTROL, filed Jun. 9, 1998, by Jon H. Bechtel et al., the disclosure of which is incorporated herein by reference thereto.

While red and cyan filtered lens elements are used in the illustrated embodiment, other combinations of lenses may also be suitable for this application. For example, it is possible to replace cyan lens element 208 with a clear lens. Also, it is possible to use three lenses with respective color filters, and in particular red, green, and blue filters, to obtain a full color image. Such an arrangement could use a sequence of three lenses aligned along the Y axis of FIG. 4, with one lens positioned on the center axis and the other two lenses positioned adjacent this center lens. The spacing of the lenses might advantageously be uniform to provide uniformly spaced regions on the light sensitive surface of the image array 301. The red and cyan filter colors described above are thus only presented herein as an example, and any combination of filters which pass at least two isolated or overlapping spectral bands of light and allow for the distinction of tail lamps from headlamps may be used. Those skilled in the art will recognize that other methods can be used to incorporate the filters, such as screen printing dyes applied to the flat back surface of the lens structure 202, or application of a filter material to the surface of a clear lens structure. Additionally, an advantageous system using a single lens is described herein below with reference to FIGS. 24 and 25.

The Aperture Stop

Aperture stop 203 comprises an opaque member, including apertures 240 (FIG. 2a) and 242, positioned over lenses 208, 209. The aperture stop 203 can be manufactured of any suitable material, such as molded plastic, and it can be painted or otherwise treated so as to block the passage of light if the material of which the plastic is manufactured is not opaque. Aperture stop 203 defines the apertures 240, 242 for lens elements 208 and 209. Aperture stop 203 also prevents passage of stray light through regions of lens structure 202 other than the lens elements 208 and 209. It will be recognized that the aperture stop 203 can be paint applied directly to the surface of lens structure 202, and optionally to the sidewalls of light sensor assembly 250, such that the paint blocks passage of stray light through regions of lens 202 other than the lens elements 208 and 209. The aperture stop may also be stamped from a rigid material such as Mylar and placed over the lens structure. Such an aperture stop may include a pair of registration holes for engaging posts extending from the lens structure such that the aperture stop may be properly positioned relative to the lens structure with the apertures 240, 242 aligned with the corresponding lens elements 208, 209 of lens structure 202.

The aperture stop and/or the window may define a transparent window in an otherwise opaque mask in which the transition from the opaque region to the transparent region may be graded. By providing such a gradient, spatial thresholding of the received and processed image may be readily accomplished. The purpose for such spatial thresholding is discussed in more detail below.

The Far Field Baffle

The far field baffle 204 (FIGS. 2a and 2b) is an opaque enclosure to be positioned over the image sensor 201. The baffle includes an opening 207, which is the sole light passage into the image sensor. The illustrated far field baffle 204 is a generally rectangular box including four sidewalls 215 (only two of the four being visible in FIG. 2b), an end wall 217 including opening 207, and an open end 219. The open end is secured to the support 220 on which image sensor 201 is carried. The support 220 may be, for example, a circuit board or housing, and is preferably opaque to block the passage of light into the chamber defined by the far field baffle. The walls 215, 217 of the far field baffle 204 are opaque, and may be of any suitable construction such as stamped from metal, molded from plastic, or the like. If the material from which the walls are made is not opaque, it may be painted or otherwise treated to block the admission of light. The far field baffle defines the forward scene viewed by image sensor array 208. The side walls 215 and end wall 217 prevent light at angles outside of the desired field of view from entering and are also used to keep light input through one lens from crossing over to the region of the array reserved for the other lens. The far field baffle aperture 207 is ideally about 4-6 focal lengths, or approximately 18 mm in the illustrated embodiment, from the front of the lens (for the sake of clarity, the figures of the application are not to scale). The field of view through aperture 207, aperture stop 203, and lenses 208 and 209, in the illustrated embodiment, is about 10° in the vertical direction and 25° in the horizontal direction in front of the vehicle. This field of view can be achieved with a rectangular or elliptical far field baffle opening 207 that is 6 to 7 mm in the Y direction and 9 to 10 mm in the X direction, in the above described embodiment.

In the far field baffle 204 has an opening 207 in an end wall 217. The sidewalls 215 of the image array sensor extend orthogonally from the end wall 217. The walls 215, 217 may be formed integrally in a molding or stamping process or they may be joined after construction using an adhesive, fasteners or the like. The far field baffle is preferably a black plastic molded member, although it may be provided using any material that will absorb most or all of the light striking the sidewalls. By providing wall surfaces on the inside of the far field baffle that absorb light, the walls will not reflect light that enters though opening 207 onto the image array sensor 201. In the illustrated embodiment, the baffle is rectangular, but those skilled in the art will recognize that the baffle could be square, cylindrical, or any other suitable shape.

An imaging system including a far field baffle is described in co-pending U.S. Pat. No. 6,130,421, entitled IMAGING SYSTEM FOR VEHICLE HEADLAMP CONTROL, filed on Jun. 9, 1998, by Jon H. Bechtel et al, the disclosure of which is incorporated herein by reference thereto.

Far field baffle 204 and aperture stop 203 are preferably configured to prevent light from reaching components other than image sensor array 201 that may be mounted on circuit board 221. Certain sensors, such as CMOS sensors, often include other components besides the image sensor array on the printed circuit board that may be damaged from exposure to light. Additional baffle structures may be incorporated for this purpose.

Infrared Filter

The far field baffle holds an optional infrared filter 206 (FIG. 2a). Infrared filter 206 prevents light of wavelengths longer than about 700 nm from being imaged by the optical system. This is advantageous as light above 700 nm (FIG. 6) will pass through the red and cyan filters. By removing this light, the only light that will be considered is visible light in the pass band of the red and blue filters. The infrared filter has become more important due to the recent commercialization of LED tail lamps. Because incandescent light sources emit infrared light while LED light sources do not, the infrared filter is desirable to balance out the detected brightness of these two types of light sources.

Infrared filters are available from Optical Coating Laboratories of Santa Rosa, Calif., and are called Wide Band Hot Mirrors. The infrared filter 206 may be mounted to the end wall 217 using an adhesive, mechanical fasteners such as a snap connector, or the like, and may seal off the chamber within the far field baffle to prevent dust and moisture from entering the system and degrading the performance of the system.

Alternatively, infrared filter 206 may be incorporated as a dye within the lens, a coating on the lens, a coating on the image sensor surface, a lid on an image sensor package, or elsewhere in the image sensor assembly. If the IR filter is not such that it can be used to close the opening 217 of far field baffle 204, it may be desirable to place a clear window, such as glass, plastic, or the like, in the opening 217 to prevent dust from entering into the interior of the far field baffle and interfering with the performance of the sensor system 102.

Hydrophilic/Photocatalytic Coatings

In addition to functioning as an infrared filter, filter 206 serves to prevent debris and liquid from reaching the image sensor assembly through opening 207. In the event an infrared filter is not utilized, a transparent window may be used in its place for this purpose.

Whether an infrared filter 206 or window is utilized, it is desirable to keep liquid drops from attaching to the outer surface of filter/window 206 within opening 207 since such liquid drops distort the image that is received and processed by the image sensor and because such liquid drops tend to dry and leave spots on the outer surface of filter/window 206. Such liquid drops may form on filter/window 206 when, for example, an individual sprays a cleaning fluid on the inside of the windshield, which is in close proximity to the outer surface of filter/window 206. It is very possible that the individual cleaning the windshield would forget to wipe the cleaning fluid from the filter/window of the image sensor, thus leaving a fine mist of water droplets over the surface of the filter/window, which would blur the images obtained by the image sensor.

To overcome this problem, the present invention may employ a hydrophilic coating on the outer surface of filter/window 206. Hydrophilic coatings have a porous outer layer(s) that absorb the water or other liquid uniformly across its surface such that water droplets/spots do not form on its surface. One problem many such hydrophilic coatings experience is that the pores in the outer layer(s) may become clogged by oil, grease, or other contaminants thereby eliminating the effectiveness of the hydrophilic coating. To overcome that problem, a photocatalytic layer may be used in conjunction with the hydrophilic coating. Such photocatalytic layers break down the oil, grease, or other contaminants within the hydrophilic layer when exposed to ultraviolet light. This tends to clear the pores in the hydrophilic layer of the contaminant and allow it to operate effectively as a hydrophilic layer. Examples of hydrophilic/photocatalytic coatings that may be employed for this purpose are disclosed in U.S. patent application Ser. No. 09/602,919, now U.S. Pat. No. 6,816,297, entitled ELECTRO-OPTIC DEVICE HAVING A SELF-CLEANING HYDROPHILIC COATING filed on Jun. 23, 2000, by William L. Tonar et al. The entire disclosure of this application is incorporated herein by reference.

Assembly of the Image Sensor Assembly

Assembly of the image sensor will now be described with reference to image sensor assembly 801 of FIG. 8, which is identical to the image sensor assembly 250 except for the gel 805 in image sensor assembly 801. The image sensor 201, lens structure 202, and aperture stop 203 are combined to form an integral image sensor assembly 250 (FIG. 2) or 801 (FIG. 8). The image sensor 201, which is advantageously a single integrated circuit (IC), is attached to printed circuit board 220 by any suitable conventional means such as using chip-on-board technology. Connections to the image sensor chip are made by any suitable means, such as wire bonds 804. The bonded IC is then optionally covered with an optically clear stress relieving gel 805. Examples of materials that can be used for this coating are Silicon Semi-Gel Type C from Transene Co. of Danvers, Mass., or Dielectric Gel 3-6211 from Dow Corning Corp. of Midland, Mich. The coated IC is then encapsulated in a hard optically clear enclosure 802, which may, for example, comprise epoxy. The epoxy is formed into a desired shape and may form, for example, a cube. The cube can be dimensioned to occupy a very small volume, and may, for example, have length and width dimensions of about 1 cm on a side, and a thickness of about 5 mm. The enclosure 802 (FIG. 8) may be selected to have approximately the same index of refraction as the stress relieving gel 805 to prevent any refraction at the interface between these two materials. Examples of suitable epoxies are: Epo-Tek 301-2FL from Epoxy Technology, Inc. of Billerica, Mass., Epoxy 50 from Transene Co., or Dexter-Hysol OS 1900, or 300H from Nitto Denko Corporation. If the coefficient of thermal expansion of the enclosure 802 is sufficiently low that its expansion and contraction will not break wire bonds 804 at the expected operating temperature range for the image array sensor 201, stress-relieving gel 805 can be omitted, as is shown by enclosure 230 over wire bonds 234 in image sensor assembly 250 in FIG. 2a.

Lens structure 202 is attached to the enclosure 802 (FIG. 8) or enclosure 230 (FIG. 2) using a UV curable optically clear adhesive 232. UV curable adhesive 232 is dispensed onto the epoxy cube 802 and lens 202 is juxtaposed with UV curable adhesive 232. Lens structure 202 is spaced from the image sensor 201 by a distance such that images at "infinity" are focused on the desired image regions 702 and 703. The UV curable adhesive 232 is exposed to UV light and cured, locking lens structure 202 into position and permanently attaching lens structure 202 to enclosure 802. The total distance between the back surface of the lens structure 202 and the top of the image sensor 201 die is 6.7 mm in the illustrated example. This distance is significantly longer than the effective focal length of 4.4 mm because the entire optical path between the back of the lens 202 and the front of the image array 201 is through a material with a higher index of refraction than air. Ideally the process of aligning the lens to the image sensor and curing the UV adhesive to hold it in place is accomplished while actively focusing the lens to accommodate variations in the manufacture of the lens and other image sensor assembly components. This process is accomplished by powering the image sensor during assembly and acquiring images of a far field scene from the image sensor into a host computer. The UV curable adhesive is dispensed onto the surface of the sensor and the lens is positioned on the UV curable adhesive using a multi-axis robot or positioner. The position of the lens is adjusted by the robot until the images acquired by the sensor appear in focus. At this point, the UV curable adhesive is exposed to UV light, cementing the lens into place. Micropositioning equipment suitable for this purpose is available from Physik Instrumente GmbH & Company KG of Germany.

UV curable adhesive 232 serves to fill the space between the lens 202 and enclosure 802, and thus fills in any ripples or other non-planar surfaces of enclosure 802 thereby precluding the creation of air gaps between the lens 202 and the enclosure 802. To accomplish the desirable optical characteristics described hereinabove, UV curable adhesive 232 should have approximately the same index of refraction as enclosure 802. This structure has the distinct advantage of minimizing the number of optical surfaces wherein a significant mismatch of indices of refraction between two different mediums can occur, thus increasing the optical efficiency of the imaging system and reducing stray light. A suitable optically clear UV cured adhesive is Norland Optical Adhesive 68 manufactured by Norland Products, Inc., of New Brunswick, N.J. Other materials suitable for making the image sensor assembly 801 are available from Dymax.

The block 802 is completed by attaching the aperture stop 203 to lens 202. If the aperture stop is a member, it may be attached to the outer surface of the lens using an adhesive, one or more mechanical fasteners, or the like. If the aperture stop is paint, it may be applied directly to the surface of the lens element 202 after the lenses 208 and 209 are covered with a removable mask, such as tape. After the paint dries, the mask can be removed. The optical assembly 801 is then mounted to a support 220. In particular, the image sensor array 201 is physically mounted on a base substrate 221 by conventional means, and electrically connected to circuitry (not shown in FIG. 2b) by electrical connectors such as wire bonds, solder, one or more connectors, or the like. The base substrate 221 may, for example, be a printed circuit board.

The support 220 may be constructed of the same material as the far field baffle 204, or it may be constructed of a different material. The base substrate 221 may be omitted if the far field baffle and the image sensor are mounted directly to either the support 220 or the housing (not shown) that carries the optical sensor assembly. For example, the support 220 may be a printed circuit board to which the image sensor 201 and the far field baffle are connected. Regardless of whether the base substrate is provided, the far field baffle is mounted to the support 220 or the housing (not shown) using an adhesive, a snap connector, a mechanical fastener, or the like.

Figure 9:
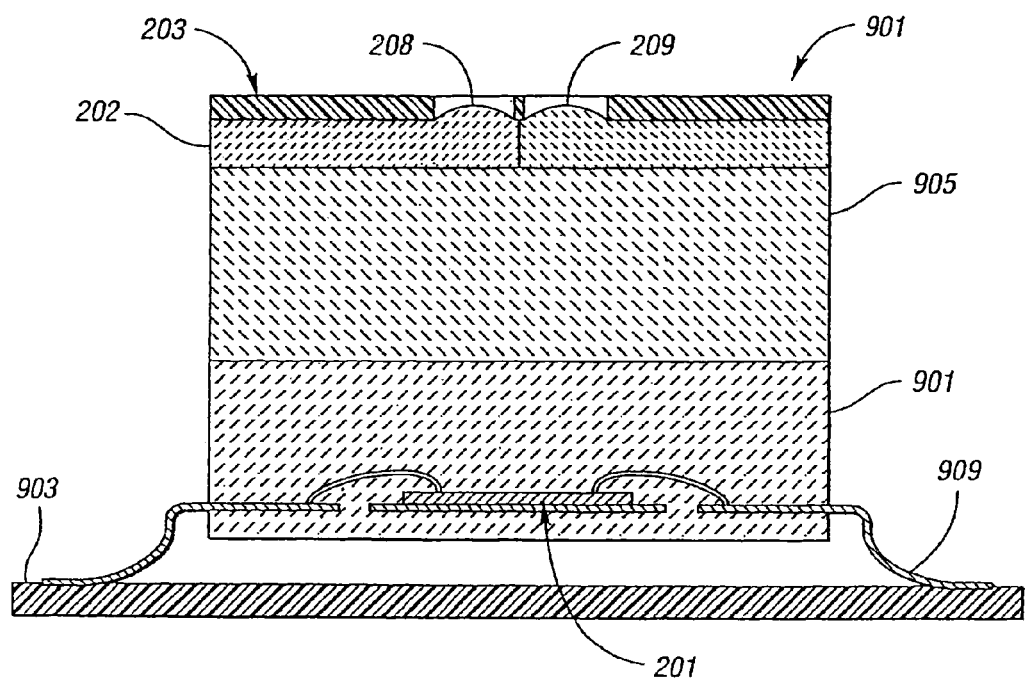

An image sensor assembly 901 according to an alternate embodiment is illustrated in FIG. 9. In this embodiment, the image sensor 201 is packaged using more conventional electronic packaging, such as a ceramic package with a glass lid or a clear plastic package, which may, for example, be a quad flat pack or a dual-in-line (DIP) package. The packaged image sensor 901 is mounted, by suitable conventional means such as by soldering, to printed circuit board 902. An ultraviolet (UV) curable adhesive 905 is then dispensed onto the packaged image sensor 901. The adhesive used can be the same adhesive described above with respect to adhesive 232. The thickness of the UV curable adhesive is dependent on the packaged image sensor 901 type. If the required thickness is too great, layers of the UV curable adhesive can be built up or another material, such as an epoxy layer, can be sandwiched between the UV curable adhesives to decrease the thickness of the adhesive layer 905. The epoxy may be the same material described above with respect to the enclosure 230, 802. The lens structure 202 is juxtaposed with the UV curable adhesive 905 and focused in the manner previously described. Finally, the aperture stop 203 is attached to the lens structure 202 using an adhesive (not shown), mechanical fastener or the like.

In addition to the means described herein above, the lens structure 202 may be supported relative to the image sensor by other means, such as a mechanical support. Such a structure is disclosed in U.S. Pat. No. 6,130,421, entitled IMAGING SYSTEM FOR VEHICLE HEADLAMP CONTROL, filed on Jun. 9, 1998, the disclosure of which is incorporated herein by reference thereto. The same may also be used to position and maintain the relative relationship between the components of the optical assembly including the aperture stop and the far field baffle. A mechanical fastening arrangement is disclosed below with respect to FIG. 24.

Mirror Mounted Image Sensor Assembly

Figure 10:
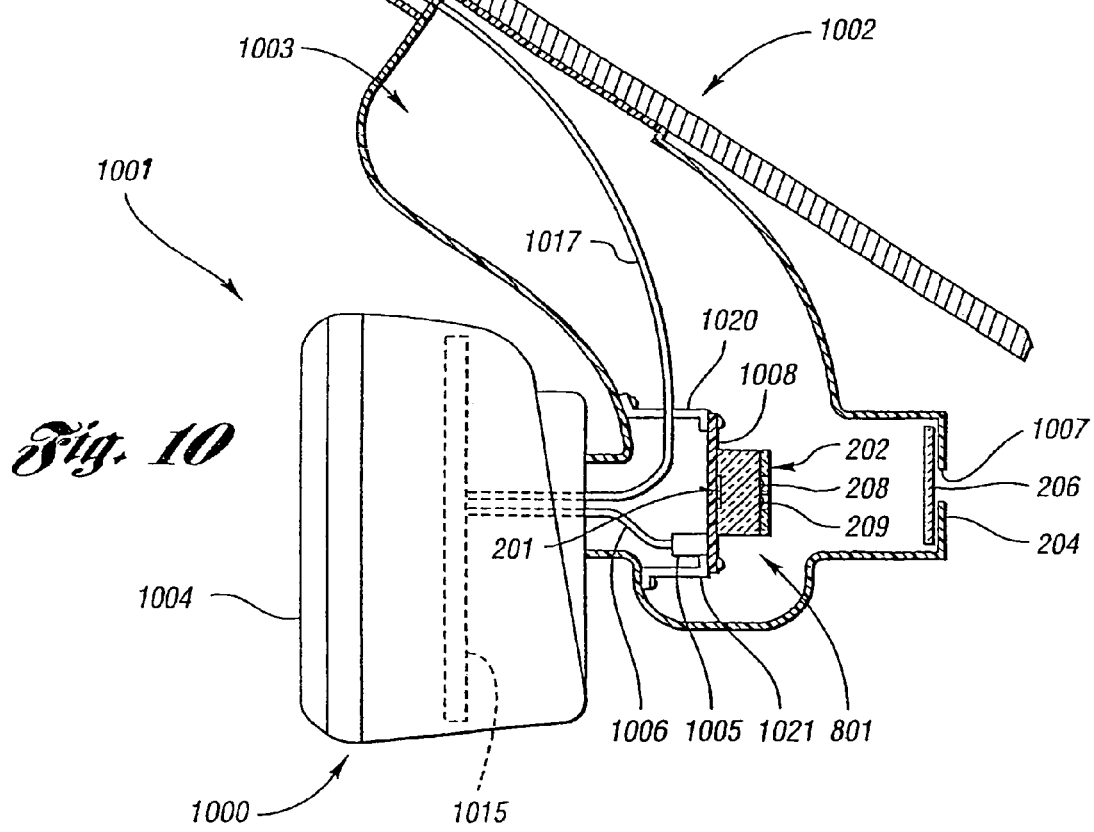
FIG. 10 is a partial cross section of a rearview mirror assembly illustrating an optical sensor system.

As mentioned above, the headlamp dimmer can be advantageously integrated into a rearview mirror 1000 as illustrated in FIG. 10, wherein the light sensor assembly 201 is integrated into an automatic dimming electrochromic (EC) mirror subassembly 1001, or other variable reflectance mirror assembly. This location provides an unobstructed forward view through a region of the windshield of the vehicle that is typically cleaned by the vehicle's windshield wipers (not shown). Additionally, mounting the image sensor in the mirror assembly permits sharing of circuitry such as the power supply, microcontroller and light sensors. More specifically, the same ambient light sensor may be used to provide an ambient light measurement for both the auto-dimming mirror function and the headlamp control function.

Referring to FIG. 10, light sensor assembly 801 is mounted within a rearview mirror mount 1003, which is mounted to the vehicle windshield 1002. The rearview mirror mount 1003 provides an opaque enclosure for the image sensor. The infrared filter 206 can be mounted over a hole 1007 in the rearview mirror mount 1003, as is shown. Alternatively, the far field baffle 214 can be used with the infrared filter 206 mounted therein. If the far field baffle 214 is used, it is mounted to the circuit board 1008 with the image sensor assembly 202. Regardless of whether the far field baffle is used, the circuit board 1008 is mounted to rearview mirror mount 1003 using mounting brackets 1020 and 1021. The mounting brackets may be implemented using any suitable construction, such as metal brackets, plastic brackets which can be formed either integrally with the housing 1003 or as separate components, mechanical fasteners which engage the circuit board 1008, or the like. The separate brackets can be attached using an adhesive, metal fasteners or other mechanical fastening means. Image sensor assembly 201 is thus attached to, and held stationary by, the rearview mirror mount 1003 which is securely attached to the vehicle windshield or roof by conventional means.

A connector 1005 is connected to circuit board 1008 using a suitable commercially available circuit board connector (not shown), which in turn is connected to the image sensor 201 through circuit board 1008. The connector 1005 is connected to a main circuit 1015 through a cable 1006. The main circuit board is mounted within rearview mirror housing 1004 by conventional means. Power and a communication link with the vehicle electrical system, including the headlamps 111 (FIG. 1), are provided via a vehicle wiring harness 1017 (FIG. 10).

The Electrical System

Figure 11:
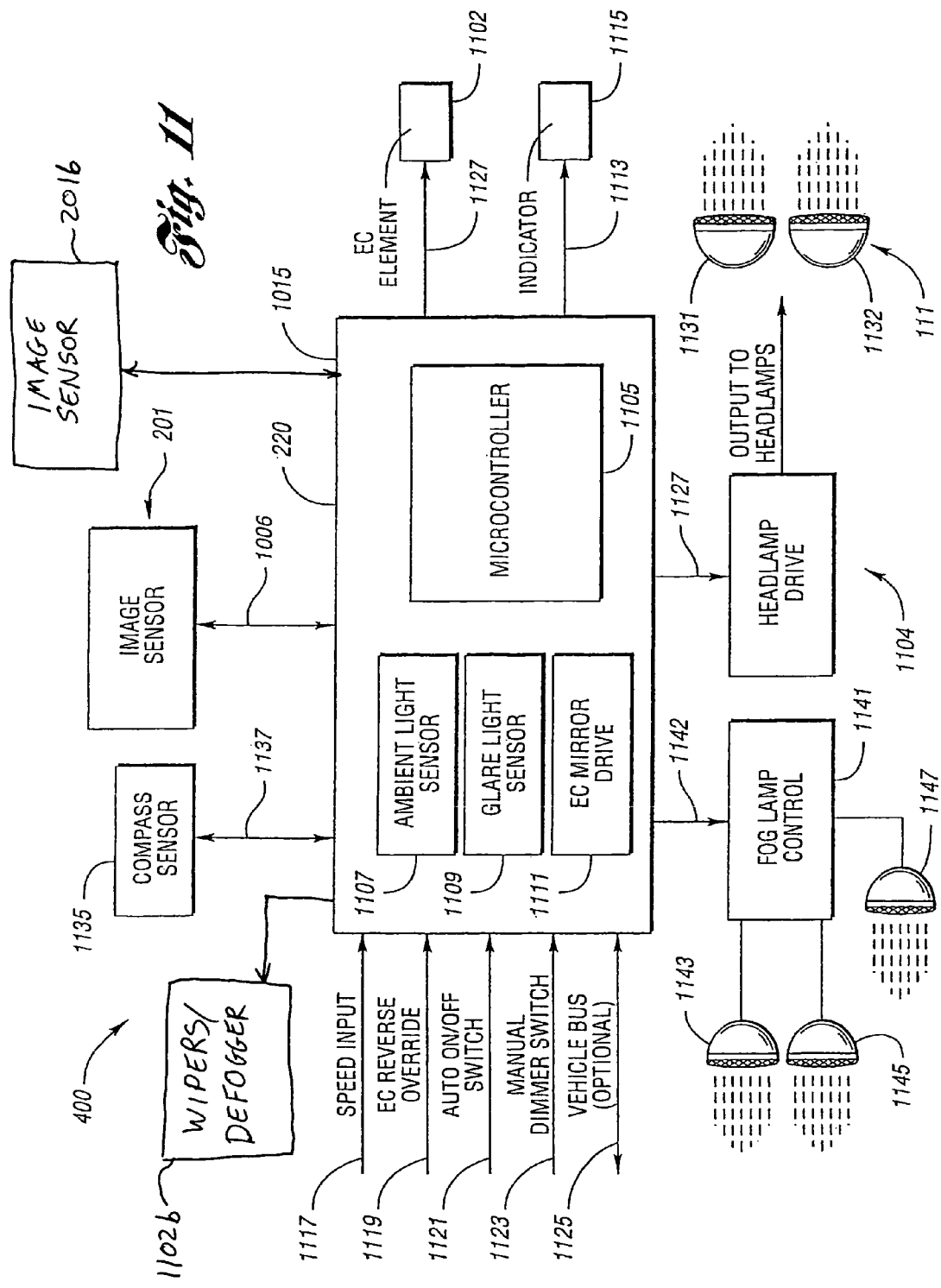
FIG. 11 is a circuit schematic illustrating a circuit for an optical sensor system and an electrochromic mirror.

The image sensor 201 electrically connected to the main circuit board 1015 and mounted in the vehicle rearview mirror housing 1004 (FIG. 10) is represented in FIG. 11. The microcontroller 1105 receives image signals from the image sensor 201, processes the images, and generates output signals. Although described with reference to a circuit board mounted in a rearview mirror housing, the circuit board 1105 can be mounted in a vehicle accessory, such as a sun visor, overhead console, center console, dashboard, prismatic rearview mirror, A-pillar, or at any other suitable location in the vehicle. Should the controlled vehicle (100 in FIG. 1) include an electrochromic mirror, the circuitry for the electrochromic mirror preferably shares the circuit board 1015 (FIG. 10) with microprocessor 1105. Thus, the main circuit board 1015 is mounted within the mirror housing 1004. The EC circuitry further includes ambient light sensor 1107 and glare light sensor 1109, which may advantageously be digital photodiode light sensors as described in U.S. patent application Ser. No. 09/307,191, entitled PHOTODIODE LIGHT SENSOR, filed Jan. 25, 2000, now U.S. Pat. No. 6,359,274, and U.S. patent application Ser. No. 09/491,192, entitled VEHICLE EQUIPMENT CONTROL WITH SEMICONDUCTOR LIGHT SENSORS, filed May 7, 1999, now U.S. Pat. No. 6,379,013, the disclosures of which are incorporated herein by reference. Microcontroller 1105 uses inputs from ambient light sensor 1107 and glare lights sensor 1109 to determine the appropriate state for the electrochromic mirror element 1102. The mirror is driven by EC mirror drive circuitry 1111, which may be a drive circuit described in U.S. Pat. No. 5,956,012, entitled SERIES DRIVE CIRCUIT, filed by Robert R. Turnbull et al. on Sep. 16, 1997, and PCT Application No. PCT/US97/16946, entitled INDIVIDUAL MIRROR CONTROL SYSTEM, filed by Robert C. Knapp et al. on Sep. 16, 1997; and U.S. patent application Ser. No. 09/236,969, entitled AUTOMATIC DIMMING MIRROR USING SEMICONDUCTOR LIGHT SENSOR WITH INTEGRAL CHARGE COLLECTION, filed May 7, 1999, by Jon H. Bechtel et al., now abandoned, the disclosures of which are incorporated herein by reference thereto. Other driver circuits are known that can be used to drive the EC element 1102. The EC mirror drive circuit 1111 provides current to the EC element 1102 through signal output 1127.

The mirror may communicate with a light control module over a serial link therebetween in a manner similar to that disclosed in commonly-assigned U.S. patent application Ser. No. 09/368,325, entitled "VEHICLE COMMUNICATION SYSTEM," filed on Aug. 3, 1999, by Robert C. Knapp et al., now U.S. Pat. No. 6,229,434, the entire disclosure of which is incorporated herein by reference.

Figure 1:
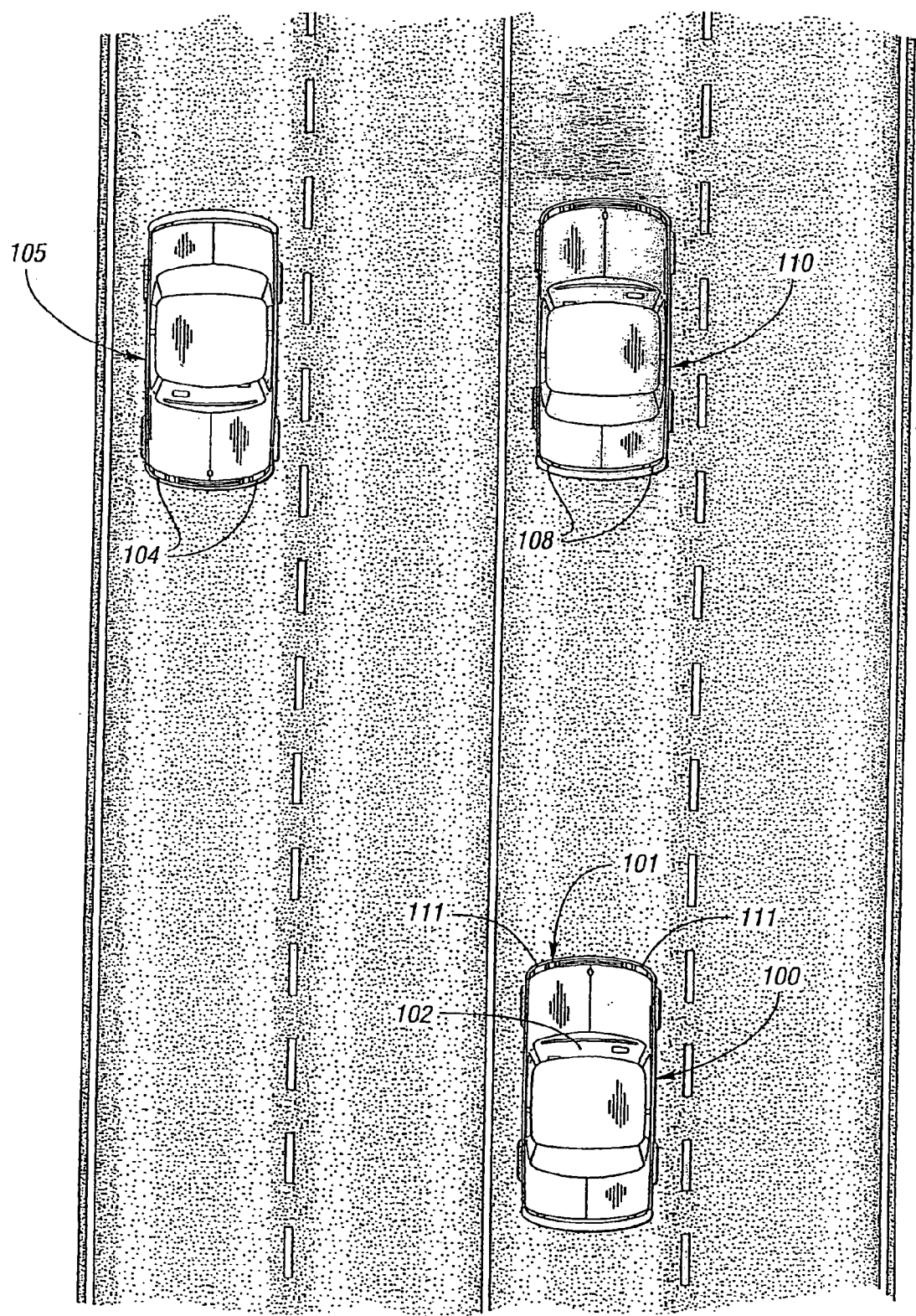
FIG. 1 illustrates vehicles traveling on a common road.

The microcontroller 1105 can take advantage of the availability of signals (such as vehicle speed) communicated over the vehicle's electrical bus in making decisions regarding the operation of the headlamps 111, which are represented by high beams 1131 and low beams 1132 in FIG. 11, and the electrochromic mirror 1102. In particular, speed input 1117 provides vehicle speed information to the microcontroller 1105, from which vehicle speed criteria can be used for determining the control state for the headlamps 111. The reverse signal 1119 informs microcontroller 1105 that the vehicle is in reverse, responsive to which the microcontroller 1105 clears the electrochromic mirror element 1102 regardless of the signals output from the light sensors 1107, 1109. Auto ON/OFF switch input 1121 is connected to a switch having two states to dictate to microcontroller 1105 whether the vehicle headlamps 1131, 1132 should be automatically or manually controlled. The auto ON/OFF switch (not shown) connected to the ON/OFF switch input 1121 may be incorporated with the headlamp switches that are traditionally mounted on the vehicle dashboard or incorporated into steering wheel column levers. Manual dimmer switch input 1123 is connected to a manually actuated switch (not shown) provides a manual override signal for the high beam state. Should the current controlled state of the high beams be ON, the microcontroller will respond to actuation signal manual override signal control input 1123 to turn the high beams OFF temporarily until the driver restores operation or, optionally, until a predetermined time has elapsed. Alternatively, should the high beams be OFF, the microcontroller 1105 will respond to an actuation signal on input 1123 to turn the high beams ON. The manual high beam control switch can be implemented using a lever switch located on the steering column of controlled vehicle 100 (FIG. 1).

The circuit board 1101 has several outputs. The control signal on electrochromic output 1127 provides current to the electrochromic element 1102. Additional outputs (not shown) may optionally be provided to control exterior electrochromic rearview mirrors (not shown) if such additional mirrors are provided. The microcontroller 1105 communicates the current state of the low beam headlamps 1131 and the high beam headlamps 1132 to the headlamp drive 1104 via headlamp control output 1127. The microcontroller 1105 generates control signals communicated over conductor 1113 (FIG. 11) to an optional visual indicator 1115 which displays the current state of the high beam headlamps to the driver of controlled vehicle 100. The high beam indicator is traditionally located in or near the vehicle's instrument cluster on the vehicle dashboard. As described further below, a separate indicator may be provided to indicate whether the automatic headlamp control is active. A compass sensor 1135 may be connected to the circuit board 1015 via a bi-directional data bus 1137. The compass can be implemented using a commercially available compass of the type generating digital or analog signals indicative of the vehicle's heading, such as those described in U.S. Pat. No. 5,239,264, entitled "ZERO-OFFSET MAGNETOMETER HAVING COIL AND CORE SENSOR CONTROLLING PERIOD OF AN OSCILLATOR CIRCUIT"; U.S. Pat. No. 4,851,775, entitled "DIGITAL COMPASS AND MAGNETOMETER HAVING A SENSOR COIL WOUND ON A HIGH PERMEABILITY ISOTROPIC CORE"; U.S. Pat. No. 5,878,370, entitled "VEHICLE COMPASS SYSTEM WITH VARIABLE RESOLUTION"; U.S. Pat. No. 5,761,094, entitled "VEHICLE COMPASS SYSTEM"; U.S. Pat. No. 5,664,335, entitled "VEHICLE COMPASS CIRCUIT"; U.S. Pat. No. 4,953,305, entitled "VEHICLE COMPASS WITH AUTOMATIC CONTINUOUS CALIBRATION"; U.S. Pat. No. 4,677,381, entitled "FLUX-GATE SENSOR ELECTRICAL DRIVE METHOD AND CIRCUIT"; U.S. Pat. No. 4,546,551, entitled "ELECTRICAL CONTROL SYSTEM"; U.S. Pat. No. 4,425,717, entitled "VEHICLE MAGNETIC SENSOR"; and U.S. Pat. No. 4,424,631, entitled "ELECTRICAL COMPASS", the disclosures of all of these patents are hereby incorporated herein by reference. A fog lamp control 1141 can be connected to receive via fog light control output 1142 control signals generated by microcontroller 1105. Fog lamp control 1141 controls front fog lamps 1143 and rear fog light 1145 to turn ON and OFF.

Some or all of the inputs 1117, 1119, 1121, 1123, and 1135, and outputs 1127, 1113, 1127, and 1142, as well as any other possible inputs or outputs, such as a steering wheel input, can optionally be provided through a vehicle communications bus 1125 shown in FIG. 11. Vehicle bus 1125 may be implemented using any suitable standard communication bus, such as a Controller Area Network (CAN) bus. If vehicle bus 1125 is used, microcontroller 1105 may include a bus controller or the control interface may be provided by additional components on the main control board 1015.

Figure 12:
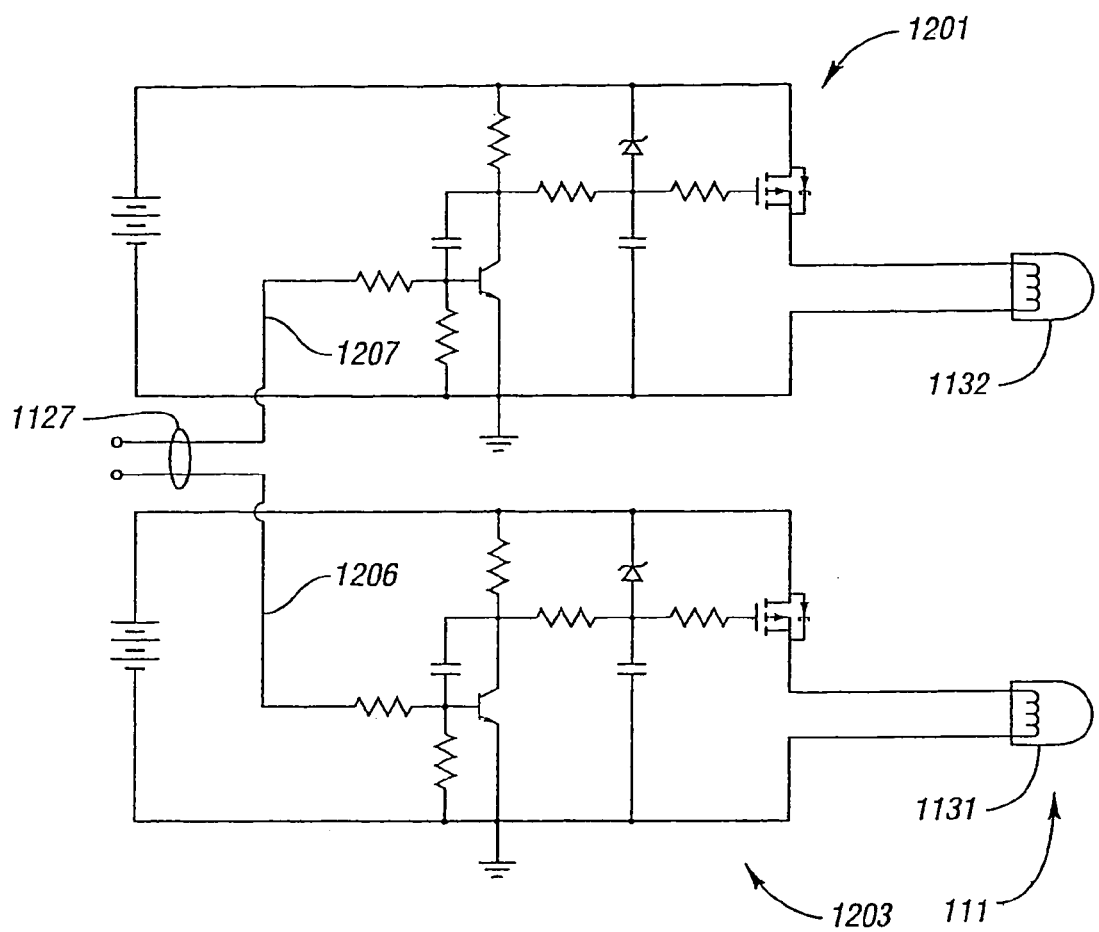
FIG. 12 is a circuit schematic illustrating a headlamp drive for the circuit according to FIG. 11.

FIG. 12 illustrates a headlamp drive 1104 including a drive circuit 1203 for low beam headlamps 1131 and a drive circuit 1201 for high beam headlamps 1132. Bus 1127 includes respective wires 1206 and 1207 carrying pulse width modulated (PWM) signals generated by microcontroller 1105 for driving low beam headlamps 1131 and high beam headlamps 1132. Alternatively, headlamp drive 1104 may contain a DC power supply to vary the voltage supplied to the lamps 1131, 1132, and thus their brightness, in response to control signals on output 1127. Yet another alternative envisioned is to vary the aim of the high beam headlamps 1131 as is described herein below and as taught in U.S. Pat. No. 6,049,171, entitled "CONTINUOUSLY VARIABLE HEADLAMP CONTROL", filed by Joseph Stam et al. on Sep. 18, 1998, the disclosure of which is incorporated herein by reference.

Headlamp drive 1104 provides power to the high beam 1131 and low beam 1132 headlamps. In the simplest case, the headlamp drive contains relays engaged in response to signal 1127 to turn ON or OFF the headlamps. In a more preferred embodiment, high beam headlamps 1131 and 1132 fade ON or OFF under the control of headlamp drive 1104 which generates a variable control signal. Such a control system is described in copending U.S. Pat. No. 6,049,171 incorporated herein above by reference thereto. In general, the patent teaches variable emission control of the headlamps can be provided by energizing the headlamps using a pulse width modulation (PWM) supply, wherein the duty cycle of the drive varied between 0 percent and 100 percent to affect a continuously variable brightness from the headlamps 1131, 1132.

Figure 13:
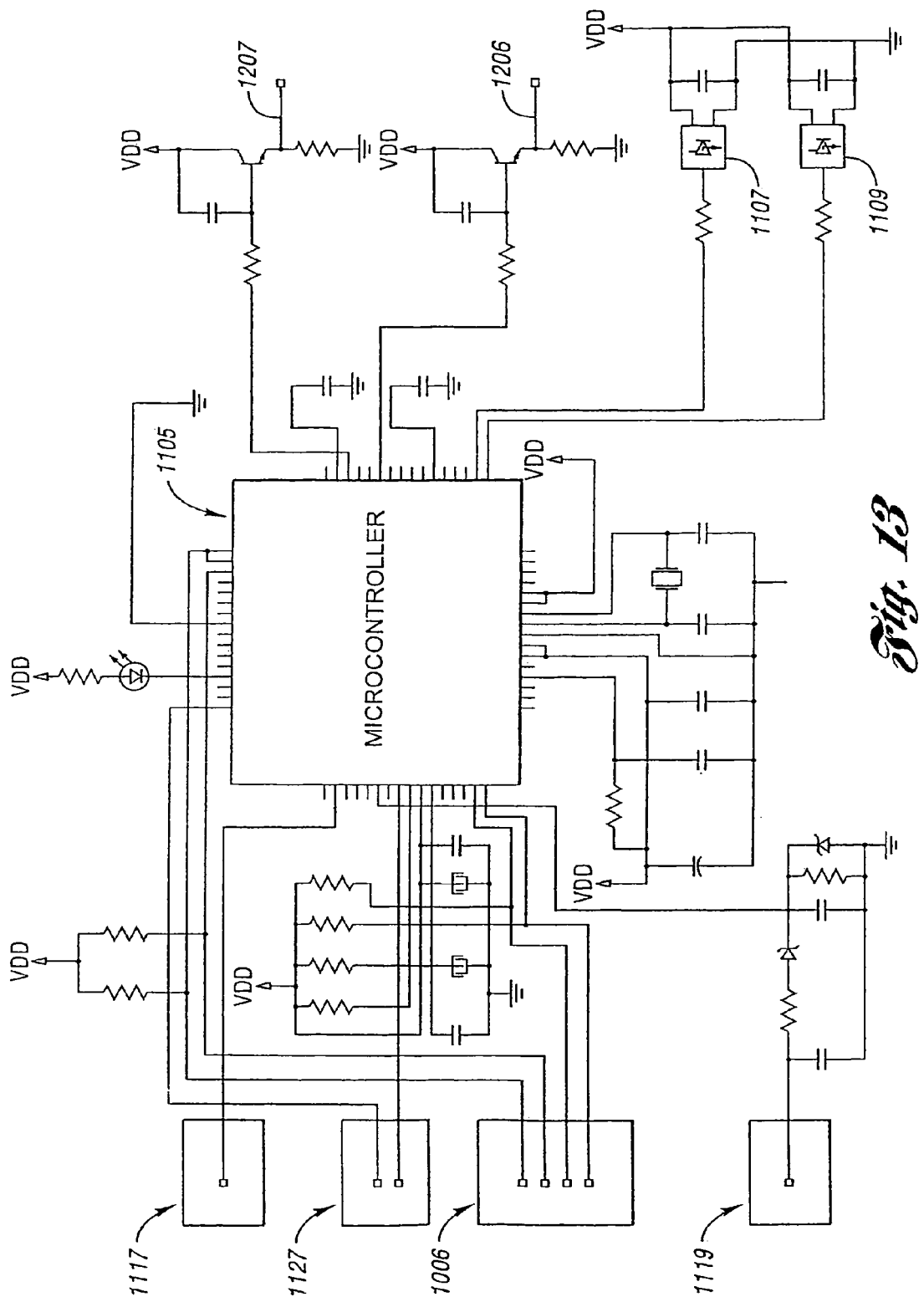
FIG. 13 is a circuit schematic illustrating a microcontroller circuit for the circuit according to FIG. 11.

The microcontroller 1105 analyzes images acquired by the image sensor assembly 201 responsive to which it detects oncoming or preceding vehicles in the forward field of view. The microcontroller 1105 uses this information in conjunction with the various other inputs thereto to determine the current control state for the headlamps 1131, 1132. The current control state of the headlamps refers to the brightness of the high beams and the low beams. In a variable control system, this brightness is varied by changing the duty cycle of the beams or the DC voltage applied to the lamps as described above. In a non-variable system, the control state refers to whether the high beams and low beams are ON or OFF. A more detailed schematic showing the connections to the microcontroller 1105 is shown in FIG. 13. The microcontroller 1105 can be implemented using a microcontroller, a microprocessor, a digital signal processor, a programmable logic unit, a discrete circuitry, or combination thereof.

Additionally, the microcontroller may be implemented using more than one microprocessor.

Operation

The combined effect of the lens structure 202 and the far field baffle 204 will first be described with respect to FIGS. 2a and 7. As mentioned above, in one embodiment, the image array 301 contains 64 columns and 80 rows of 30 μm pixels. The forward scene imaged through the red lens 209 is located on one region 703 of the image array 301. The forward scene imaged through the other lens element 208 is located on region 702 of the image array 301. In the embodiment illustrated, each of these regions is a 60 wide by 20 high pixel subwindow of the image array. The centers of the two regions 702 and 703 are separated 1.2 mm in the Y direction, the same spacing as the center axis of lens 208 and 209. Fourteen pixel rows 704 define a band that lies between the two regions 702, 703 and serves as a border, or buffer, separating these two regions.

The image sensor assembly 250 provides several advantages. Because the block will be solid, it eliminates any surfaces between the image sensor 201 die and the lens structure 202.

By eliminating these surfaces, stray light is reduced. Second, the preferred embodiment allows for the active alignment of the lens, which allows for compensation of various manufacturing variances, as is described in greater detail herein above. Finally, the assembly is inexpensive, eliminating the need for costly ceramic packaging. Some or all of the above-mentioned advantages can be realized through variations on this structure. For example, the enclosure 230, UV curable adhesive 232 and possibly the stress relieving gel 805 (FIG. 8) can be replaced with a UV cured epoxy adhesive.

In operation, an image is exposed onto the image array 301 (FIG. 3) for an exposure period, which may also be referred to herein as an integration period. At the end of the exposure period, an output signal is stored for each of the pixels, and preferably is stored in the pixels as is the case with the photogate pixel architecture described in U.S. Pat. No. 5,471,515 previously incorporated herein by reference. The output signal from each of the pixels is representative of the illumination sensed by each pixel. This output signal is transferred to the column output circuitry 302 one row at a time. The column output circuitry includes capacitors storing the respective pixel output signals for each pixel in the row. Next, the pixel output signals are successively amplified by an analog amplifier 303. The amplifier gain is advantageously adjustable, and may, for example, be controlled to selectively increase the amplitude of the amplifier input signal by 1 (unity gain) to 15 times, in integer increments. Adjustment of the gain of the amplifier permits adjustment of the system sensitivity. The amplified analog signals output from amplifier 303 are sampled by a flash analog-to-digital converter (ADC) 404. The flash ADC 404 converts each of the amplified analog signals, which correspond to respective pixels, into eight-bit digital gray scale values. Various bias voltages for the sensor are generated by digital-to-analog converter (DAC) 105. Two of the voltages generated by the bias generators are the ADC high and low reference values, which determine the analog voltages that will correspond to digital values of 255 and 0, respectively, thus setting the range of the ADC.

Serial timing and control circuitry 309 dictates the timing sequence of the sensor operation, and is described in detail in co-pending U.S. Pat. No. 5,990,469, entitled "CONTROL CIRCUIT FOR IMAGE ARRAY SENSORS", issued to Jon H. Bechtel et al. on Nov. 23, 1999, the disclosure of which is incorporated herein by reference.

The image sensor control process will now be described beginning with reference to FIG. 14. The control process may include control of an electrochromic (EC) mirror. However, because processes for controlling an EC mirror are well known, such processes are not completely described herein. Electrochromic devices are generally known, and examples of electrochromic devices and associated circuitry, some of which are commercially available, are disclosed in Byker U.S. Pat. No. 4,902,108; Bechtel et al. Canadian Patent No. 1,300,945; Bechtel U.S. Pat. No. 5,204,778; Byker U.S. Pat. No. 5,280,380; Byker U.S. Pat. No. 5,336,448; Bauer et al. U.S. Pat. No. 5,434,407; Tonar U.S. Pat. No. 5,448,397; Knapp U.S. Pat. No. 5,504,478; Tonar et al. U.S. Pat. No. 5,679,283; Tonar et al. U.S. Pat. No. 5,682,267; Tonar et al. 5,689,370; Tonar et al. U.S. Pat. No. 5,888,431; Bechtel et al. U.S. Pat. No. 5,451,822; U.S. Pat. No. 5,956,012; PCT application Serial No. PCT/US97/16946; and U.S. patent application Ser. No. 09/236,969, now abandoned, the disclosures of which are incorporated herein by reference thereto.

Figure 14:
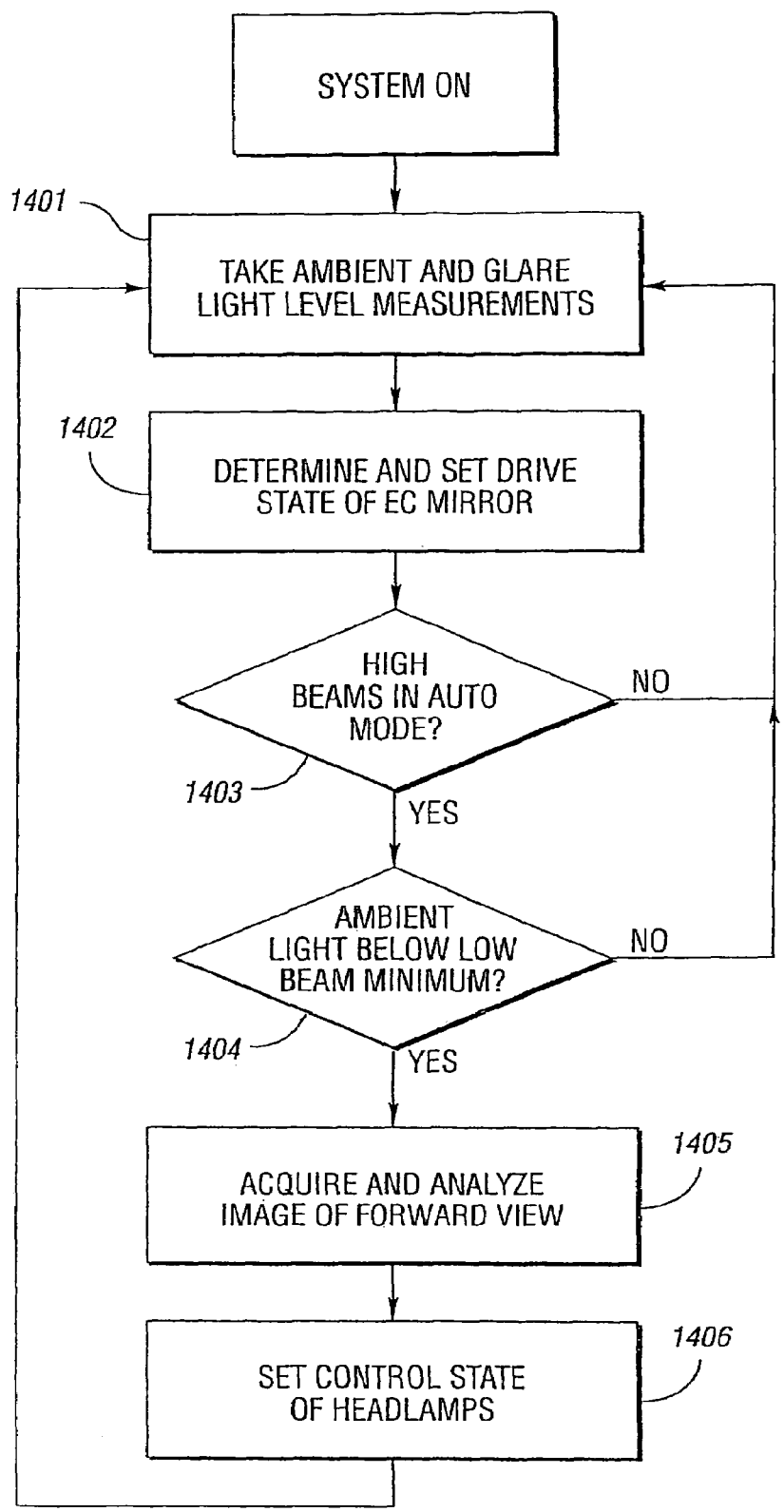
FIG. 14 is a flow chart illustrating operation of an electrochromic mirror and headlamp control.

The forward ambient light sensor 1107 and rear glare sensor 1109 measure the forward and rear light levels, as indicated in step 1401 (FIG. 14). The forward ambient measurement is used to control both the low beam and high beam headlamps 1131, 1132 and the electrochromic mirror 1102. Additionally, the forward ambient measurement may be used to control the brightness of the daytime running lights and the brightness of the tail lights. The rear glare measurement is used for the control of the electrochromic mirror 1102 reflectivity. The forward ambient light level measurement is averaged with prior measurements to compute a forward time averaged ambient light level. This average light level is computed as the average of measurements taken over a 25-30 second interval. Responsive thereto, the microcontroller 1105 computes the control state for electrochromic element 1105 as a function of the light level measured by sensors 1107 and 1109 in step 1202. Where the microcontroller 1115 is a microcontroller selected from the Motorola MCS912, the electrochromic element drive state can be set by programming a pulse width modulated (PWM) duty cycle corresponding to the desired reflectance level of the electrochromic element into a pulse width modulated peripheral to the Motorola MCS912 family microcontroller. This PWM output is then fed to a series drive circuit in a manner similar to that disclosed in U.S. Pat. No. 5,956,012, entitled "SERIES DRIVE CIRCUIT," filed by Robert R. Turnbull et al. on Sep. 16, 1997.

If the headlamps 1131, 1132 are not in auto mode as determined in step 1403, which is manually set responsive to the signal 1121, the microcontroller 1105 returns to step 1401, such that the microcontroller will continue to control the variable reflectance of the electrochromic element 1102. Decision 1403 provides the user with a manual override if the high beams are ON. Additionally, the high beam automatic control will be skipped in step 1403 (the decision will be NO) if the high beams are not ON.

If it is determined in step 1403 that the automatic mode is active, the microcontroller 1105 uses the average ambient light level measured in step 1401 to determine whether the ambient light level is below a low beam minimum threshold in step 1404. The threshold may, for example, be 1-3 lux, and in one implementation was 2 lux. If the ambient light level is above the threshold, indicating that high beam headlamps would not provide significant advantage, high beam control will not be used, and the microcontroller 1105 returns to step 1401. If the ambient light level is below the low beam minimum, for example, below approximately 2 lux, the use of high beam headlamps may be desired. In this case, the microcontroller 1105 will operate to control the headlamps 1131, 1132. In addition to the average ambient light level discussed above, it is also advantageous to consider the instantaneous ambient light level. Should the instantaneous ambient light level suddenly drop to a very low value, for example less than 0.5 lux, automatic high beam operation may begin immediately rather than waiting for the average ambient light level to reach the threshold for operation of the high beams. This situation may occur when a vehicle sitting under a well-lit intersection suddenly crosses the intersection into a dark street where high beam operation is desired immediately. The microcontroller 1105 analyzes images of the forward scene acquired by image sensor 201 to detect the presence of oncoming or preceding vehicles as indicated in step 1405. Based upon the results of step 1405, the microcontroller sets the control state of the headlamps in step 1406. Setting the control state requires setting a duty cycle for the pulse drive in the preferred embodiment. The Motorola MCS912 family microcontroller includes timer/counter peripherals which can be used to generate pulse width modulated signals 1206 and 1207. In some vehicles, the low beam headlamps will always be ON regardless of the state of the high beams. In such a vehicle, only the duty cycle of the high beams will be varied. Other vehicles will have the low beams OFF when the high beams are ON, in which case the duty cycle of the low beams will be reduced as the high beam duty cycle is increased. Control of the vehicle headlights using a PWM signal is disclosed in U.S. Pat. No. 6,049,171, entitled "CONTINUOUSLY VARIABLE HEADLAMP CONTROL", filed by Joseph Stam et al. on Sep. 18, 1998, the disclosure of which is incorporated herein by reference.

Figure 15:
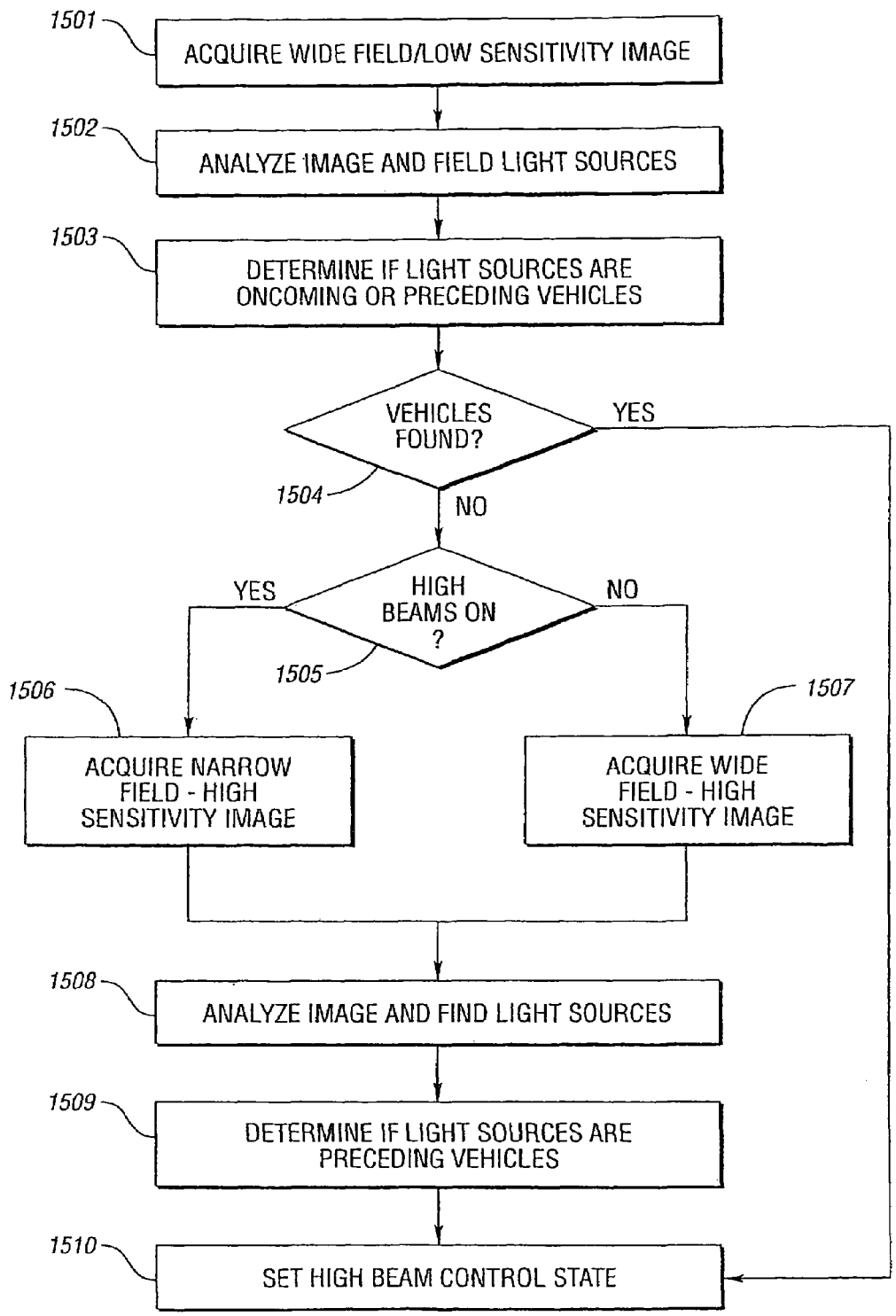
FIG. 15 is a flow chart illustrating operations to acquire and analyze an image.

Step 1405, which is the process of acquiring images in the forward field of the vehicle and analyzing such images, is described in greater detail with reference to FIG. 15. A first pair of images is acquired in step 1501 through both the red lens 209 and the cyan lens 208, corresponding to the two fields 702 and 703 shown in FIG. 7. The field of view of the resulting images is approximately 25° horizontally and 15° vertically using the 64 by 26 pixels, the lens optics, and the far field baffle described above. These images are taken at a low sensitivity. Sensitivity of the image sensor 201 may, for example, be dictated by the frame exposure time, the analog amplifier gain, and the DAC high and low references. The image sensor should be just sensitive enough to image oncoming headlamps at the maximum distance for which the controlled vehicle's headlamps should be dimmed. These images will be sufficient to detect oncoming headlamps at any distance of interest and nearby tail lamps without being washed out by bright headlamps or other noise light sources. In this mode, the sensor should not be sensitive enough to detect reflections off signs or reflectors except in rare cases where the reflecting object is very near to the controlled vehicle. During dark ambient light conditions, this sensitivity will be low enough to detect only lighted objects.

The sensitivity of the image sensor when acquiring the images in step 1501 may also be varied according to whether the high beams are currently ON. When controlling high beams manually, a driver will typically wait until an oncoming vehicle 105 (FIG. 1) or a preceding vehicle 110 is almost close enough for the controlled vehicle's high beams to be annoying before dimming the headlamps 111. However, if the high beams are OFF, most drivers will not activate their high beam headlamps even if an oncoming vehicle 105 is at a great distance. This is in anticipation that the oncoming vehicle 105 will soon come within a distance where the controlled vehicle's high beam headlamps will annoy the oncoming driver, such that the driver of the controlled vehicle 100 will have to turn the high beams OFF shortly after they were activated. To partially mimic this behavior, a higher sensitivity image is acquired if the high beams are OFF, enabling detection of vehicles at a greater distance, than if the high beams are ON. For example, the image sensor when the high beams are OFF can have 50 percent greater sensitivity than when the high beams are ON.

The images are analyzed in step 1502 (FIG. 15) to locate any light sources captured in the images. In step 1503, the properties of the light sources detected are analyzed to determine if they are from oncoming vehicles, preceding vehicles, or other objects. If a light source from a preceding vehicle 110 is bright enough to indicate that the high beams should be dim, the control process proceeds to step 1510 and the high beam state is set.

If no vehicles are detected in step 1503, a second pair of images is taken through lens 208, 209 at a greater sensitivity. First, a determination of the state of the high beams is made in step 1505. This determination is made because the sensitivity of the second pair of images may be five to ten times the sensitivity of the first pair. With a higher sensitivity image, more nuisance light sources are likely to be imaged by the image sensor 201. These nuisances are typically caused by reflections off road signs or road reflectors, which become much more pronounced with the high beams ON. When the high beams are ON, it is advantageous to limit the forward field of view to the area directly in front of the controlled vehicle such that it is unlikely that reflectors or reflective signs will be in the field of view. An ideal narrowed field of view is about 13° horizontally, which is achieved by a reduction of the width of regions 702 and 703 (FIG. 7) to about 35 pixels. If the high beams are OFF, an image with the same field of view as the low sensitivity images acquired in step 1501 can be used since the reflections of low beam headlamps off of signs and reflectors are much less bright than those when high beams are used. Thus, the decision step 1505 is used to select either a narrow field of view image in step 1506 or a wide field of view in step 1507. For either field of view, a pair of images will be taken. As described above with respect to the acquisition of low sensitivity images in step 1501, the sensitivity of the high sensitivity images may also be varied according to the state of the high beam headlamps to provide additional control in avoiding nuisance light sources.

As with the low sensitivity images, the high sensitivity images are analyzed to detect light sources in step 1508. A determination is made if any of these light sources represent a vehicle close enough to the controlled vehicle to require dimming of the high beam headlamps.

Additional images, with greater sensitivity and/or different fields of view, may be acquired in addition to those mentioned above. Additional images may be necessary depending on the dynamic range of the image sensor. For example, it may be necessary to acquire a very high sensitivity image with a very narrow field of view to detect a preceding car's tail lamps at a great distance. Alternatively, should the image sensor have sufficient dynamic range, only one pair of images at one sensitivity may be needed. It is advantageous to use three sets of images, a low sensitivity set, a medium sensitivity set, and a high sensitivity set. The medium sensitivity set has about 5 times the sensitivity of the low gain and the high gain has about 20 times the sensitivity of the low gain. The low gain image set is primarily utilized for detection of headlamps while the medium and high gain images are primarily utilized for detection of tail lamps.

Depending on the quantum efficiency of the image sensor at different wavelengths of light, and the filter characteristics of the filters used for the lens elements 208 and 209, it may be advantageous to use a different sensitivity for the two regions 702 and 703. The timing and control circuitry 309 described in U.S. Pat. No. 5,990,469 can be enhanced to provide the capability to acquire two different windows of pixels simultaneously and use different analog gains for each window. This is accomplished by adding a register which contains the gain values for the analog amplifier used during acquisition of each subwindow. In this way, the relative sensitivity of the two regions can be automatically balanced to provide a similar output when a white light source is imaged through both lens elements. This may be of particular advantage if the image for region 703 is acquired without filtering the light rays, for example, by using a clear lens instead of a cyan filter for rays passing through lens element 208. For this lens set, the pixels in region 702 will receive approximately 3 times as much light when imaging a white light source as those pixels in region 703 which receive light that has passed through a red filter. The analog gain can be set 3 times as high for pixels in red filtered region 703 to balance the output between the two regions.

Figure 16:
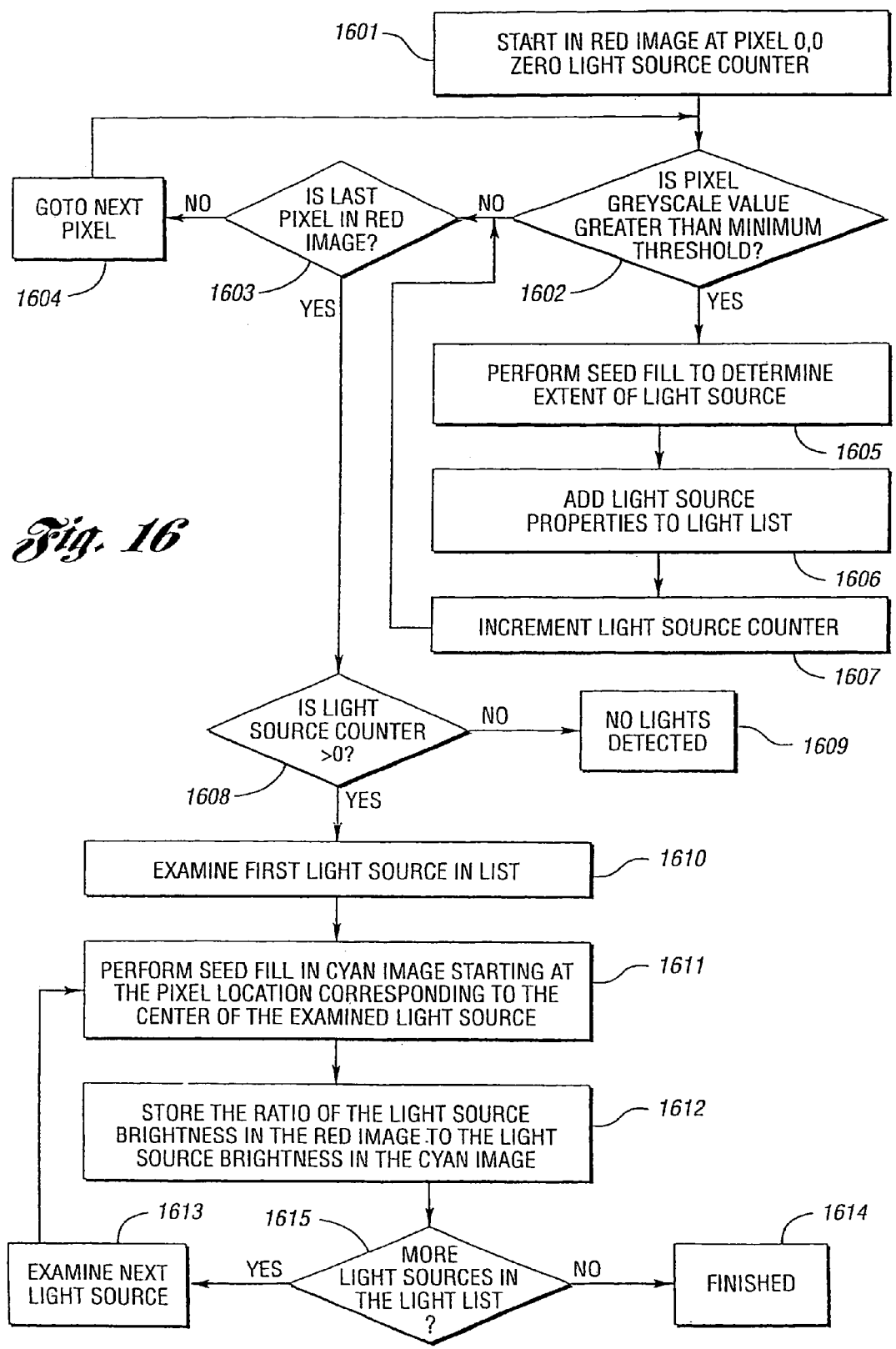
FIG. 16 is a flow chart illustrating operations to analyze an image and find a light source.

The analysis of images to detect light sources indicated in steps 1502 and 1508 is described with reference to FIG. 16. Analysis begins with the image in region 703 acquired through the red lens. It is advantageous to begin with the red filtered image because several nuisance light sources do not admit a significant amount of red light. These nuisance light sources include mercury vapor streetlights, green traffic lights, and reflections off green and blue highway signs. Therefore, a number of potential nuisance light sources are eliminated from consideration. Pixel locations are referred to by X and Y coordinates with the 0,0 pixel location corresponding to a top left pixel. Beginning with the 0,0 pixel 1401 and raster scanning through the image, each pixel is compared to a minimum threshold in step 1602. The minimum pixel threshold dictates the faintest objects in the image that may be of interest. If the current pixel is below the pixel threshold and it is not the last pixel in the red image window, as determined in step 1603, analysis proceeds to the next pixel as indicated in step 1604. The next pixel location is determined by raster scanning through the image by first incrementing the X coordinate and examining pixels to the right until the last pixel in the row is reached, and then proceeding to the first pixel in the next row.

If it is determined that the current pixel value is greater than the minimum threshold, a seed fill analysis algorithm is entered in which step the size, brightness and other parameters of the identified light source are determined as indicated in step 1605. The seed fill algorithm is used to identify the pixels of the image sensor associated with a common light source, and thus identify associated pixels meeting a pixel criteria. This can be accomplished by identifying contiguous pixels exceeding their respective threshold levels. Upon completion of the seed fill algorithm, the properties of the light source are added to the light source list in step 1606 for later analysis (steps 1503 and 1509 in FIG. 15) to determine if certain conditions are met, which conditions are used to identify whether the light source represents an oncoming or preceding vehicle. A counter of the number of sources in the list is then incremented as indicated in step 1607. The microcontroller then goes to step 1603.

If it is determined in step 1603 that the last pixel in the red image has been examined, the microcontroller 1105 determines whether any light sources were detected, as indicated in step 1608. If no light source is detected, the analysis of the image terminates as indicated at step 1609. If one or more light sources are detected through the red lens 209, the cyan or clear image window 702 is analyzed to determine the brightness of those light sources as imaged through the other lens 208, in order to determine the relative color of the light sources. In this situation, the "brightness" of the sources refers to the sum of the gray scale values of all the pixels imaging the source; a value computed by the seed fill algorithm. The first source on the list is analyzed in step 1610. A seed fill algorithm is executed in step 1611, with the cyan image starting with the pixel having the same coordinates (relative to the upper left of the window) as the center of the light source detected in the red image. In this manner, only those pixels identified with a light source viewed through the lens associated with the red filter will be analyzed as viewed through the other filter, which is advantageous, as many nuisance light sources which would otherwise be analyzed when viewed through a clear or cyan filter will be removed by the red filter. By only considering light sources identified through the red filter, the amount of memory required to store information associated with light sources viewed through the other filter will be reduced. The ratio of the brightness of the source in the red image 703 to the brightness of the source in the other image 702 is stored in the light list, as indicated in step 1612, along with the other parameters computed in step 1605 for the current light source. This procedure continues for other sources in the light list 1613 until the red to cyan ratios are computed for all sources in the list 1615, at which point the analysis terminates at step 1614.

As a further measure to reduce the required memory, the pixel data may be processed as it is received without storing the entire image in memory. Such a processing algorithm is disclosed in commonly assigned U.S. Pat. No. 6,631,316, the entire disclosure of which is incorporated herein by reference.

It will be recognized that where it is desirable to count the number of light sources to determine the type of driving environment, and in particular to identify city streets or country roads, it may be desirable to count all of the light sources viewed through the cyan or clear filter. In this way, nuisance light sources can be counted. Alternatively, the number of light sources viewed through the red filter can be counted for purposes of inhibiting turning ON the high beams if a threshold number of sources is identified.

Figure 17A:
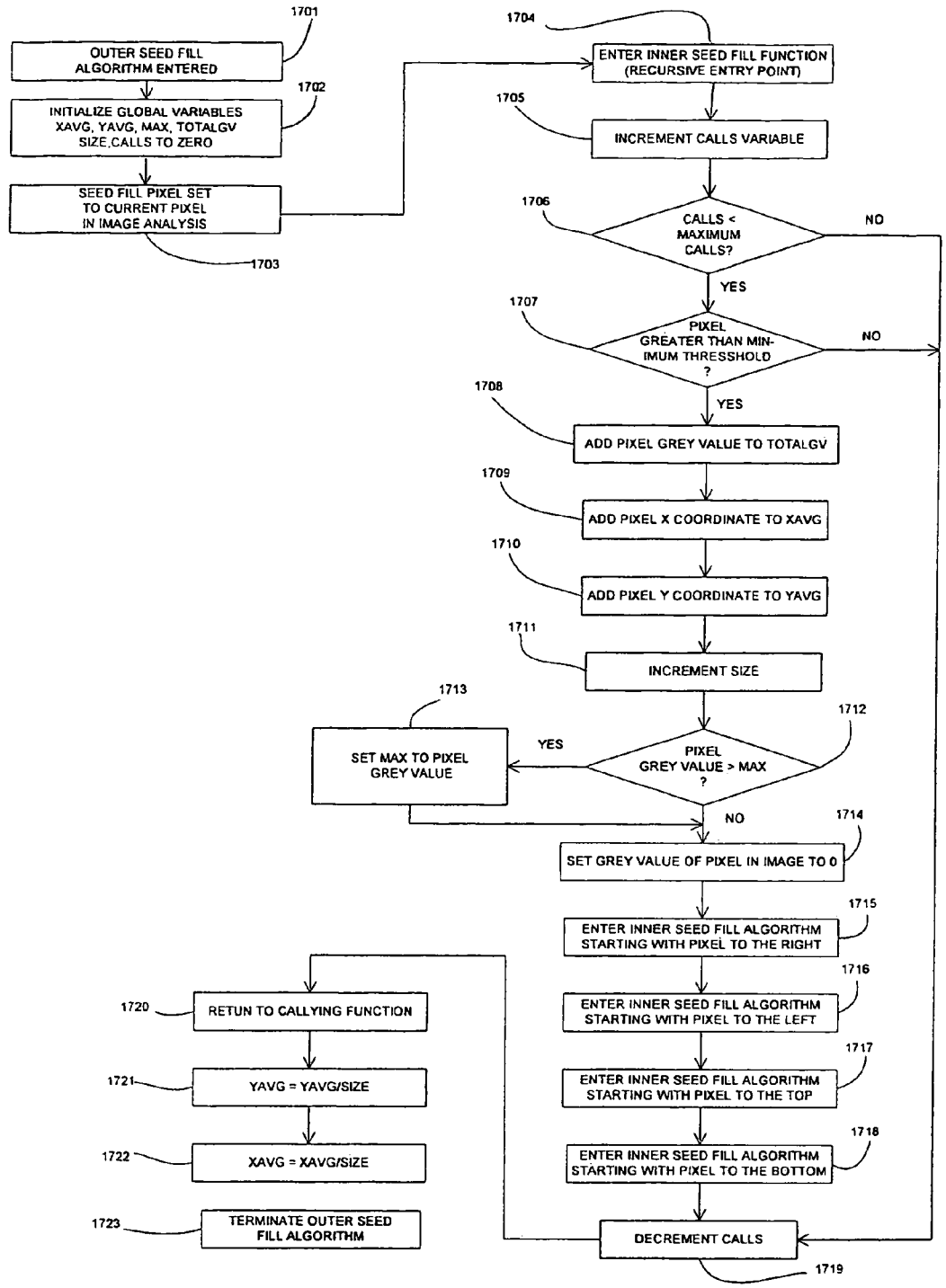
FIG. 17a is a flow chart illustrating a seed fill algorithm.

The seed fill algorithm used in steps 1605 and 1611 is shown in FIG. 17a. The outer section of the seed fill algorithm is entered with the current pixel value at step 1605. The outer section of the seed fill algorithm is executed only once at each step 1605, while the inner recursive seed fill algorithm is entered many times until all contiguous pixels meeting a pixel criteria are identified. After the entry step 1701 of the outer section of the seed fill algorithm, several variables are initiated as indicated in step 1702. The variables XAVG and YAVG are set to zero. These variables will be used to compute the average X and Y coordinates of the pixels imaging a light source, which average coordinates will together correspond to the center of the light source. The TOTALGV variable is used to sum the gray scale values of all the pixels imaging the source. This value will define the brightness of the source. The SIZE variable is used to tally the total number of pixels imaging the source. The MAX variable stores the maximum gray scale value of any pixel imaging the source. A CALLS variable is used to limit the number of recursive calls to the recursive inner seed fill function to prevent memory overflow as well as for tracking.

The inner seed fill algorithm is first entered in step 1703. The start of the inner recursive seed fill function for the first and subsequent calls to the seed fill function is indicated by block 1704. The first step in the inner seed fill function is to increment the CALLS variable as indicated in step 1705. Next, microcontroller 1105 determines if the CALLS variable is greater than the maximum allowable number of recursive calls as determined in step 1706. The number of recursive calls is limited by the amount of memory available for storing light source information. If it is determined that the number of recursive calls exceeds the threshold, the recursive function proceeds to step 1719, wherein the counter is decremented and then returns to the step from which the recursive function was called. Should this occur, a flag is set indicating that the current light source had too many recursive calls and parameters computed by the seed fill algorithm will be incorrect. This prevents too many levels of recursion from occurring, which would overflow the memory of the microcontroller. It is also possible to implement the algorithm non-recursively.

If the decision in step 1706 is that the CALL variable is not greater than the maximum allowable, the microcontroller 1105 next compares the current pixel with a minimum gray scale threshold in step 1707 to determine if the pixel is significantly bright to be included in the light source. The threshold considered in step 1707 can be constant or vary by position. If it varies, the variable thresholds may be stored in a spatial look-up table having respective pixel thresholds stored for each pixel, or each region of the image sensor. Where the threshold is variable by position, it is envisioned that where a pixel at one location exceeds its associated pixel threshold, the controller can continue to use that threshold for adjacent pixels while searching for a contiguous group of pixels associated with a single light source, or the controller can continue to use the respective pixel thresholds stored in the spatial look-up table.

If the condition in step 1707 is not met, this inner recursive seed fill function terminates by advancing to step 1719. If the pixel has a high enough gray scale value as determined in step 1707, its gray scale value is added to the global TOTALGV variable 1708, its X and Y coordinates are added to the XAVG and YAVG variables 1709 and 1710, and the size variable is incremented in step 1711. If the gray scale value of the pixel is greater than any other pixel encountered in the current seed fill, as determined in step 1712, the MAX value is set to this gray scale value 1713.

Following a no decision in step 1712, the gray scale value of the pixel is set to 0 to prevent further recursive calls from including this pixel. If a future recursive call occurs at this pixel, and the pixel is not zeroed, the pixel will be added the second time through. By zeroing the pixel, it will not be added again, as the pixel's gray scale value is no longer greater than the minimum threshold. Additionally, this pixel will be ignored in step 1602 should it be encountered again while scanning the image during analysis.

The inner recursive seed fill algorithm next proceeds to recursively call to itself until it has looked to the right, left, above and below each pixel until all of the contiguous pixels exceeding the minimum pixel threshold value in decision step 1707 are considered. Step 1715 represents returning to step 1704 for the pixel to the right. The microcontroller will continue to look at pixels to the right until it reaches a pixel that does not meet the criteria of decision step 1706 or 1707. Step 1716 represents returning to step 1704 for the pixel to the left. Step 1717 represents returning to step 1704 to look at the pixel above. Step 1718 represents returning to step 1704 to look at the pixel below. The microcontroller will then look at the pixel to the left of the last pixel that did meet decision step 1707. The processor will look at pixels adjacent each pixel exceeding the threshold of step 1707 should the neighboring pixels exist (i.e., the immediate pixel is not an edge pixel). Step 1719 decrements the CALLS variable each time the step is executed, and the microcontroller will return to the calling program until the CALLS value reaches 0. Returning to the function that called it may be another instance of the inner recursive function, or should this be the initial pixel examined, to the outer recursive algorithm 1721.

Figure 17B:
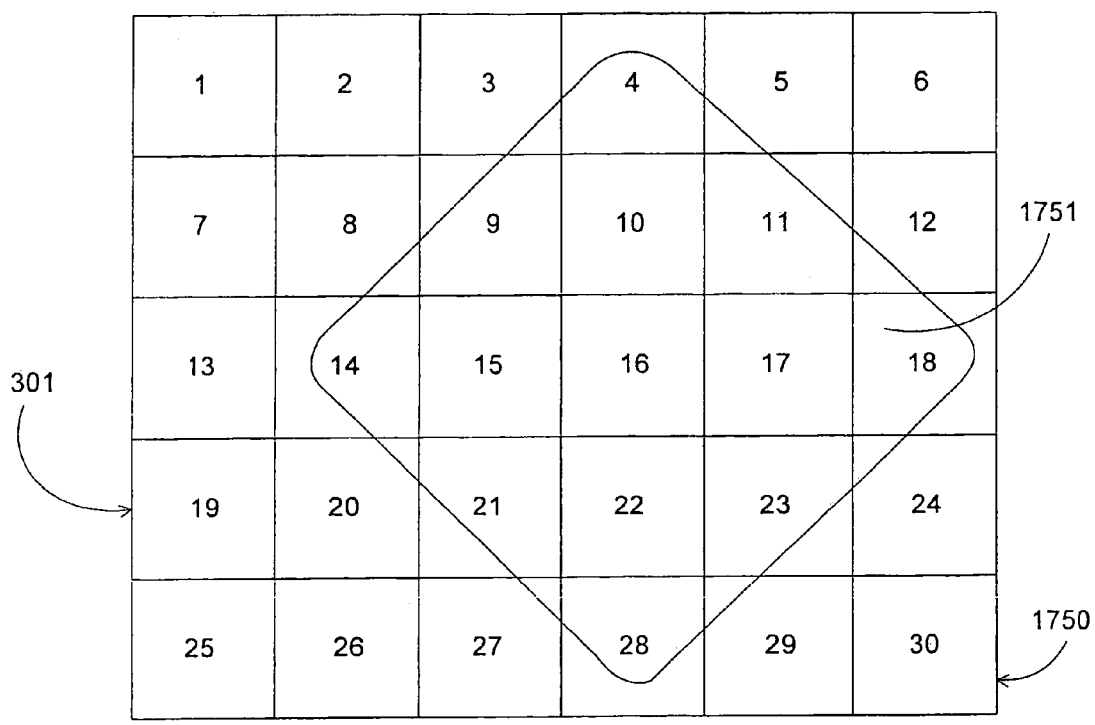
FIG. 17b illustrates a pixel array impacted by a light source.

An example of how the inner and outer seed fill algorithms operate will now be described with reference to FIG. 17*b*. The example is made with respect to an exemplary very small image sensor having 30 pixels. Pixels 4, 9, 10, 11, 14, 15, 16, 17, 18, 21, 22, 23, and 28 exceed the threshold in step 1707 in this example. Additionally, the number of calls required does not exceed the threshold in step 1706. The image array 301 is impacted by a light source 1751, indicated by contour 1751. The microcontroller will operate as follows in evaluating the pixels. For pixel 1, the microcontroller 1105 will enter the seed fill algorithm at step 1701, initialize the variables in step 1702, and set the current pixel in step 1703. The microcontroller will next enter the inner seed fill function in step 1704. The CALLS variable will be incremented to 1 in step 1705, which is below the Maximum Calls threshold. Because there is no light on the pixel, the minimum threshold is not exceeded and the microcontroller will go to step 1719, decrement the CALLS variable in step 1720, and because this is the first time through the inner seed fill program, the microcontroller will continue to steps 1721-1723. The process will be repeated for pixels 2 and 3, which are both below the minimum pixel threshold used in step 1707.

When the microcontroller gets to pixel 4, it will enter the outer seed fill at step 1701, set the variables to zero in step 1702, set the current pixel to pixel 4 in step 1703, and enter the inner seed fill algorithm. The CALLS variable will be incremented to 1, as it is the first pixel in this outer seed fill. The CALLS variable will be less than the Maximum Calls threshold and the pixel's gray scale value will exceed the minimum threshold. Accordingly, the gray value will be added to TOTALGV, the pixel coordinates will be added to those that will be considered for XAVG and YAVG, and the SIZE will be incremented such that the size will be 1. The gray value for pixel 4 will be the MAX, as it is the only gray value in this outer seed fill. The gray value will be set to zero for pixel 4 in step 1714.

The microcontroller will then identify all of the contiguous pixels that exceed the threshold set in step 1707. In particular, through the inner seed fill routine disclosed in FIG. 17*a*, the microcontroller will add the pixels as follows. Pixel 4 is added first as it is the first with a gray scale value greater than the threshold ("the threshold" in this paragraph referring to the minimum threshold in step 1707). The program then calls the recursive function for pixel 5 to the right, which is not added as it is below the threshold (as used in this paragraph, "added" means the pixel's coordinates are added to XAVG and YAVG, the pixel's gray scale value is added to TOTALGV, SIZE is incremented, and the pixel's gray scale value becomes the maximum pixel gray scale value if it exceeds MAX). Pixel 3 to the left is called next, and it is not added for the same reason. There is no pixel above pixel 4. Accordingly, the recursive function is next called for pixel 10 in step 1718. Pixel 10 will be added as its value is greater than the threshold. The microcontroller 1105 will then look to the right of pixel 10, namely at pixel 11, which is greater than the threshold, so it will be added. The microcontroller will then look to the right of pixel 11, which is pixel 12. Pixel 12 will not be added as its gray scale value is below the threshold. Looking to the left of pixel 11, pixel 10 will not be added as it was zeroed when it was added previously. Looking above pixel 11, pixel 5 will not be added. Looking below pixel 11, pixel 17 will be added. Next, the recursive routine will be called for the pixel to the right of pixel 17. Pixel 18 will be added. Moving on to the recursive routine for pixel 18, there is no pixel to the right of pixel 18. Looking to the left of pixel 18, pixel 17 will not be added as it was zeroed when it was added. Looking above pixel 18, pixel 12 will not be added. Looking below pixel 18, pixel 24 will not be added as it is below the threshold. Moving back to the previous recursive function that was not exhausted, the microcontroller 1105 will move back and look to the left of pixel 17, which is pixel 16. Pixel 16 is added. Calling the recursive function again, the microcontroller will look to the right of pixel 16. Pixel 17 will not be added as it was cleared after it was previously added. Looking to the left of pixel 16, pixel 15 is added. Calling the recursive function from pixel 15, the microcontroller will look to the right at pixel 16. Pixel 16 is not added, as it was zeroed after it was previously added. Looking to the left, pixel 14 is added. Calling the recursive function from pixel 14, the microcontroller will look to the right at pixel 15, which will not be added. Looking to the left of pixel 14, pixel 13 is not added. Looking above pixel 14, pixel 8 is not added. Looking below pixel 14, pixel 20 is not added. Moving back to the function that called the recursive function for pixel 14, the microcontroller will look above pixel 15 at pixel 9. Pixel 9 is added. Calling the recursive function for pixel 9, looking to the right, pixel 10 is not added. Moving to the left, pixel 8 is not added as it is below the threshold. Looking above, pixel 3 is not added. Looking down, pixel 15 is not added as it was previously cleared. Moving back to the function that called the recursive function for pixel 9, the function has the microcontroller looking at the pixel below pixel 15. Pixel 21 is then added. Starting the recursive function for pixel 21, looking to the right, pixel 22 is added. Starting the recursive function for pixel 22, pixel 23 is added as it exceeds the threshold. Starting the recursive function for pixel 23, pixel 24 is not added as it is below threshold. Moving to the left, pixel 22 is not added as it was zeroed. Looking above, pixel 17 is not added as it was zeroed after it was added. Looking down, pixel 29 is not added as it is below the threshold. Moving back to the function that called the recursive function for pixel 23 causes the microcontroller 1105 to look to the left of pixel 22. Pixel 21 is not added as it was cleared. Looking above pixel 22, pixel 16 is not added. Looking below pixel 22, pixel 28 is added. Performing the recursive function for pixel 28, pixel 29 to the right is not added, pixel 27 to the left is not added, pixel 22 above is not added, and there is no pixel below pixel 28. Moving back one function, the recursive function for pixel 22 was completed, so the microcontroller returns to pixel 21. Looking to the left of pixel 21, pixel 20 is not added. Pixel 15 above pixel 21 is not added and pixel 27 below pixel 21 is not added. The recursive function for pixel 15 was exhausted, so the microcontroller looks above pixel 16 to pixel 10 which is not added. Looking below pixel 16, pixel 22 is not added. Moving back one function has the microcontroller looking above pixel 17 at pixel 11, which is not added. Looking below pixel 17, pixel 23 is not added, if the recursive function for pixel 11 was completed, the microcontroller returns to the last non-exhausted pixel of the contiguous lighted pixels. The microcontroller looks to the left of pixel 10, and pixel 9 is not added. The microcontroller looks above pixel 10, and pixel 4 is not added. Looking below, pixel 16 is not added. The inner seed fill is complete.

After the last pixel is added, YAVG, XAVG and size are used to select the center of the light in steps 1722 and 1723.

The seed fill scheme just described is the preferred seed fill algorithm for analysis of the red image 703. It requires some modification for the other image 702. This need can be seen from the following example. Where a pair of oncoming headlights is identified as two separate lights in the red image, it is possible that these sources may contain more light in the cyan half of the spectrum than the red half (as is the case with High Intensity Discharge headlamps). In this case, what was detected as two separate light sources in the red image can bloom into one source in the cyan image. Thus, there would only be one source in the cyan image to correspond to two light sources in the red image. After step 1611 is completed for the first source in the red image, the bloomed cyan image pixels would have been cleared in step 1714, such that they would not be available for the analysis of the second light source in the red image. Thus, after the source in the cyan image is determined to correspond to the first source in the red image, there would be no source on the cyan image to correspond to the second source in the red image. To prevent this, it is useful to preserve the image memory for the cyan image rather than setting the gray scale value to zero as in step 1714 so that the bloomed source is detected as corresponding to both of the sources in the red image.

Since the red image has already been processed, the memory that stored the red image can be used as a map to indicate which pixels in the cyan image have already been processed. All pixels in the red image memory will have been set to gray scale values less than the minimum threshold as a result of the processing. The pixels that were identified as light sources were zeroed whereas the light sources that were not cleared will have some low gray scale value. This characteristic can be used to set the pixels in the red image memory to serve as markers for processing pixels in the cyan image. In particular, when the seed fill algorithm is executed for the cyan image, step 1714 is replaced by a step that sets the value of the pixel in the red image memory corresponding to the currently analyzed cyan pixel to a marker value. This marker value could be, for example, 255 minus the index of the current light source in the light list. The number 255 is the largest value that can be stored for a gray scale value. In this way, there will be a unique marker stored in the red image memory for pixels analyzed each time step 1611 is executed for a light on the list. In addition to the above change to step 1714, a test must be added after step 1707 to determine if the value of the pixel stored in the red image memory corresponding to the currently analyzed pixel is equal to the marker value for the current light source index, indicating that this pixel has already been recursively visited, in which case the microcontroller would go to step 1719.

Steps 1501 and 1502 for the red image in region 703 and corresponding steps 1506, 1507 and 1508 for the other image in region 702, have now been explained in detail. In steps 1503 and 1509, the light source list is analyzed to determine if any of the identified light sources indicate the presence of an oncoming or preceding vehicle. FIG. 18 is a flow diagram of the series of tests applied to the information gathered on each light source in the light list during the previous analysis steps to determine the type of light source. The tests in FIG. 18 are applied to each source in the list independently.

First, a check is made to see if the recursive seed fill analysis of this light source exceeded the maximum number of subsequent recursive calls allowed as determined in step

1801. If so, the light source is labeled an extremely bright light in step 1803 since the number of pixels in the source must be large to cause a large number of subsequent recursive calls. Next, the TOTALGV variable is compared to a very-bright-light-threshold 1802. If TOTALGV exceeds this threshold, the light is also labeled as extremely bright in step 1803.

If neither of the conditions 1801 or 1802 is met, the light source is analyzed to determine if it has a 60 Hz alternating current (AC) intensity component, indicating that the light source is powered by an AC source, in step 1804, to distinguish it from vehicles which are powered by DC sources. Many streetlights, such as high-pressure sodium and mercury vapor lights, can be effectively distinguished from vehicle headlamps in this way. To detect the AC component, a series of eight 3×3 pixel images are acquired at 480 frames per second, for example. The 3×3 pixel window is centered on the center of the light source being investigated. The sums of the nine pixels in each of the 8 frames are stored as eight values. These eight values represent the brightness of the source at ¼ cycle intervals over two cycles. The magnitude of the 60 Hz Fourier series component of these eight samples can be computed by the following formula:

$$AC = (A^2 + B^2)^{1/2}$$

$$A = 1.0*(F1 - FMIN) + (-1.0)*(F3 - FMIN) + 1.0*(F5 - FMIN) + (-1.0)*(F7 - FMIN)$$

$$B = 1.0*(F0 - FMIN) + (-1.0)*(F2 - FMIN) + 1.0*(F4 - FMIN) + (-1.0)*(F6 - FMIN)$$

where F1 to F7 refer to the eight summed gray scale values of each of eight frames and FMIN refers to the minimum value of F1 through F7. The value AC is divided by the mean gray scale value of F1 to F8 to give the AC component of interest in step 1804. The scheme is of particular convenience since the sampling rate is exactly four times the frequency of modulation analyzed. If this were not the case, the coefficients for each of F1 through F7 would have to be changed to accommodate this. Additionally, if the system were to be used in countries were the AC power is not at a 60 Hz frequency, the sampling rate or coefficients would be adjusted.

While the AC detection scheme is described for only one window, it is advantageous to perform the above analysis by imaging the source through both the cyan and red filters, or the red and clear filters, and then using the maximum computed AC component from the two sample sets to determine the AC component for step 1804. This allows for accurate measurement of sources that have either strong short or long wavelength components in their spectrum. If the light source AC component is greater than the minimum threshold as determined in step 1805, the light source is determined to be an AC source as indicated in step 1806. Additional measures may be taken to aid in distinguishing between such nuisance light sources and headlamps, such as to provide a lower AC component threshold for an upper area of the sensed image, while providing a higher threshold for the mid-to lower-right-hand side and an intermediate threshold for the mid-to lower-left-hand side.

The next step is to distinguish light sources which are reflections off road signs or other large objects. Road signs are large compared to the size of the headlamp or tail lamp. As a result, they tend to be imaged onto many more pixels than a vehicle lamp, unless the lamp is so bright as to bloom in the image. Sign reflection sources may have a large number of pixels, indicated by the SIZE variable, but a lower average gray scale value than vehicle lamps which have a much higher intensity. If the SIZE variable exceeds a given size threshold as determined in step 1807, the average gray scale value (TOTALGV/SIZE) is compared against an average pixel level threshold, which is the maximum sign average gray scale value, in step 1808. If the average gray scale value is less than this threshold, the light source is determined to be a reflection off a sign as indicated in step 1809.

An additional check for yellow signs, which typically occurs in the front of the vehicle when turning through a curved road, is to measure the color of bright objects and determine if they are likely yellow. Even when using the low gain image, the reflection off a nearby sign may saturate several pixels in both subwindows and make relative color discrimination difficult. However, the same high-speed images acquired when performing an AC validation can be used to accurately determine the relative color even for bright images. This is accomplished by looking at the average value of the F1 through F7 frames mentioned hereinabove through each lens. The ratio of the average of the F1 to F7 frames viewed through the red lens to the average of the F1 through F7 frames viewed through the cyan or clear lens is computed. This ratio will be higher for yellow signs than for white lights, but not as high as for tail lamps. If this ratio is within a certain range indicating that it is likely a yellow sign, this object can be ignored or the threshold for dimming for this object can be decreased, allowing only extremely bright yellow objects to dim the high beams. By allowing the system to respond to bright yellow objects by dimming the high beams, the headlight dimmer will respond to a light source in the event that a headlamp is misdiagnosed as a yellow sign.

Once potential nuisance sources are filtered out, the light source can be identified as a headlamp or a tail lamp. The red to cyan ratio computed in step 1612 is used to determine if the source has sufficient red component to be classified as a tail lamp in step 1810. If this ratio is lower than a tail lamp redness threshold, control proceeds to step 1811, where the threshold for consideration as a headlamp is determined. This threshold can be determined in a number of ways, but the most convenient method is to use a two-dimensional look-up table if the microcontroller has sufficient read-only memory (ROM) to accommodate the table, as is the case with the Motorola MCS912 family of microcontrollers exemplified herein.

The center of the light source is used as the index into the look-up table to determine the threshold. The look-up tables are created to provide different thresholds for different regions of the field of view. For example, the thresholds for regions of the field of view directly in front of the vehicle are lower than those used for regions off to the side. The look-up table can be optimized for the particular vehicle's high beam emission pattern to determine how annoying the high beams will be to oncoming and preceding traffic at various angles. Ideally, the look-up table used when the vehicle's high beams are activated is different than when they are not. When high beams are off, the thresholds to the side of the vehicle can be lower than they are when high beams are activated. This will prevent the high beams from coming ON when there is a vehicle in front of, but off at an angle to, the controlled vehicle, such as happens when on a curve on an expressway. Also, different lookup tables are used for high and low sensitivity images for much of the same reasons. In fact, the lookup tables may indicate that for certain regions, or all regions of the field of view in high sensitivity image, headlamps be ignored completely. A high sensitivity image is only analyzed if the low sensitivity did not detect oncoming or preceding vehicles, so non-red light sources in a high sensitivity image are most likely very distant headlamps or nuisance sources. Therefore, the high sensitivity images may only be analyzed for red sources.

In step 1812, the TOTALGV variable, which is the total pixel level, is compared to the threshold total pixel level for headlights as determined from the appropriate look-up table. If this variable is greater than the threshold, the value is compared to the threshold multiplied by a bright multiplier in step 1813. If TOTALGV is greater than this value, the light source is determined to be a bright headlamp in step 1815. If not, the light source is a headlamp as indicated in step 1814. The need to distinguish between headlamps and bright headlamps will become clearer in the discussion of the control state of the headlamps. As an alternative to comparing TOTALGV to a threshold times a bright multiplier, yet another look-up table can be provided to dictate thresholds for bright headlamps.

A procedure similar to that just described is performed in step 1816 if the light source is determined to be red. A series of lookup tables are provided for tail light thresholds and the appropriate lookup table is used to determine the threshold for the given light source location. In 1817, the total pixel level for tail light threshold is compared to the TOTALGV variable to determine to light sources bright enough to be of interest. If so, the light source is labeled as a tail light in step 1819. If not, the light source is ignored in step 1820.

Should the cyan lens element 301 be replaced by a clear lens, a different ratio threshold is used in step 1810. In this case, a red light will have approximately the same brightness in both images, but a white or other color light will be substantially brighter when imaged through the clear lens. This ratio is determined based on the analog gain settings for both the red and cyan (or clear) images.

Figure 19:
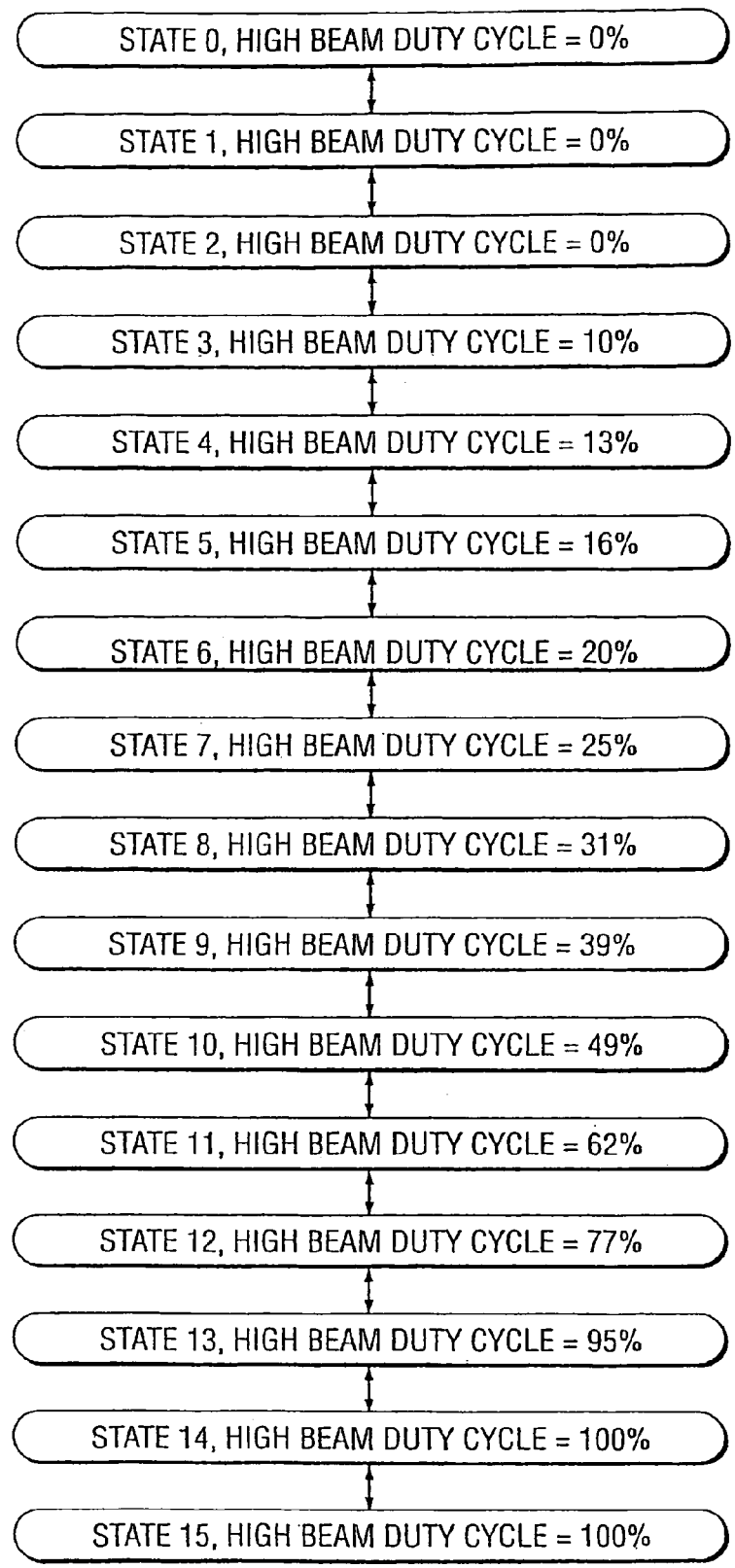
FIG. 19 is a state diagram illustrating the duty cycle associated with states for a variable high beam lamp.

Once the images of the forward field have been acquired and analyzed in step 1405, the state of the headlamps must be determined in step 1406. This is best described by considering a state machine implemented in the microcontroller 1105, which state machine is illustrated in FIG. 19. In the following example it is assumed that headlamp drive 902 is a pulse width modulator drive and the high beam brightness can be varied by changing the duty cycle of the pulse width modulator drive. It is also assumed that the low beam headlamps remain on at 100 percent duty cycle at all times. Each of the states in FIG. 19 represents a control state of the high beam headlamps. The duty cycle of the high beam headlamps is set to the value indicated by the current control state. The distribution of the duty cycles amongst the control states is non-linear to compensate for the fact that headlamp brightness is a non-linear function of duty cycle and to provide the appearance of a constant percent change from cycle to cycle. Also, there are several states for both 0 percent and 100 percent duty cycle, indicating that several states must be traversed before the headlamps begin to go ON or OFF, providing a time delay verification insuring that the detected light source is persistent over several images. The number of states is exemplary only, and those skilled of the art will recognize that it may vary depending on the desired fade ON and OFF rate of the high beams and time between cycles. Additionally, the bright light indicator (which is typically located on the vehicle's dashboard) fades ON as the state moves from state 11 to state 14. The bright light indicator fades OFF as the states move from state 7 to state 4. This provides some hysteresis to avoid flashing the indicator ON and OFF. Alternatively, if the indicator does not fade ON and OFF, the state at which the bright light indicator turns ON will preferably be a higher state than the state at which the bright light indicator turns OFF. In either case, a hysteresis is provided for the headlamp control.

Figure 20:
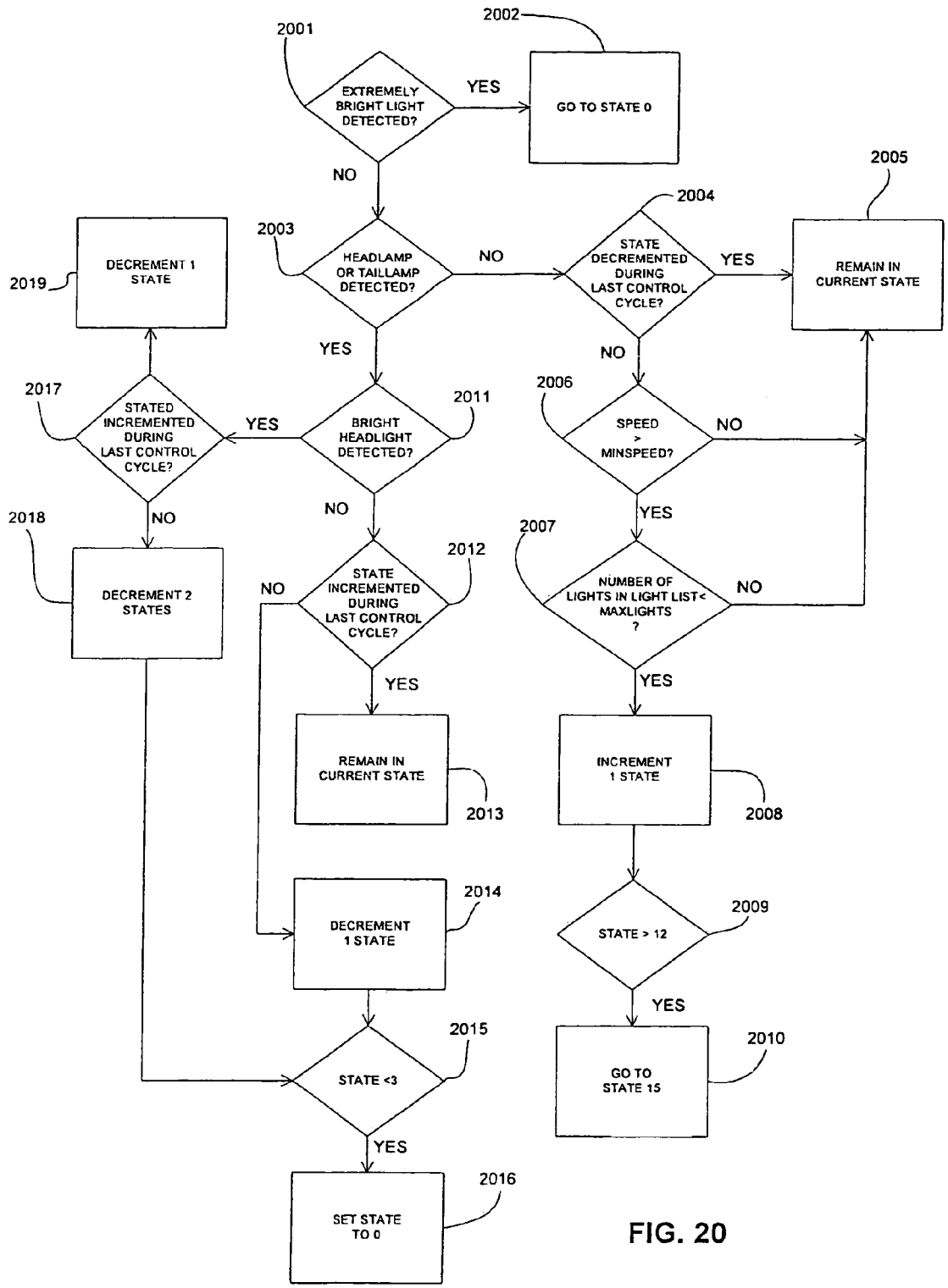
FIG. 20 illustrates operation rules for changes of state in FIG. 19.

After each control cycle, the headlamp control state can remain the same or move to a different state. The rules for moving between states are described with reference to FIG. 20. First, if any of the lights in the light list were determined to have been extremely bright lights in step 2001, the current control state is immediately set to a 0 state in step 2002. This behavior allows bypass of the fade out feature and rapid response to the sudden appearance of headlamps in the forward field of view, such as happens when driving over a hill. Step 2003 determines whether a headlamp or tail lamp was detected in the light source list. If not, the control proceeds to step 2004, wherein it is determined whether the previous state was decremented in the last control cycle.

One of the advantages of the variable beam configuration is the ability to fade in and out high beams. If a reflection from a sign or reflector is misdiagnosed as a vehicle lamp, the high beams will begin to dim. When they do, the reflected source will no longer be present in the image and the high beams will fade back on, likely without bothering the driver. To prevent rapid oscillation between increasing and decreasing headlamp beam brightness, the control state must rest in the current state for one cycle before changing direction. Therefore, step 2004 considers the action during the previous cycle and the system will remain in the current state as indicated in step 2005 if the previous action was to decrement states.

If the action during the previous cycle was not to decrement states, vehicle speed is considered next in step 2006. If a vehicle is stopped at an intersection, it will annoy the driver if the high beams come ON, dim with a passing car, and then come ON again. To prevent this, the high beams are prevented from coming ON if a vehicle is traveling below a certain speed, for example 20-mph. A decrease in speed below the minimum speed threshold will not necessarily cause the high beams to dim unless there is an oncoming or preceding car present. Alternatively, the high beams can be configured to fade OFF every time the vehicle comes to a stop and then fade ON again once the vehicle begins moving, provided no other vehicles are present. In step 2007, the number of lights in the light list (counted in step 1607) is checked as an indication of whether the driver is driving in city conditions. If there are a large number of lights in the forward field of view, the high beams will not be turned ON. The number of the lights that are alternating current sources may also be considered.

If the criteria of steps 2004, 2006, and 2007 are met, the current control state is incremented one state in step 2008. If this action results in the current control state exceeding state 12 as determined in step 2009, the current control state is set to 15 in step 2010 forcing several time verification states before the beams can be dimmed again.

Should the microcontroller 1105 detect a headlamp or tail lamp in step 2003, the microcontroller determines whether a bright headlamp was detected in step 2011. If not, the prior cycle action is considered in step 2012 to prevent rapid oscillation between incrementing and decrementing to avoid rapid ongoing oscillations between states. If the prior action was not to increment, the current control state is decremented by 1 state in step 2014. If the new control state is below state 3, as determined in step 2015, the current control state is set to 0 in step 2016.

Finally, if a bright headlamp is detected in step 2011, it is desirable to more rapidly fade out the high beams by decrementing 2 states in step 2018, provided the previous action was not to increment in step 2017, in which case the current state is decremented only one state.

A large number of variations of the scheme just described are possible. For example, more states can be added to increase or decrease the time it takes to fade the high beams in and out. The number of required states will depend upon the image acquisition and analysis cycle time. Ideally, the fade in/out period is about one to two seconds. Another alternative is to decrement states as a function of the brightest light source detected in the light list rather than to decrement a single state for every cycle. In this way, the brightness of the high beam is adjusted as a function of the distance of an oncoming or preceding vehicle rather than just fading in and out. This is particularly advantageous where the control mechanism is to vary the beam angle of the high beams rather than the intensity of the beams. Yet another alternative is to decrement states as a function of the current speed of the controlled vehicle. The rate at which states are decremented could increase at high vehicle speeds, since oncoming cars will overtake the controlled vehicle at a more rapid rate. Yet another alternative is to decrement states as a vehicle slows down. This would allow the high beams to fade out as a vehicle comes to a stop: a feature that may be desirable for some drivers. Finally, it should be noted that the use of discrete states is only exemplary. The intensity and/or aim of the high beam headlamps can be controlled by continuum of values from fully ON to fully OFF.

The previous discussions described in detail the operation of one cycle of the headlamp dimmer control sequence. This sequence is repeated indefinitely as long as the device is on. Depending on the time to complete one cycle, the above procedure may be interrupted to acquire rear glare sensor measurements for the electrochromic mirror. Additionally, the driver may interrupt the above sequence by activating the manual high beam switch generating input signal 1123 (FIG. 11). This feature is necessary to allow the driver to override improper behavior of the control system or to use the high beams to alert other drivers through flashing the high beams.

Some additional features may be provided with the above-described hardware and software configuration. One such feature is daytime running lights (DRLs). On some vehicles, DRLs are provided by operating the high beams at a reduced intensity. By using the PWM drive circuitry provided, the high beams can be set to a reduced intensity during daylight conditions. The ambient light sensor 1107 can be used to determine daylight conditions and switch the headlamps to normal low beam operation at dusk. In particular, the ambient light level can have one or more light level thresholds associated therewith. When the ambient light level is at or above a daytime ON threshold, the daytime running lights will be ON. Below that threshold, but above another lower threshold, the low beams can be ON. Below that lower bright activate ambient light level threshold, the high beams may be operated automatically if the driver does not manually disable high beam operation.

Even without the use of DRLs, it is desirable to have automatic activation of the low beam headlamps at dusk. This control can be provided by the use of the ambient light sensor 1107. For better performance, an additional light sensor can be provided which senses light from a direction upwards rather than looking straightforward as the ambient light sensor 1107 does. Such a sky sensor arrangement is disclosed in U.S. patent application Ser. No. 09/491,192, entitled VEHICLE EQUIPMENT CONTROL WITH SEMICONDUCTOR LIGHT SENSORS, filed by Jon Bechtel et al. on Jan. 25, 2000, now U.S. Pat. No. 6,379,013, the entire disclosure of which is incorporated herein by reference. Alternatively, a few rows of pixels in the image sensor can be used to image a region of the sky above the horizon. An imaging system disclosing such an arrangement is described in U.S. Pat. No. 6,130,421, the disclosure of which is incorporated herein above by reference. The ability to image through both the red and cyan filters can help to distinguish between clear and overcast conditions and to detect a sunset.

It is envisioned that the system can detect a tunnel using the image sensor and a sky sensor. In particular, a potential tunnel condition is detected when a large area of contiguous dark pixels is detected that meets a size threshold level, and is located in the center of the image under daytime ambient light conditions. If the dark area grows while the ambient light conditions continue to sense day ambient light conditions, the potential tunnel condition will continue. If the image sensor continues to see a large dark area forward of the vehicle when the daylight ambient conditions are no longer detected, the vehicle will be determined to be in a tunnel, and the headlights will be ON. The headlights will remain on until the daylight ambient conditions are detected, at which time the headlights will be turned OFF and daylight running lights will be turned ON if the controlled vehicle has daytime running lights.

Speed Varying Thresholds

The speed input 1117 can be used in additional ways by microcontroller 1115. For example, when driving on an expressway, it is necessary to detect oncoming cars in the opposite lane, which is usually separated by a median. Therefore, the microcontroller must be more sensitive to oncoming headlamps at larger angles than would be necessary for back-road driving where there is no median separating oncoming traffic. Incorporating a wide field of view for back-road driving has the disadvantage of increasing the likelihood that the image sensor will detect house lights, which are typically incandescent. Incandescent light sources will not be filtered by the AC rejection algorithm. Such house lights are not typically present on the side of the freeway. By increasing the sensitivity of the device to objects at higher angles when the vehicle is traveling at higher speeds, such as speeds in excess of 50 to 60 mph, the system will be able to sense cross-median traffic on expressways without increased sensitivity to house lights on back roads. It is envisioned that the field of view could be increased when the vehicle speed exceeds 65 mph and decreased when the vehicle speed passes below 60 mph.

Figure 21:
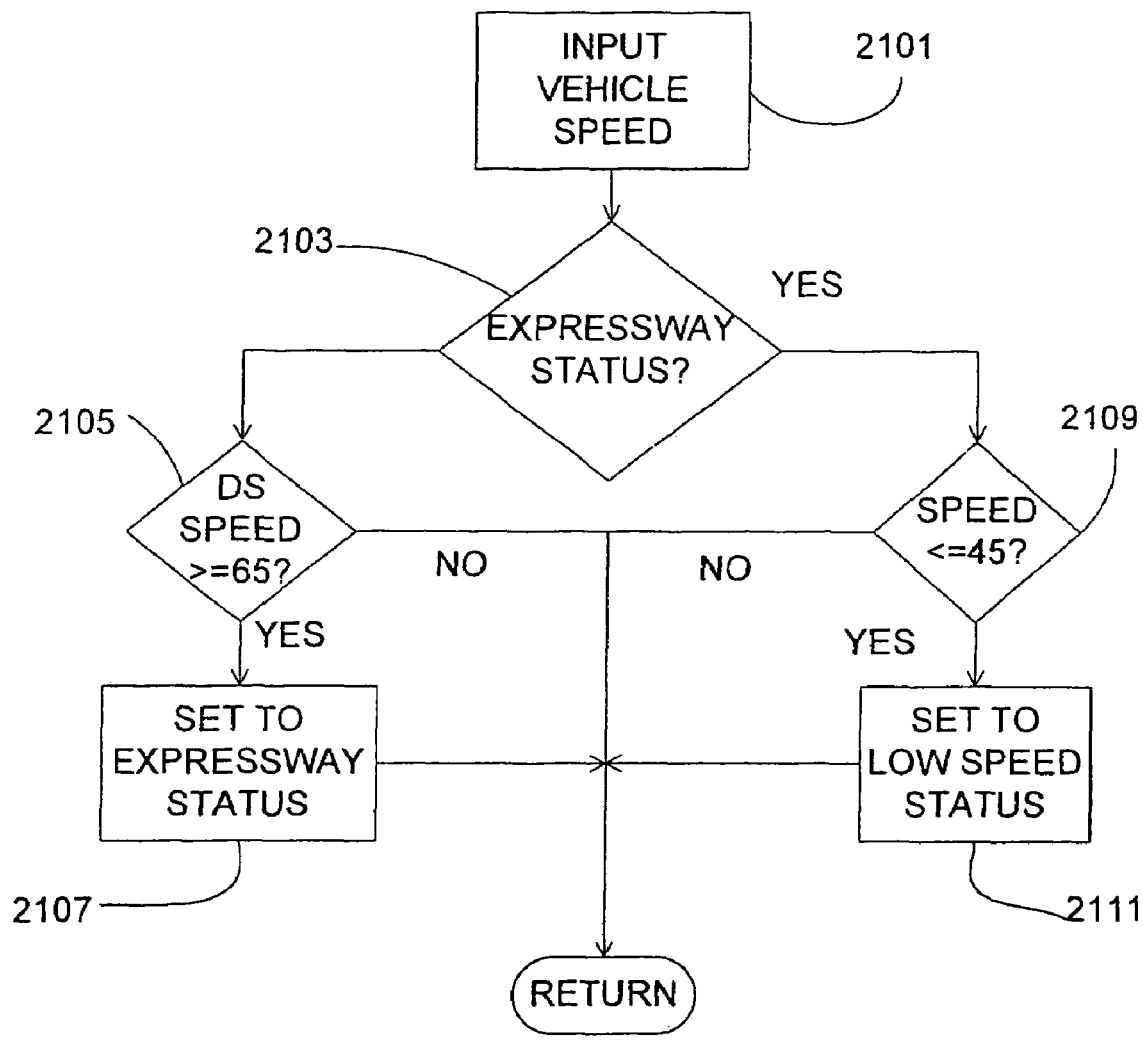
FIG. 21 is a flow chart illustrating operation to provide speed varying thresholds.

In particular, it is envisioned that prior to step 1601, additional steps can be provided to make the field of view speed sensitive. These steps are illustrated in FIG. 21. The vehicle speed is input in step 2101. The microcontroller determines in step 2103 whether the status is currently a wide view for expressway driving. If it is not, the microcontroller 1105 determines whether the speed is greater than 55 mph. If not, the status does not change. If the vehicle speed is determined to be greater than 55 mph in step 2105, the field of view of the image sensor 201 is increased as indicated in step 2107. The field of view in the horizontal direction can be increased by 30 to 150 percent, and advantageously 60 to 125 percent, relative to the narrower field of view at lower speeds. If it was determined in step 2101 that the controlled vehicle 100 is in the expressway state, the microcontroller 1105 determines in step 2109 whether the vehicle speed has dropped below 45 mph. If it has, the microcontroller reduces the field of view of image sensor 201 to its narrower non-expressway field of view. In one advantageous embodiment, the field of view remains the same at all speeds but the thresholds for responding to lights at higher angles are decreased as speed increases. This is advantageous because it allows detection of very bright objects at high angles when the vehicle is traveling at slow speeds, but it is not sensitive to less bright objects, such as house lights or street signs, when traveling at slow speeds. In particular, at high speeds reducing the thresholds increases the sensitivity to cross-median traffic. The thresholds are reduced more significantly to the left than to the right since cross-median traffic is to the left. This property can be reversed for left-hand-drive countries.

It is envisioned that the field of view will be varied by increasing and decreasing the width of the pixels used by the image sensor in the manner described above when the high beams are ON or OFF.

According to another aspect of the invention, the integration time for the pixels of the image array sensor can be increased at higher speeds. This increase in integration period increases the sensitivity of the image array sensor. The system is thus able to detect an oncoming vehicle sooner. This may be particularly advantageous, as oncoming cars are likely to be traveling faster when the controlled vehicle is traveling faster. Accordingly, providing the light control system with a higher sensitivity to shorten the response time will better emulate a desired dimming characteristic of the headlamps by dimming the headlamps at a desired vehicle distance. To provide this function, in step 2107 the microcontroller 1105 increases the sensitivity and/or widens the horizontal viewing angle, whereas in step 2111, the microcontroller decreases the sensitivity and/or narrows the horizontal viewing angle.

Figure 22:
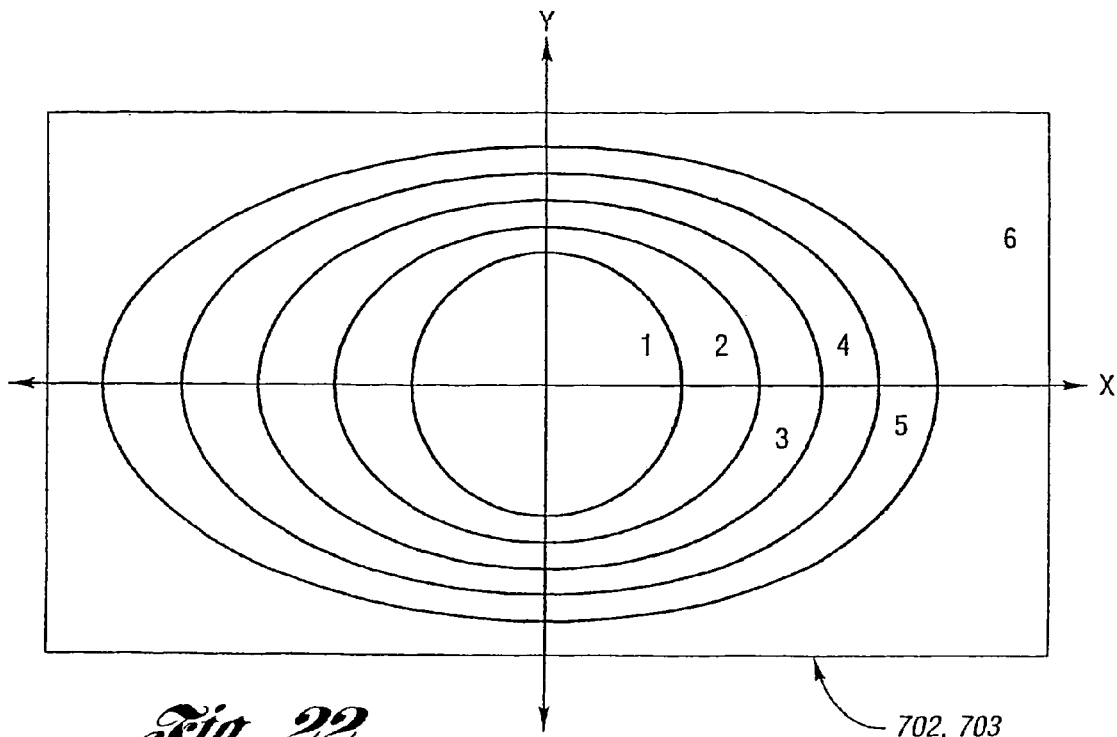
FIG. 22 is a chart illustrating the different regions of the image array.

It is further envisioned that adjustments can be made to the threshold in step 1707 as a function of speed. Such a system can be implemented using a look-up table stored in read-only memory. FIG. 22 illustrates regions of the image sensor array 301, with the regions radiating outwardly from the center. The regions may not be symmetrical since oncoming traffic usually occurs more to the left and signs and nuisance light sources are more likely to be right in right side drive countries. The look-up table sets a respective threshold for each of the regions 1-6 with the regions having sequentially, incrementally greater thresholds moving outwardly from the center. Thus the center region 1 will have the lowest threshold and the outer peripheral 6 will have the highest threshold. In addition, the thresholds at different angles will vary as a function of speed, such that at higher speeds, the thresholds will be lower in regions 3 through 5 than they will be at higher speeds. For example, where two fields of view are provided, one table will contain respective thresholds for pixels in the regions for lower speeds and another table will contain respective thresholds in regions for the higher speeds. Each table will assign an integration time and/or thresholds for use in analyzing different portions of the field of view. Because the greater the distance from the center, the greater the viewing angle of the scene image, lowering the threshold in the outer regions increases the system's responsiveness to light sources at wider angles to the controlled vehicle.

Either the thresholds or the integration times for the pixel sensors of the image array, or both the thresholds and the integration times, can be changed to increase the sensitivity of the sensor at different speeds. Thus, it is envisioned that the field of view can be the same at both high and low speeds. However, the thresholds or the sensitivity (i.e., the integration period or the amplifier gain) can be altered such that at low speeds, images viewed at wide angles will have little impact on the dimming decision whereas at high speeds, the images viewed at wide angles will have substantially more impact on the dimming decision at high speeds. It is further envisioned that instead of using look-up tables, an algorithm can be used to alter the sensitivity of the light sensor as a function of the angle of the image being viewed. Such an algorithm can be used to reduce the memory requirements for the system at the expense of requiring greater processing power to implement the function.

Turning

Figure 23:
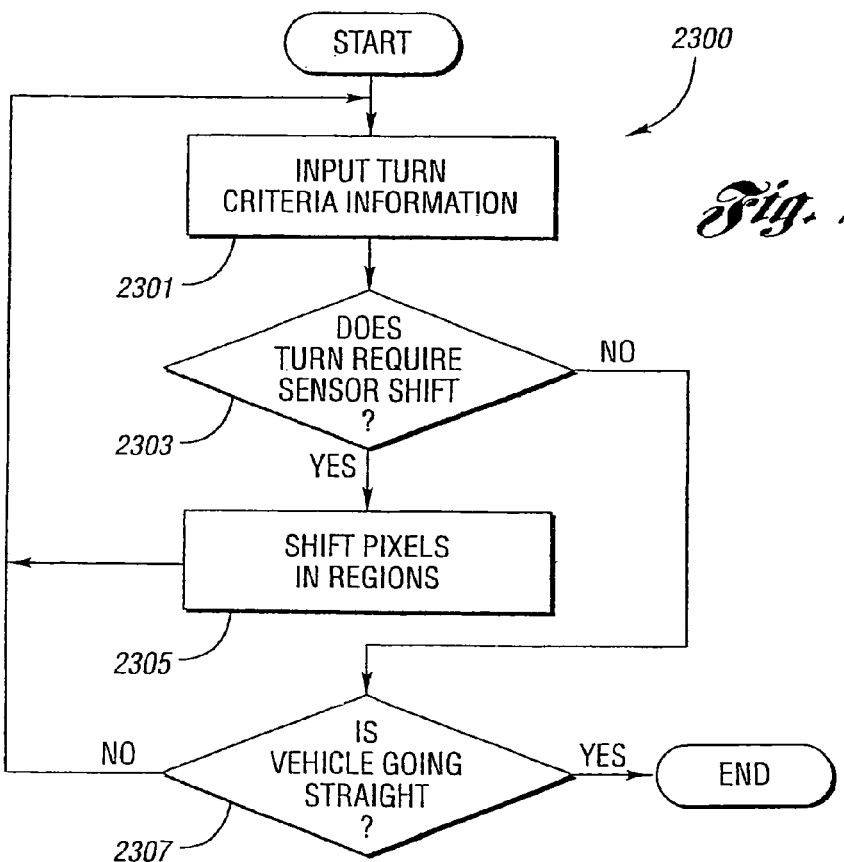
FIG. 23 is a flow chart illustrating operation of the microcontroller to shift the regions in FIG. 22.

As indicated above, it is disadvantageous to have a wide field of view when traveling slowly, such as occurs when traveling on back roads. However, when turning, it is necessary to have a wide field of view so that the image sensor can detect other vehicles that will come in front of the controlled vehicle prior to the controlled vehicle's headlamps striking the other vehicle. It may also be desirable to lower the thresholds for those regions of the sensed image in the direction of the turn. A subroutine that the microcontroller 1105 uses for changing the viewing angle of the image sensor is disclosed in FIG. 23. It is envisioned that the subroutine will be executed each time a turn condition is initiated. For example, the microcontroller may detect any one or more of the following: activation of a vehicle turn signal alone or in combination with braking; a change in vehicle heading detected by the compass; global positioning information; and change in direction of the vehicle steering wheel or front tires. Responsive to such an event, the microcontroller 1105 will input the criteria to be used in making a decision as to whether the field of view needs to be altered. For example, a compass input, an input from a turn signal, global positioning system (GPS) receiver information, wheel turn indication from the vehicle steering system, vehicle speed, gyroscope output, tire speed sensors of an anti-lock brake system (ABS), or a combination of these inputs may be input in step 2301. Additionally, motion analysis (discussed below) may be used to sense turning of the vehicle.

In step 2303, the microcontroller 1105 will determine whether the criteria input in step 2301 indicate that the field of view should be altered. For example, when the vehicle turn signal is ON, and the vehicle is slowing down, the viewing angle sensitivity can be altered in the direction of the turn signal. Alternatively, actuation of the vehicle brake system in combination with a change in vehicle heading greater than a threshold angle of change could trigger a change in the sensor viewing angle. In particular, the compass sensor information can be compared to a threshold change of direction to determine if the controlled vehicle 100 is turning, and responsive thereto the microcontroller 1105 can increase the sensitivity of the image sensor 201 and associated circuitry to light sources in the direction that the vehicle is turning. In order to implement such a turning control, the compass must generate vehicle heading information that the microcontroller can use. Commercially available compasses of the type used in vehicles generate an output, which will operate within 2° to 3° of accuracy as the vehicle turns. As a consequence, the rate at which the vehicle heading is changing and the direction that the vehicle is turning can be determined from the compass output or GPS information. In one embodiment, a compass is integrated into an electrochromic mirror with an automatic headlamp dimmer, and the compass sensor signal is utilized to enhance the performance of the automatic headlamp dimmer.

If it is determined in step 2303 that a shift of the sensitivity pattern is required, the image sensor will shift its sensitivity as indicated in step 2305. For example, the high sensitivity region 1 of the image sensor will generally be in the center of the array such that lights straightforward of the vehicle will have the strongest impact on the light control process. This is particularly advantageous as the brightest light produced by the controlled vehicle illuminates straight out in front of the controlled vehicle. As the controlled vehicle turns, the center axis of each of the regions 1 through 5 will shift as indicated in step 2305. As a consequence, these regions shift in the direction that the vehicle is turning such that they are centered to the right or left instead of being centered on the Y axis (FIG. 22). The sensitivity of the pixels in array 301 will thus shift right as the vehicle turns right, and shift left as the vehicle turns left. The degree that the sensitivity field shifts can vary depending upon the rate of change of the vehicle as well as the speed of the vehicle.

It is envisioned that the sensitivity can be changed using the lookup table. In particular, the lookup table can contain respective integration periods and thresholds according to the location of pixels such that the sensitivity is as shown in FIG. 22 when the vehicle is traveling straight. As the vehicle turns, the addresses associated with columns of pixels may be altered such that the integration periods and thresholds for pixels in the column will shift left or right.

If the change is not sufficient to change the sensitivity, as determined in step 2303, the microcontroller will determine in step 2307 if the vehicle is going straight. The microcontroller will continue to monitor the rate of change of the vehicle heading until the vehicle is heading generally straight, as indicated in step 2307. It will be recognized that this subroutine may be run once as an interrupt routine such that other subroutines may be run in between execution of routine 2300.

It is further envisioned that adjustments may be made in the vertical direction, in addition to the horizontal direction, for example, if a change in vehicle inclination is detected.

Light List History

Information about lights from previous frames can be useful in evaluating current frames. However, there is typically insufficient memory in low cost microcontrollers to store previous frames so as to retain a complete history of each frame's content. To minimize the memory requirements for implementing the system, while retaining some useful historical information, the brightness and location of one or more of the brightest lights detected in one or more previous frames are stored for use when processing a later frame. The entire light list from a previous frame need not be stored, unless significant memory is available. It is also useful to store the brightness and location of only the brightest lights detected in one or more preceding frames. This information can be used to provide fast return to bright. After an oncoming car 105 has passed the controlled vehicle 100, it is useful to return to the high beam state as soon as possible. The night vision of the driver in the controlled vehicle may be temporarily impaired by the lights of the oncoming vehicle. The impact of this loss of night vision may be minimized by providing as much scene illumination as possible, as soon as possible, following passage of a vehicle. The microcontroller 1105 uses the light list history information to implement a fast return-to-bright. In particular, after step 2007 in FIG. 20, the microcontroller 1105 can determine whether the current frame is suddenly clear of bright light sources following a preceding frame that contained a very bright headlamp. In such a case, it is likely that the bright headlamp has just passed the controlled vehicle. If this situation occurs, the normal gradual, delayed fade-in period can be bypassed, or partially bypassed, and the high beams can be incremented by more than one state, such as by eight states (FIG. 19), to return to bright high beams more quickly.

Another scenario where the opposite result is desired occurs when the controlled vehicle comes up behind a preceding vehicle 110. As the controlled vehicle 100 approaches the preceding vehicle 110, the image sensor will detect the preceding vehicle's tail lights and dim the controlled vehicle's high beams responsive thereto. When the controlled vehicle moves to the side to drive around the slower preceding vehicle, the tail lights of the preceding vehicle will move out of the field of view of the image sensor. However, if the controlled vehicle's bright lights are activated, they will shine into the eyes of the driver of the vehicle being passed via the exterior rearview mirror. This is particularly problematic when the controlled vehicle is passing a truck, as it may take a long time to pass the truck. In this situation, the microcontroller can include a decision step following step 2007 to determine whether the previous frame included a tail light and, if so, to set a predetermined delay before the high beam headlamps can be activated. Where the high beam lights are dimmed responsive to preceding tail lights, a long delay will thus be introduced before turning the high beams back ON. For example, the high beams may come on several seconds after the tail lights move out of the scene being imaged. Motion analysis (described below) may be used to determine the rate of overtaking a preceding vehicle or the rate at which a preceding vehicle may drive out of range to thereby enable additional control over the headlamps.

The light history can also be used to select an integration period for the image array sensor pixels. In particular, it is envisioned that the amplifier gain 303 for the pixels can have different gains or different integration intervals to increase the dynamic range of the light sensor. For example, three different gains or integration periods could be supported. A bright light will saturate all but the lowest gain, whereas a dim light such as a tail light cannot be detected at a low gain. The light history can be used to remember that the sensor was washed out even at low gain, and an ultra low sensitivity can be used to detect lights.

Another use for the light list history is determining traffic density. In particular, the traffic density can be ascertained from the time period count between detecting oncoming headlights. Thus, in or near a city where traffic is heavier, the system can respond to that condition by having a relatively long delay period. On the other hand, where traffic is light, such that oncoming traffic is less likely, the delay to turn on the bright lights can be short. It is envisioned that as the traffic increases, the return-to-bright time period will lengthen, whereas as the traffic decreases, the return-to-bright period will shorten. It is further envisioned that a number of different criteria could be used, such as the number of frames since a vehicle was previously detected or the percentage of time that the bright lights were on over a predetermined sampling period. In these ways, the number of objects detected over time can be used in the control of the headlamps, and in particular, to at least partially inhibit turning on the high beams.

It is envisioned that where a vehicle includes an electrochromic mirror glare sensor to detect light from the rear of the vehicle, or any other device having a rearward directed optical sensor, such as a rear vision system, additional information can be accessed which is useful for controlling the return-to-bright interval. In particular, when the bright headlights are dimmed because of tail lights from a preceding vehicle, the headlights can return to bright a predetermined time after the tail lights disappear from in front of the vehicle or when headlights are detected by the rear glare sensor in the rearview mirror, whichever occurs first. Where headlights from a trailing vehicle are detected immediately prior to the disappearance of tail lights from a preceding vehicle, the use of the rearward sensor for detecting a return to bright condition will be precluded. Additional considerations can be used in making the return-to-bright decision. For example, a minimum and a maximum interval can be required before return-to-bright.

It is envisioned that the system will only provide a variable return-to-bright interval under certain conditions, such that the return-to-bright interval will typically be a default time interval. However, a fast return-to-bright interval will occur following a condition where really bright headlights are detected and then disappear, as such bright lights will reduce the driver's night vision. Additionally, a slow return to bright condition would be used following disappearance of a preceding tail light since the driver's vision will not have been impaired and it is desirable to avoid shining the high beams into the eyes of a vehicle being passed.

It is further envisioned that integration periods in the current frame may be adjusted based upon measurements made in a previous frame. In particular, an extremely short integration period can be used for the image sensor 301 where the lowest sensitivity measurements in a previous frame resulted in saturation of the light sensor. To the other extreme, where the previous frame's most sensitive measurements did result in detection of tail lights, a very long integration interval can be used for the image sensor 301 to look for tail lights in the current frame. Thus, where three integration periods are typically used, two additional integration periods can be selectively used when the conditions necessitate either an extremely short or long integration interval.

Another use of the light list history is to distinguish signs and reflectors based on the movement of the objects in the image over time. Over a sequence of frames, reflectors and signs will typically move more rapidly toward a side of the image than will vehicles traveling generally in parallel with the controlled vehicle. Object lists may be created as the images are captured as disclosed above and in commonly assigned U.S. Pat. No. 6,631,316, entitled Image Processing System to Control Vehicle Headlamps or Other Vehicle Equipment, filed on Mar. 5, 2001, by Joseph Stam et al., the entire disclosure of which is incorporated herein by reference. The object lists created may be stored in memory from frame to frame to determine the behavior of a particular object in the image over time. For instance, reflections from signs or other stationary objects can be identified by the motion of this object in subsequent frames. Flashing overhead stop or caution lamps can be identified by their rate of flashing. After each frame is analyzed, the object least created from this frame is kept in memory and light lists from new frames are stored in a different location. The techniques disclosed in U.S. Pat. No. 6,631,316 greatly reduce the amount of memory required for image analysis by not requiring an entire frame to be stored. Therefore, it is practical to store the object lists from several subsequent frames in the amount of memory typically provided in low cost controllers. The number of object lists stored from previous frames depends on the available memory. As few as one previous object list can greatly assist in identifying the motion of an object.

To facilitate tracking of objects over time, additional properties of objects can be added as entries into the object list. For a headlamp control application, an object list entry may contain:

| | |
|---|---|
| X Center | X coordinate of the center of the object |
| Y Center | Y coordinate of the center of the object |
| Total GV | Sum of all the gray scale values of all pixels in the object |
| Size | Total number of pixels in the object |
| Max | The gray scale value of the brightest pixel |
| Redness | Brightness ratio between the clear and the red images for this object |
| PrevFrameIndex | Index of a light in a previous frame which is the same light as this one (if any) |
| Gain | Which image in the cycle; high, medium, or low gain |
| Vector | The direction in which the light is traveling |

The total number of objects that can be stored depends upon the available memory. For example, the list above would require 9 bytes per entry. If, for example, 500 bytes of memory are available, 50 objects could be tracked. The object list memory may be allocated as a contiguous array of object entries. Pointers indicate the start of the object lists for the current frame and previous frames. The newest objects identified replace the oldest objects in the list.

The objects in the new object list are then compared to the objects in the previous object list to determine if any of the new objects are the same as previous objects. A comparison is made by determining if the X and Y center of an object in the current list is within a radius of a certain number of pixels from an object in the previous list. The radius threshold is determined by calculating the maximum amount an object can reasonably move in an image from frame to frame. This number is a function of the resolution of the sensor and may also be a function of the vehicle speed and turn rate. It is possible for two lights in the current list to be daughters of the same light in the previous list. This may occur as a vehicle approaches from a distance and the two headlamps, which before were imaged as one blob, become separated in the image.

Figure 39:
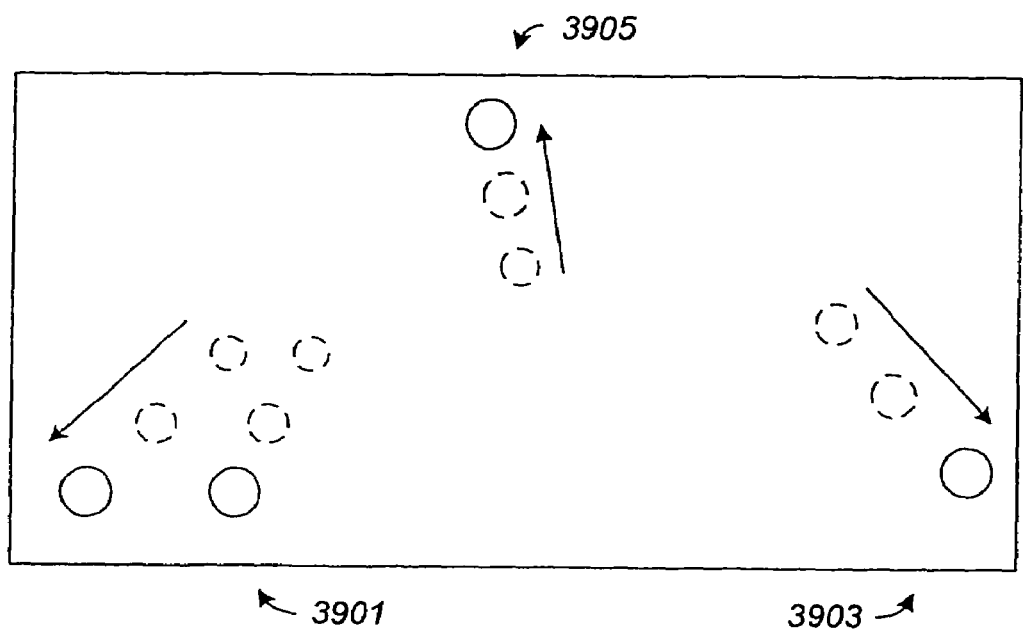
FIG. 39 is a representative pictorial view of an imaged scene taken in several superimposed frames.

Once an object in a previous light list is determined to be the same object as in the current light list, a motion vector can be computed to quantify the rate and direction of motion of the object. Motion detection can be used to distinguish between signs and reflectors, street lights, and vehicles. As illustrated in FIG. 39, the headlights 3901 of oncoming vehicles tend to move down and to the left of the image over a sequence of frames, while signs and reflectors 3903 tend to move down and to the right. Overhead street lights 3905 tend to move upward. While other techniques are disclosed herein for distinguishing between these objects, motion detection can further increase the accuracy at which the system is able to make such distinctions.

Further, such motion detection can be used to distinguish between headlights and tail lights of vehicles and thereby further enhance distinction that is otherwise based on color analysis.

Figure 40:
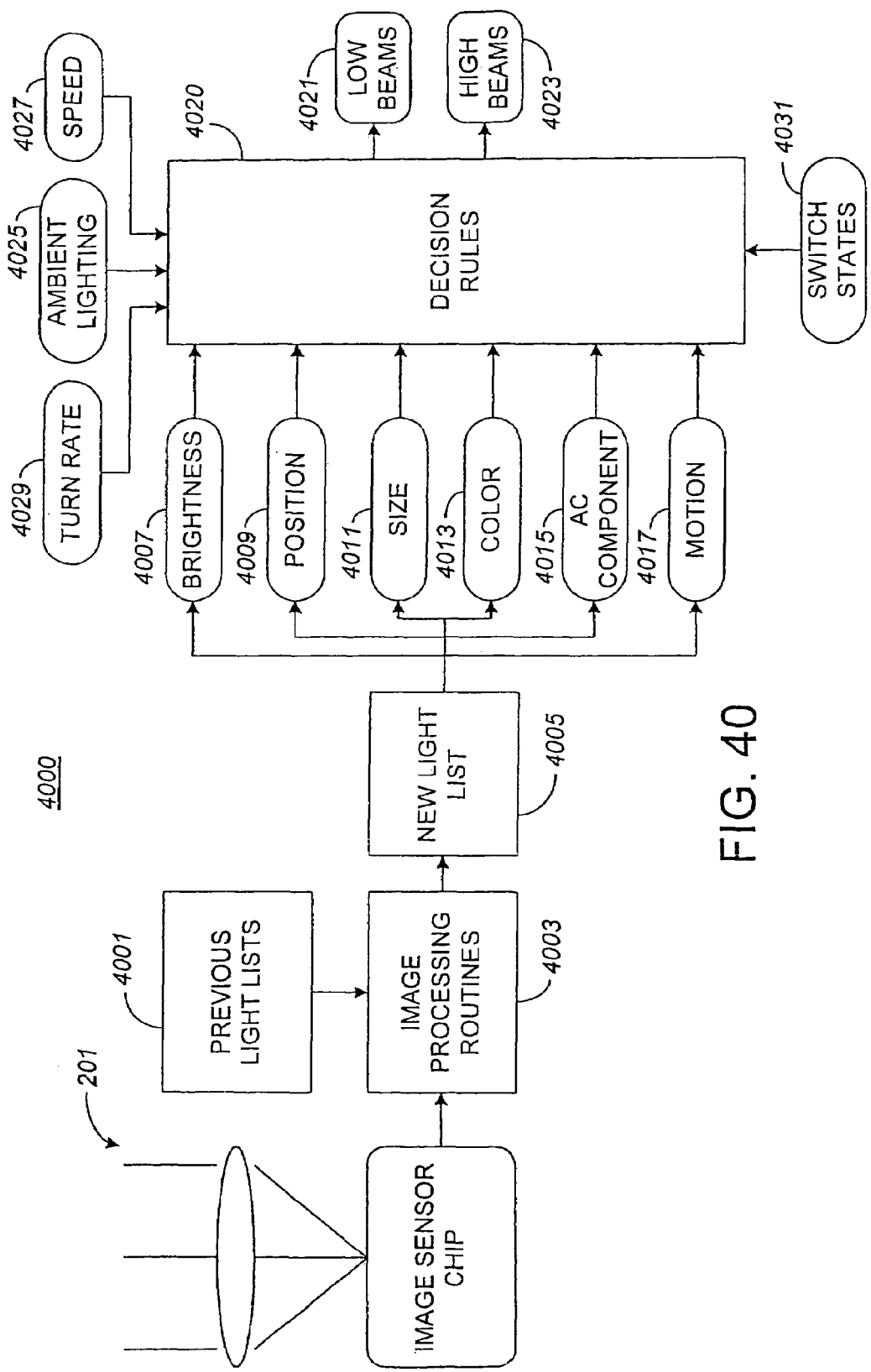
FIG. 40 is a functional block diagram of one embodiment of the present invention.

FIG. 40 shows a functional block diagram of one embodiment of the present invention. As shown, the system 4000 includes an image sensor 201, a lens 202, a previous light list(s) 4001, and an image processing routine (seed fill) 4003, which receives data from image sensor 201 and accesses previous light list(s) 4001 to generate a new light list 4005. New light list 4005 includes information from which various parameters including the brightness 4007, position 4009, size 4011, color 4013, AC component 4015, and motion 4017 of each object may be derived. The system 4000 further includes decision rules 4020 that control the exterior vehicle lights including the low beam headlamps 4021 and the high-beam headlamps 4023 by adjusting their activation state, brightness, aim, and/or focus to vary the illumination pattern produced thereby. Decision rules 4020 may control the exterior lights as a function of any one or combination of parameters 4007-4017 as well as ambient light levels 4025, vehicle turn rate 4027, vehicle speed 4029, and the state of user actuated switches 4031 (as discussed further below). Decision rules 4020 may be implemented in a logic circuit (i.e., microcomputer), a fuzzy logic circuit, or a neural network.

An example of how decision rules 4020 may use more than one parameter to control the exterior lights is to reduce the perceived brightness or otherwise modify the glare area of the present beam illumination pattern when a nearby headlamp is detected. Decision rules 4020 may determine that a nearby headlamp is present when the detected headlamp has high brightness and a relatively high amount of motion. A distant headlamp, on the other hand, would have low brightness and a relatively low amount of motion. A sign would have a low level of brightness, but have a relatively high amount of motion.

Automatic Aim Calibration

Variations in the orientation of the image array sensor relative to the windshield angle may result in variations in aim of the sensor, which may negatively impact the performance of the dimmer. These variations can be calibrated out over time using a maximum bound placed on the expected variation in mounting. In general, on straight roads, distant oncoming headlamps will be coming from directly ahead of the optical sensor system 102. The calibration system uses faint headlamps detected near the center of the image, and preferably only those within a center window corresponding to the expected mounting variations. Such headlamps meeting certain criteria will have their position averaged with other faint headlamps meeting the same criteria. Over time, this average of these lights should correspond to the center of the field of view. This average value can be used to offset the image window relative to the X and Y-axis in FIG. 22.

More particularly, in order to detect a flat straight road, from which a misalignment of the optical sensor system can be detected, a variety of different orientation inputs can be used. The speed of the vehicle may be required to remain in a certain range between 35 to 50 mph. The vehicle can be determined to be traveling straight using the compass, GPS, or monitoring the operation of the vehicle steering system. If the heading changes during the test, the measurement will be considered to be in error. If the vehicle has equipment for providing an elevation measurement, any changes in the vehicle's elevation during the calibration process will result in an error. The elevation measurement may thus be used in determining whether to adjust the field of view.

A distant vehicle is initially detected by sensing white light near the center of the image, which is faint at the highest sensitivity (longest integration period) of the image sensor. As this light gets brighter, the system monitors the orientation inputs to detect whether the road continues to be flat and straight. If it remains flat and straight for a period of time which is at least twice the time period required for the vehicles 100, 105 to pass, the measurement will be valid. The center point detected initially will then be averaged with previous valid measurements, and the average measurement will be considered to be the center of the image. This will be the average X and Y coordinates, which together will mark the center of the image sensor. This location can be saved in EEPROM or flash ROM.

Another method of aiming calibration is to take a very high gain image and look for the reflection of the road. The average point where this reflection occurs can be used to calibrate the aim.

Liquid Crystal Filter

An alternative optical system may include a liquid crystal filter 2405 that can be used to selectively provide both a red and a blue filter, whereby red and blue images may be viewed by an image sensor 2401 through a single lens structure 2403. In such a structure, the image sensor 2401 need only have one imaging area (e.g., array area 702 instead of array areas 702 and 703 as required with two lenses). The filter 2405 is implemented using a liquid crystal colored light switch 2503 (FIG. 25) electrically connected to microcontroller 1105 through conductors 2413 and 2411. The filter includes a neutral polarizer 2501, a liquid crystal shutter 2503, a red polarizer 2505, and a blue polarizer 2507. The neutral polarizer 2501 and red polarizer 2505 are oriented with their polarizing axis aligned in one direction and the blue polarizer 2507 is oriented with its polarizing axis oriented orthogonally to the red and neutral polarizer. The liquid crystal shutter 2503 is implemented using a twisted neumatic (TN) liquid crystal shutter selectively energized under the control of microcontroller 1105. In particular, when the shutter is not energized, the liquid crystal device transmits the red light. When the liquid crystal is energized, the liquid crystal device transmits blue light.

It is thus possible to measure the relative intensities of two colors of light using a single photo sensor or image area. In the unenergized state, all visible light is polarized in the horizontal direction by the neutral polarizer, rotated 90° by the unenergized TN liquid crystal cell to the vertical direction, and then all but the red light will be absorbed by the horizontal red polarizer. The red light will then pass through the vertical blue polarizer. In the energized state, all visible light will be polarized in the horizontal direction by the horizontal neutral polarizer and not rotated by the energized TN liquid crystal cell, all visible light will be transmitted by the horizontal red polarizer, and all but blue light will be absorbed by the vertical blue polarizer. The liquid crystal device can be used as a high-speed light switch to alternate between transmission of blue light and red light. The relative intensities of the red and blue light components of an object or light source can then be determined. Alternatively, a green polarizer can be substituted for either the red or blue polarizer to switch between transmission of blue and green or red and green lights, respectively. Furthermore, a clear polarizer can be substituted for the blue polarizer to switch between red and clear.

Windshield Wiper

To improve dimmer performance when it is raining, it is useful to synchronize the acquisition of images with the windshield wipers. For example, a signal can be provided from the wiper motors to indicate the position of the wipers. Immediately after the wiper passes over the sensor, an image can be taken to look for cars. Most importantly, it is necessary to avoid taking images while the wiper is over the image sensor 201, 201b, or 301.

Where the controlled vehicle 100 includes a moisture sensor, the moisture sensor can monitor the windshield wiper. A moisture sensor providing such information is disclosed in U.S. Pat. No. 5,923,027, entitled MOISTURE SENSOR AND WINDSHIELD FOG DETECTOR, issued to Joseph Stam et al. on Jul. 13, 1999, the disclosure of which is incorporated herein by reference.

Information regarding the on/off status of the windshield wipers may also be used to control the vehicle headlamps. When the headlamp controller determines that the windshield wipers have been turned on, the headlamp controller may turn on the low beam headlamps of the vehicle assuming they are not already on. In addition, the headlamp controller may disable the headlamps from operation in a high beam state when the vehicle windshield wipers are activated. This may be accomplished by simply maintaining the headlamps in the low beam state when in an automatic control state or otherwise deactivating the automatic control state such that the high beams may not automatically be turned on while the wipers are activated. Additionally, the headlamp controller could disable any manual activation of the high beams so long as the windshield wipers are turned on. Also, foul weather lights, particularly the fog lights, may be automatically activated when the wipers are on.

The headlamp controller may receive a signal over the vehicle bus from the windshield wiper controller indicating that the windshield wipers are activated. Alternatively, the headlamp controller may determine that the windshield wipers are activated upon detecting a wiper within the scene imaged by the imaging system. As yet another alternative, the headlamp controller may receive a signal from a rain sensor that is used to control the windshield wipers indicating that a control signal has been transmitted to activate the windshield wipers.

The image from image sensor 201 (FIG. 11) may be processed and used to control wipers and/or a defogger 1102b. Alternatively, a second image sensor 201b may be provided to sense an image of the windshield for use in controlling wipers and/or a defogger 1102b. Either image sensor 201 or 201b or both may be used to capture images or otherwise acquire data for use in an active cruise control system.

The headlamp and/or rain control 1015 may share components or access circuitry that controls the reflectivity of electrochromic element 1102. When rain is sensed, microcontroller 1105 may further control the vehicle windows by causing them to close.

Deceleration

In addition to varying the image sensor operation depending upon the vehicle speed, other speed criteria can be used to control the operation of the vehicle headlamps. Turning on the high beams may be inhibited when the vehicle is decelerating, when the brakes are actuated, or when the vehicle is traveling slowly. This prevents high beams from coming on when coasting to a stop or approaching an intersection. Deceleration can be detected from the speed input to the microcontroller 1105 (FIG. 11).

Bad Pixel Calibration

An image sensor may contain one or more bad pixels. These bad pixels may manifest themselves as extremely sensitive pixels, which may cause "white spots" in the image. Such "white spots" will cause false light detection in the image if the sensor is not calibrated to remove them from calculations. During production tests, the location of these white spots can be measured and stored in a programmable memory associated with microcontroller 1105. To compensate for such bad pixels during normal operation of the image array sensor, after an image is acquired, the pixel value at the white-spot location may be replaced with the average value of its neighboring pixels.

It is possible that a white spot may form during use of the image sensor, such that it is not detected during production tests. Such a situation will cause the device to be inoperable. To avoid this problem, it is desirable to calibrate the white spot out of the image after recognizing the bad pixel. In order to detect the white spot, it is necessary to detect that the pixel remains "lit-up" in several images, and preferably over an extended period of time. A bad pixel will stand out if it is repeatedly lit-up when neighboring pixels are dark. When such a pixel is detected, it can be added to the list of bad pixels.

It is envisioned that bad pixels can be periodically tested to determine if their performance has improved. This can be accomplished by monitoring a sequence of images to determine whether the center pixel is dark while the adjoining pixels are not dark.

Picket Fence

In controlling the vehicle headlamps, it is desirable to avoid a condition where the headlamp high beams flash ON and OFF at a relatively rapid rate. This is particularly important if non-variable two-state headlamps are used. For example, a sign along the road can cause flashing of the headlights between bright and normal levels. This occurs when reflections of the bright high beams from a sign are bright enough to cause dimming of the high beams and reflections of headlight low beams are low enough that the bright high beams are turned ON. The condition can be avoided by having the system look at the object that caused the high beams to turn OFF. When this condition occurs, the light level at that position is ignored while the pixels around the object are not ignored for a predetermined number of cycles, such as ten cycles. The length of time that the object is ignored can be variable as a function of the vehicle's speed. The higher the vehicle's speed, the shorter the period that the object will be ignored. During the time period, the lights will be controlled using pixels other than those associated with the object being ignored.

A reflector can be distinguished from an active source of light by flashing the vehicle headlights off. The time period that the headlights are off is so short that the image sensor can sense the loss of light even though the human eye will not perceive, or barely perceive, that the lights were off. A light emitting diode headlamp described hereinbelow can be turned OFF and ON very rapidly, such that it will be off for such a short period of time. In operation, the microcontroller 1105 controls the headlamp high or low beams to turn OFF, and controls the image sensor to image the scene during that brief time period that the headlamps are off. The off time period may, for example, be 10 ms.

Fog Detector

It is desirable for the vehicle to reliably detect a foggy condition, and in response thereto, to automatically turn ON or OFF front and rear fog lamps. Effective fog detectors have not been available heretofore. Fog may be detected by using the image sensor and optical system for the headlight ON/OFF and headlight dimmer control. Fog can be detected by a reduced scene contrast along with scene ambient light level determinations. The ambient light can be determined from the mean gray scale value of the pixels imaging the forward scene or by a separate ambient light sensor, such as the ambient light sensor used for the electrochromic mirror. It is envisioned that the mean can be a clipped mean value. The variance of the gray scale values of the pixels provides a measure of the contrast in the image. Alternatively, the variance can be determined from the standard deviation of the pixels, and in particular, when the standard deviation is less than a standard deviation threshold level, the presence of fog is identified responsive to which the fog lights can be turned ON. Alternatively, the individual differences between the average pixel level and each individual pixel level can be added for the entire image sensor, and when this total variance exceeds a variance threshold level, the presence of fog is detected. Either of these examples of fog criteria can be used as a measure of contrast.

Several additional factors may also be considered. The contrast value may be an average contrast value over several images. The contrast may be determined in row-wise fashion to determine the level of fog. Various regions of the scene may be considered independently. If two color lenses are present as in the headlamp dimmer, color information may be used. The actual values of the brightness/contrast ratios and the proper image sensor exposure times should be determined experimentally. The device can be set to only operate between a predetermined range of brightness levels, such that if the ambient level is too high or too low, the fog detector will not operate, and manual override will be required. The ambient light conditions for fog may, for example, be between 1 and 1000 lux. Both the image sensor and the ambient light sensor can be used to detect fog. If the ambient light level detected by the ambient light sensor is within the appropriate range, an image of the forward scene is acquired with a sensitivity set to the average gray scale value of the pixels (e.g., 128 lux). If the contrast at a given brightness level is below a predetermined threshold level, it is determined that fog is present.

Snow and Fog Detector

It is also desirable for a vehicle to detect when it is snowing. Typically, in heavy snow conditions, it is not desirable to activate the high beams. Further, even if it is not snowing heavily, the snow may reflect the light from the high beams in such a way that the headlamp controller mistakenly perceives an oncoming vehicle based upon the reflected light from the controlled vehicle's own headlamps.

To detect snowfall, it is preferable to provide a sensing system that senses light levels forward and above the vehicle. To obtain the light level above the vehicle, a separate light sensor may be positioned to sense light from the sky above the vehicle. Such a sky sensor may include a single pixel sensor positioned at a 45° angle relative to the sensor used to sense light forward of the vehicle. The sensor used to sense light forward of the vehicle may be a single pixel sensor or the image array sensor used to image the scene forward of the vehicle for headlamp control. The values sensed by the forward and sky sensor may be averaged over a period of time. Theses sensors may be constructed in accordance with the teachings of U.S. patent application Ser. No. 09/307,191, entitled PHOTODIODE LIGHT SENSOR, filed on May 7, 1999 by Robert H. Nixon et al., now U.S. Pat. No. 6,359,274, and U.S. patent application Ser. No. 09/491,192, entitled VEHICLE EQUIPMENT CONTROL WITH SEMICONDUCTOR LIGHT SENSORS, filed on Jan. 25, 2000, by Jon H. Bechtel et al., now U.S. Pat. No. 6,379,013, the entire disclosures of which are incorporated herein by reference.

The controller is coupled to receive the output of both the forward sensor and the sky sensor and compares the relative brightness in front of the vehicle with that above the vehicle. In some conditions, it may be desirable to compare the relative brightness as the brightness of the vehicle's headlights increases. The headlamp controller determines that it is snowing or foggy when a ratio of the relative brightness forward of the vehicle to that above the vehicle reaches a threshold as the brightness of the vehicle's headlights increases due to the reflection of the headlamp light off the snow in the forward scene.

When the controller determines that snow is falling, it may activate the low beam headlamps if they are not already activated and can disable the high beams from being activated either through automatic control or manually. Further, automatic control may be disabled and foul weather lights may be activated. Additionally, the brightness of the vehicle's tail lights and/or brake lights may be increased to increase the visibility of the vehicle to other rearward vehicles.

The headlamp controller may also infer that the conditions outside of the vehicle are snowy or foggy when the driver turns the front windshield defroster fan to full speed. In such an event, the controller may also disable the headlamps from operation in a high beam state and may disable further automatic control.

The techniques described in this section are particularly well-suited for detecting fog at night, while the techniques described in the preceding section are better suited for detecting fog during daytime.

Daytime Running Light and Tail Light Control

As discussed above, daytime running lights (DRLs) are provided on some vehicles. As also discussed above, DRLs are provided by operating the high beams at a reduced intensity by changing the PWM drive signal delivered to the high beams during daylight conditions. For this purpose, an ambient light sensor 1107 can be used to determine daylight conditions and switch the headlamps to DRL operation when daylight is detected.

The controller may also utilize the sensed ambient light level to turn on the low beams when it is sufficiently dark. Additionally, the DRLs may be controlled to vary their intensity during daylight conditions. Ambient light levels may vary considerably from the brightest of daylight conditions to the conditions existing just prior to activation of the low beam headlamps at dusk. There have been complaints about the brightness of DRLs when the ambient light levels are relatively dark. In the brightest conditions, however, the DRLs are less bothersome because they appear to be less bright relative to the ambient light levels surrounding the vehicle. Accordingly, the headlamp control circuit may be configured to vary the brightness of the DRLs in response to the ambient light levels sensed by an ambient light sensor. Specifically, the control circuit may increase the brightness of the DRLs in response to increasing ambient brightness.

A similar problem exists with respect to a vehicle's tail lights and brake lights. Tail lights and brake lights preferably have brightness levels that are sufficient to allow drivers to the rear of the controlled vehicle to easily determine whether the tail lights and brake lights are on or off regardless of the ambient light level. On the other hand, at nighttime, tail lights and brake lights can be too bright so as to adversely affect the night vision of drivers to the rear of the vehicle. Accordingly, it is preferable to decrease the intensity of tail lights and brake lights with decreasing ambient light levels. Such intensity variation may be continuous or accomplished in discrete steps. Additionally, it may be desirable to increase the intensity of the tail lights and/or brake lights when foul weather, such as rain, fog, or snow, is detected.

User Control and Feedback

Figure 34:
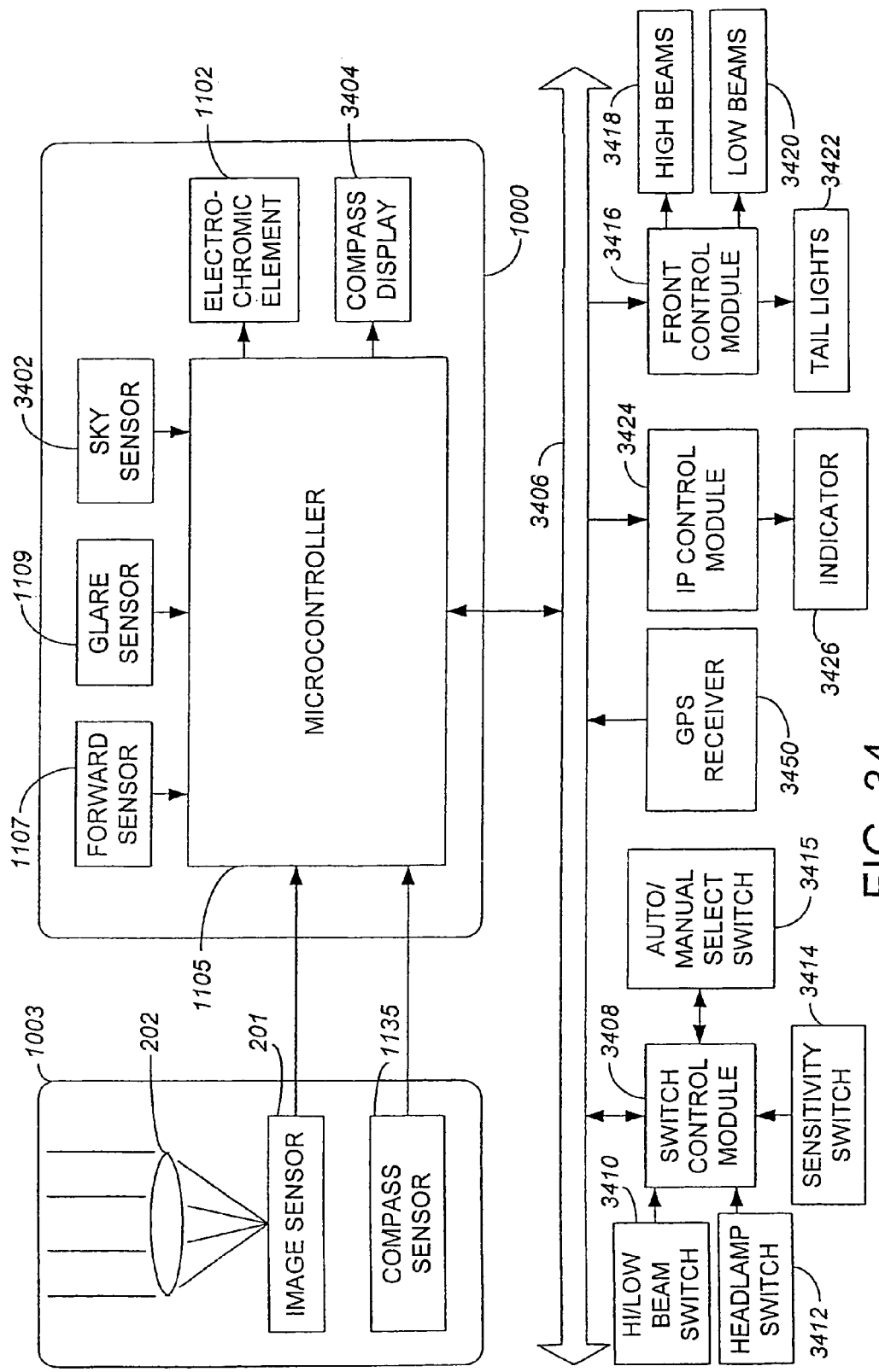
FIG. 34 is a circuit schematic illustrating an alternative circuit for an optical sensor system and an electrochromic mirror.

An alternative embodiment of the present invention is shown in FIG. 34. The same reference numerals are used to illustrate common elements as in the embodiment shown in FIG. 11. Like the embodiment shown in FIG. 11, this alternative embodiment shown in FIG. 34 includes an image sensor chip 201 and a lens 202 preferably mounted in a mirror mount 1003. A compass sensor 1135 is also preferably mounted in mirror mount 1003. The compass sensor may alternatively be mounted in mirror body 1000. A microcontroller 1105 is preferably mounted in mirror body 1000 and is coupled to image sensor chip 201 and compass sensor 1135. Mirror body 1000 may further include an electrochromic element 1102 and a compass display 3404, both of which may be controlled by microcontroller 1105.

A forward-facing ambient light sensor 1107 and a rearward-facing glare sensor 1109 are also preferably provided in mirror body 1000. Additionally, a sky sensor 3402 may be provided in mirror housing 1000, which is inclined at an angle to view the scene of the sky above and slightly in front of the vehicle. Such a sky sensor 3402 may be used for detecting snow or other ambient light conditions. Sky sensor 3402 may be a single pixel sensor or may optionally be incorporated in the mirror mount as an optical element that images a view of the sky onto a designated area of the image sensor chip. Such a structure is disclosed in commonly assigned U.S. Pat. No. 6,130,421. The disclosure of the above-mentioned patent is incorporated herein by reference.

Microcontroller 1105 is coupled to the vehicle bus 3406 for exchange of various information and control signals. As indicated, a switch control module 3408 may be coupled to the bus for providing the states of various switches that may be manipulated by the user to microcontroller 1105. For example, a high/low beam switch 3410 may be coupled to switch control module 3408, as may be a headlamp on/off switch 3412. Such switches are common in vehicles with the high/low beam switch typically being mounted to the steering wheel column and the headlamp on/off switch being positioned on the vehicle instrument panel.

The present invention also provides for a user sensitivity selection switch 3414 that is coupled to switch control module 3408 to allow a user to adjust the sensitivity of the headlamp control system. Microcontroller 1105 may respond to changes in the sensitivity setting set by the user by adjusting the thresholds that the microcontroller utilizes to compare to detected light sources to determine when to turn off or on or fade in or out the high beams. Alternatively, microcontroller 1105 may utilize the sensitivity setting to change the rate at which it changes headlamp brightness states or may change the duty cycles associated with those states. Further still, microcontroller 1105 may adjust the sensitivity by changing the integration time of some or all of the pixels in the CMOS image array sensor. Also, the sensitivity to light in various portions of the scene in front of the vehicle may be adjusted by varying the thresholds/integration times for pixels in the image array sensor that image the peripheral regions of the forward scene. Other adjustments may also be programmed into microcontroller 1105 to determine how it should respond to adjustment of a user-sensitivity switch 3414.

As will be explained further below, the present invention also provides for the inclusion of an automatic headlamp control on/off switch 3415 by which a user may disable the automatic control of the vehicle headlamps.

Also coupled to vehicle bus 3406 is a lighting control module (or body controller) 3416, which controls the state and possibly the perceived brightness of the low beam headlamps 3418, the high beam headlamps 3420, and the brightness of the tail lights 3422. Front control module 3416 may also be used to control the on/off status or perceived brightness of fog lamps. As mentioned above, the brightness of daytime running lights may be adjusted by controlling the perceived brightness of high beams 3420.

Figure 35:
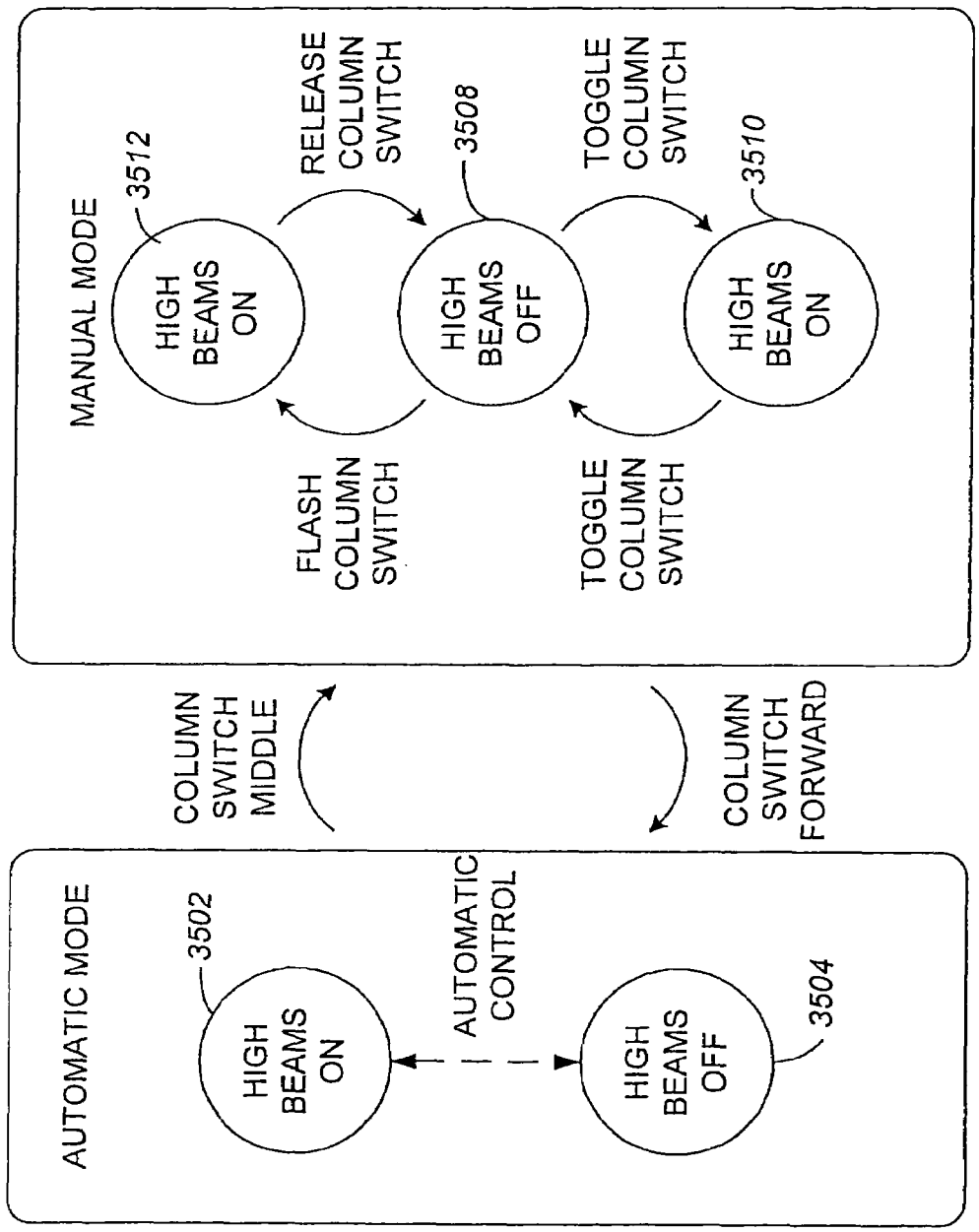
FIG. 35 is a state diagram illustrating a first control scheme for manually or automatically controlling the vehicle headlamps in response to activation of various manual switches.

FIG. 35 shows a state diagram for operation of microcontroller 1105 in response to various states of the switches coupled to switch control module 3408. As illustrated, the microcontroller 1105 may operate in an automatic mode or a manual mode in response to the activation of the automatic control on/off switch 3415. Such a switch may be provided on the steering wheel column and integrated into the same column switch that is utilized to manually activate the high beams. For example, if such a column switch is in a middle position, microcontroller 1105 will operate in a manual mode. If, for example, this column switch is moved to a forward position, microcontroller 1105 will respond by entering an automatic control mode. As discussed above, during an automatic control mode, microcontroller 1105 varies the headlamp state between a high beam on state 3502 and a high beam off state 3504 based upon the light sources detected by the image sensor or upon other events. In the manual mode, however, the headlamps are operated manually in a conventional manner. For example, the high beams may initially be in an off state 3508 and be turned on by manual toggling of the column switch or other mechanism such that the high beams are in an on state (3510). Toggling a switch back would turn the high beams off. If the column switch includes a flash-to-pass feature, flashing the column switch would temporarily turn the high beams (on state 3512) whereas when the user releases the column switch, the high beams are turned off and returned to state 3508.

Figure 36:
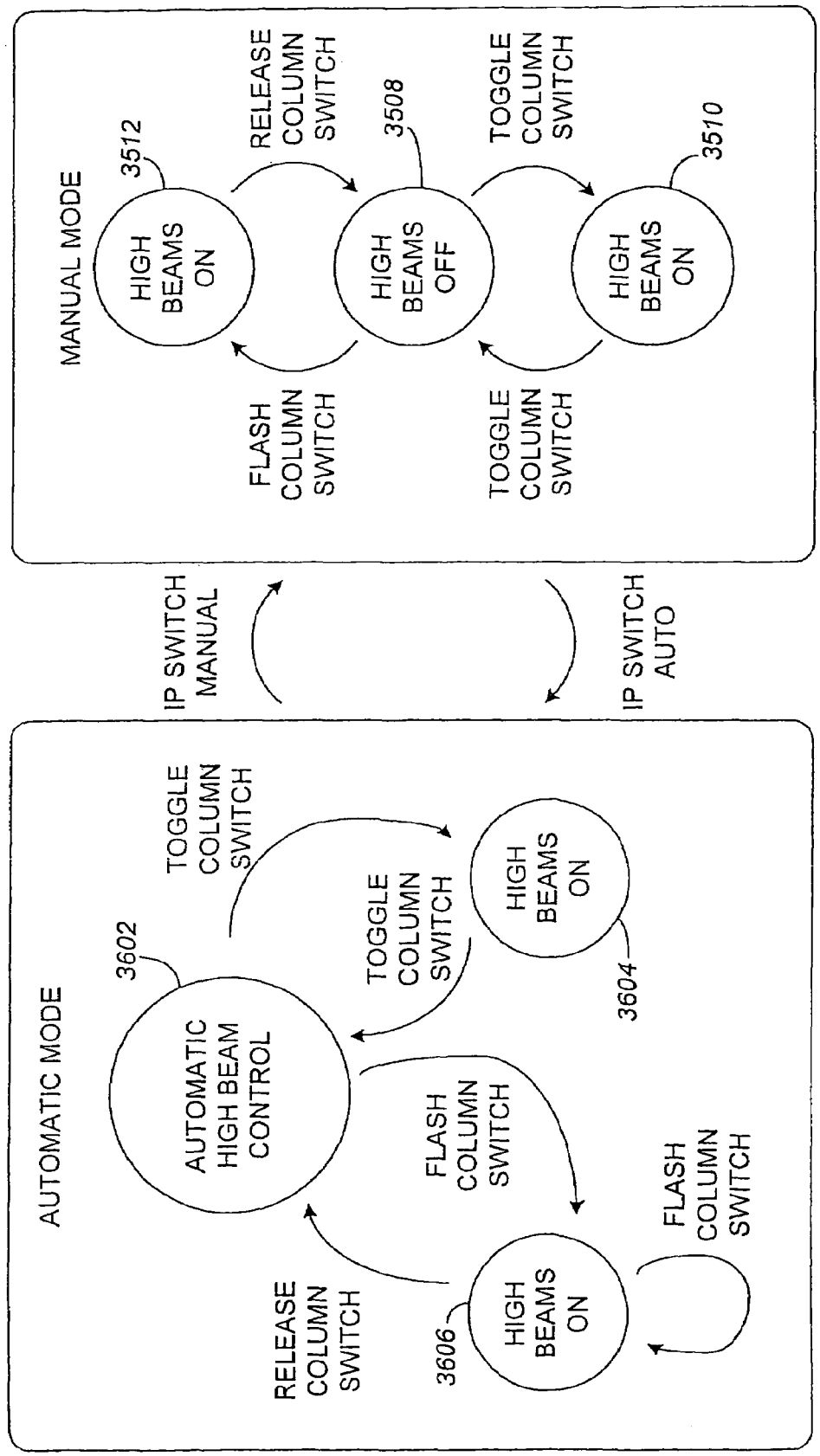
FIG. 36 is a state diagram illustrating a second control scheme for manually or automatically controlling the vehicle headlamps in response to activation of various manual switches.

FIG. 36 shows a state diagram showing a more complex control scheme. As with the control scheme shown in FIG. 35, microcontroller 1105 may operate in either an automatic mode or a manual mode. Transition between the automatic or manual modes is generally manually selected using a switch 3415 that may, for example, be provided on the steering wheel column or on the vehicle instrument panel. In the manual mode, microcontroller 1105 operates in the same manner as described above with respect to FIG. 35. In the automatic mode, however, microcontroller 1105 initially operates in an automatic high beam control state 3602 whereby the high beams are automatically controlled to transition between on and off states, as well as states of intermediate brightness if the headlamps are capable of this feature. When operating in the automatic mode in accordance with the scheme shown in FIG. 36, when a user toggles the column switch 3410 for manually turning on the high beams, microcontroller 1105 turns on the high beams in a manual override state 3604 until such time that the user again toggles the column switch, at which point microcontroller 1105 returns to the automatic high beam control state 3602. In the event that the user manually activates the flash-to-pass column switch, microcontroller 1105 enters the high beam on flash-to-pass state 3606 and remains in this state so long as the flash column switch remains in the flash-to-pass position. Once the user releases the flash-to-pass column switch, microcontroller 1105 returns to the automatic high beam control state 3602.

While the high beams may be activated in their brightest state during the flash-to-pass state, it will be appreciated that, according to one embodiment of the present invention, the brightness of the headlamps during a flash-to-pass state may be less than full brightness. Specifically, the brightness of the headlamps during a flash-to-pass state may be varied as a function of the sensed ambient light level and also as a function of the current brightness level of the headlamps. In this manner, any time the flash-to-pass switch is actuated, the perceived brightness of the headlamps will be increased by a predetermined increment above that of their current brightness level so as to provide a perceivable increase in the brightness of the headlamps to any preceding vehicles, but without causing a sudden and excessive glare in the eyes of the drivers of such vehicles.

Figure 37:
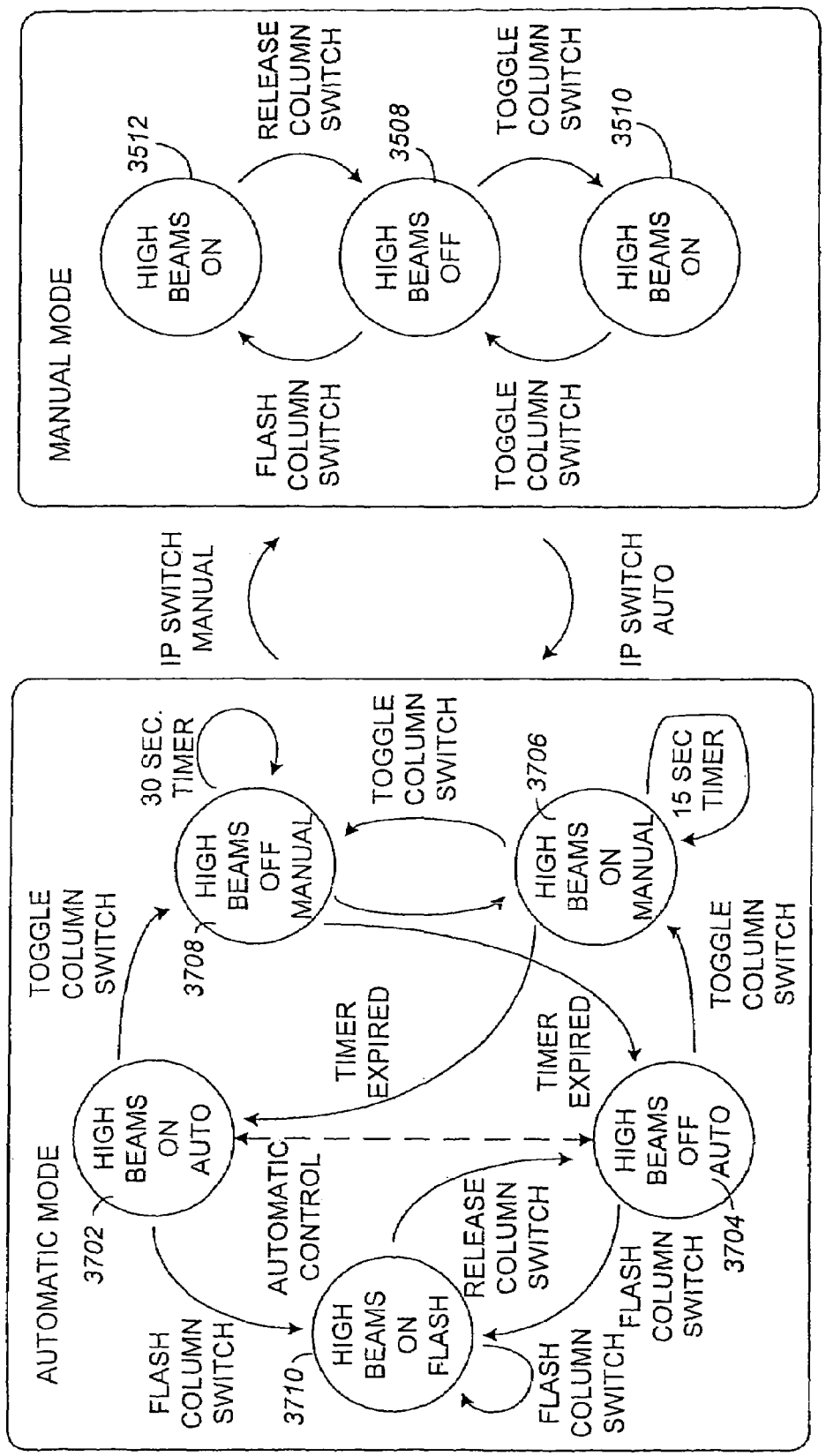
FIG. 37 is a state diagram illustrating a third control scheme for manually or automatically controlling the vehicle headlamps in response to activation of various manual switches.

FIG. 37 shows yet another state diagram for a more complex control scheme. Again, microcontroller 1105 operates in either an automatic or a manual mode. When in the manual mode, microcontroller 1105 allows the headlamps to be controlled in the same manner as discussed above with respect to FIGS. 35 and 36. Again, operation in either the automatic or the manual mode may be manually selected by the user by manipulation of a switch 3415.

When in the automatic mode, microcontroller 1105 operates in an automatic high beam control state whereby the control state varies between a high beam on state 3702 and a high beam off state 3704. Microcontroller 1105 moves between states 3702 and 3704 in the manner discussed above responsive to the light sources detected by the image sensor. When microcontroller 1105 is operating in an automatic mode with the high beams on (state 3702) and then the column switch 3410 is toggled, microcontroller 1105 will interpret the toggling of the column switch as a request to turn the high beams off. Microcontroller 1105 thus enters a high beam off manual override state 3708. Microcontroller 1105 will maintain the high beams in their off manual override state 3708 for a predetermined time period, such as 30 seconds or until the column switch is again toggled. When the time period expires, microcontroller 1105 will initially maintain the high beams in the off state, but will move to state 3704 whereby the high beams may be automatically turned back on based upon the automatic headlamp control algorithm that is responsive to the light sources detected by the image sensor. If microcontroller 1105 is in the high beam off manual override state 3708 and the column switch is again toggled, microcontroller 1105 will interpret this action as a request by the user to move to a high beam on manual override state 3706. Microcontroller 1105 will maintain this manual override high beam on state 3706 for a predetermined time period, such as 15 seconds, or until the column switch is again toggled. If the column switch is again toggled, microcontroller 1105 will move to the high beam off manual override state 3708. Microcontroller 1105 will leave state 3076 and will enter state 3702 when the timer expires so as to initially maintain the high beams in their on status, but allow for the automatic control algorithm to dim or turn off the headlamps in response to light sources detected by the image sensor.

If microcontroller 1105 is operating in the automatic control state with the high beams off (state 3704) and the column switch is toggled, microcontroller 1105 will interpret this as a command to enter the high beam on override state 3706. Microcontroller 1105 will then leave the high beam on manual override state 3706 based on the criteria discussed above.

If microcontroller 1105 is operating in the automatic control state with the high beams off (state 3704) and the user manually activates the flash-to-pass column switch, microcontroller 1105 will move to state 3710 by which the high beams are turned on in a flash-to-pass state. The high beams will remain on so long as the user holds the column switch in the flash-to-pass position. Once the user releases the flash-to-pass column switch, microcontroller 1105 will return to the automatic mode with the high beams off (state 3704). If the microcontroller is in the automatic control state with the high beams already on (state 3702), at such time that the user activates the flash-to-pass column switch, the high beams will remain on in state 3710 so long as the user holds the column switch in the flash-to-pass position. However, once the user releases the column switch, microcontroller 1105 returns to state 3704 rather than state 3702 so as to turn the high beams off. If conditions warrant, headlamp controller 1105 will turn the high beams back on under automatic control.

Other features that may be implemented would allow the automatic headlamp controller to gradually fade the brightness of the headlamps at such time that the headlamp switch 3412 is turned to an off position or if the vehicle ignition is turned off. Alternatively, the headlamp controller may fade the headlamps a designated time after it is detected that all occupants (or just the driver) have exited the vehicle. Such fading provides the benefits of illuminating the area in which the vehicle occupants will exit the vehicle. By fading the lights in this manner, rather than leaving the lights on in their full brightness states for a fixed time period, it is less likely an observer would suggest to the driver or other occupants that they had left their vehicle lights on since that observer would be able to see the fading of the headlamps during such time period.

Figure 38:
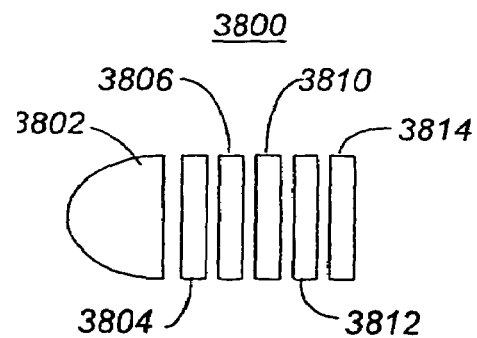
FIG. 38 illustrates an exemplary indicator for use with the headlamp control system of the present invention.

Referring back to FIG. 34, an instrument control panel module 3424 may be coupled to vehicle bus 3402. An indicator 3426 may be coupled to instrument panel control module 3424 so as to receive control signals from microcontroller 1105 over vehicle bus 3406. Typically, vehicles have had a single indicator, often a blue light, which is activated when the vehicle's high beams are in an on state. Such single indicator, however, does not provide a user with any feedback as to the relative brightness of the high beams when they are controlled automatically by a headlamp controller to have various intermediate brightness levels. To provide such feedback, the system may be configured such that indicator 3426 has a brightness that varies in proportion to the brightness level of the headlamps. Such variance may be along a continuum or may change in noticeable incremental steps. The brightness of indicator 3426 may also be doubled or increased significantly when the headlamps are in a high beam state as a result of manual activation of the high beams so as to provide the user with a clear indication that the system has appropriately responded to such manual activation. Another alternative indication scheme is to have the indicator change color as a function of the brightness of the headlamps. Yet another indication scheme is to configure indicator 3426 to include a scale that indicates a relative brightness of the headlamps. Such a scale may be provided as a multi-segmented display, such as the exemplary display shown in FIG. 38 in which the segments that are illuminated correspond to the relative brightness of the headlamps. Thus, for example, headlamp icon segment 3802 may be illuminated at all times that the headlamps are on and the various segments 3804-3812 are independently activated with the increasing brightness level of the headlamps. In addition, the color of the indicator shown in FIG. 38 may change to indicate manual activation or operation in either the manual or automatic modes or to indicate operation of the low beams, DRLs, fog lamps, etc. Another way to indicate to the driver that the headlamp controller is operating in an automatic control mode is to provide an indicator light in the auto/manual select switch 3415 such that when the user depresses the auto/manual select switch 3415, a light within or near by the switch is activated. Other indication techniques known in the art may similarly be utilized.

As discussed above, the vehicle headlamps may be operated in a super-high beam state in accordance with the laws of the various countries in which the vehicle may be used. Such super-high beams have been proposed to have an intensity of greater than 75,000 cd at 0° vertical and horizontal. Such super-high beams have been approved for use in Europe and found to be beneficial. In the event the vehicle is equipped with this capability and the appropriate headlights, the control circuit may control the super-high beams to be activated when it detects that the vehicle is above a predetermined speed level. In this manner, the super-high beams can most typically only be activated when the vehicle is operated on an expressway.

Additionally, if such super-high beams are provided, the system may be programmed to have increased sensitivity to light sources detected forward of the vehicle. The super-high beams may also be faded as light sources are detected as coming closer to the vehicle.

As shown in FIG. 34, microcontroller 1105 may be coupled to a GPS receiver 3450 via vehicle bus 3406. Microcontroller 1105 may receive information from GPS receiver 3450 that is indicative of the location and possibly the direction of travel of the vehicle. GPS receiver 3450 may be part of a navigation system or may be part of any other system in the vehicle. The GPS receiver and antenna may be mounted to the rearview mirror assembly as disclosed in commonly assigned U.S. Pat. No. 6,166,698, the entire disclosure of which is incorporated herein by reference.

The information received from GPS receiver 3450 may be in a form that already identifies the location and direction of the vehicle or it may be in the form of information received directly from the satellites from which the location would need to be computed by microcontroller 1105. If GPS receiver 3450 is part of a navigation system, the navigation system may process the information from the GPS receiver and provide exactly the information needed by microcontroller 1105. Such information may include, for example, an indication whether or not the road that the vehicle is currently traveling on is a residential road, a divided highway, or an expressway. Microcontroller 1105 may then utilize this information to control the exterior lights on the vehicle. Specifically, microcontroller 1105 may prevent actuation of the vehicle high beams or the super-high beams when the vehicle is traveling on a residential road. Microcontroller 1105 may also disable the super-high beams except when the vehicle is traveling on a divided highway or expressway. The location of the vehicle may also be utilized to automatically enable or disable the super-high beams based upon a determination of whether the vehicle is located in a country, state, or municipality that permits (or prohibits) the use of such super-high beams. Additionally, the location of the vehicle may be used to determine whether the vehicle is presently driving in a region where vehicles are driven on the left-hand side of the road or in a region where vehicles are driven on the right-hand side of the road.

LED Headlamps for Headlamp Steering and Headlamp Flashing

It has long been considered to be desirable to provide headlamps that can be steered in the direction that the vehicle is turning. It is also desirable to provide forward lighting that can be turned OFF, or substantially attenuated, for such a short period of time that the driver does not notice that the lights are OFF. In this way, reflections do not exist during image acquisition. Although a light emitting diode (LED) lamp can be used to provide these features in a cost-effective manner, LED lamps producing enough light to implement a vehicle headlamp are not commercially available. LEDs suffer from a number of disadvantages that limit their application in vehicle headlamps, not the least of which are the relatively small amounts of light produced by LEDs and manufacturability limitations when incorporating LEDS having exotic constructions. Because of these disadvantages, LED lamps have not been used to implement a vehicle headlamp despite the fact that LEDs are more rugged, more energy efficient, and significantly longer lasting than other light technologies. Additionally, means of producing white light from LED have only recently become practical as discussed in U.S. Pat. No. 5,803,579, entitled ILLUMINATOR ASSEMBLY INCORPORATING LIGHT EMITTING DIODES, issued to John K. Roberts et al. on Sep. 8, 1998, the disclosure of which is incorporated herein by reference.

An LED headlamp 2600 is disclosed in FIGS. 26a and 26b. The LED headlamp can be used to very briefly flash OFF, or dim, the headlamps during an image-sampling interval. The LED headlamp 2600 includes a heat extraction member 2601 that serves as a support for mounting semiconductor optical radiation emitters 2603, 2605. Where the semiconductor optical radiation emitters 2603, 2605 are electrically connected to the heat extraction member, the heat extraction member provides an electrical connection to the semiconductor optical radiation emitters in addition to providing a thermal path for removing heat generated within the semiconductor optical radiation emitters during operation. It is envisioned that the emitters 2603, 2605 can be electrically isolated from the heat extraction member such that the heat extraction member only provides a thermal path. Each of the emitters 2603 is connected to electrical conductor strip 2607 through a wire bond 2609 and a resistor 2611. Each of the emitters 2605 is connected to electrical conductor strip 2613 through a bonding wire 2615 and a resistor 2617.

The heat extraction member 2601 may be constructed of any suitable material, and may be formed in any desired configuration. The front face of the illustrated heat extraction member is generally rectangular in shape, including 33 wells, each of which receives semiconductor optical radiation emitters 2603, 2605. The back of the heat extraction member includes fins 2621 that provide a large surface for thermal dissipation to the ambient air. It is envisioned that the heat extraction member may alternatively have other configurations which enable light steering, such as being generally convex, shaped like a portion of a cylinder side wall, an elongate bar to extend across the front of the vehicle, or a plurality of joined planar surfaces extending at different angles, or the like. The heat extraction member can be chamfered, or otherwise contain extensions, slots, holes, grooves and the like, and may incorporate depressions such as a collimating cup or other form to enhance optical performance. The illustrated heat extraction member includes elliptical cups 2602. The heat extraction member may be composed of copper; copper alloys such as beryllium, aluminum, aluminum alloys, steel, or other metal; or alternatively of another high thermal conductivity material such as ceramic. Preferably, the heat extraction member is constructed from an electrically and thermally conductive metal. Such materials are commercially available from a wide variety of sources.

The cups 2602 are formed in the top surface of the heat extraction member for receipt of the semiconductor optical radiation emitters. The illustrated cups 2602 are elliptical to accommodate two emitter chips 2603, 2605 side-by-side. However, the cups may be of any suitable shape such as round, elliptical, rectangular, square, pentagonal, octagonal, hexagonal, or the like. The elliptical cups have the advantage of accommodating more than one emitter while providing an efficient reflector for projecting light outwardly in a desired radiation pattern. It is envisioned that the region of the heat extraction member directly underlying the point of attachment of the semiconductor optical radiation emitter may be coated with nickel, palladium, gold, silver or other material including alloys, in order to enhance the quality and reliability of the die attach. Other thin-layered materials may be optionally inserted between the emitter and the heat extraction member to achieve a variety of desired effects without departing from the scope and spirit of the present invention. The material preferably provides an electrical connection between the emitters and the heat extraction member whereby the heat extraction member can provide a reference potential, which may, for example, be ground potential. The materials are preferably adhesive, electrically insulative, and either conductive or patterned composite of electrically insulative and conductive materials, and without significantly impeding thermal transfer, may be used to support, bond, electrically connect or otherwise mount to the emitter to the heat extraction member. The region of the heat extraction member within optical-enhancement cup feature may be coated with silver, aluminum, gold or other suitable material to increase reflectance and improve the optical efficiency of the device. The area outside of the encapsulant may be coated with nichrome, black oxide or other high emissivity treatment to improve radiative cooling.

The connection of the semiconductor optical radiation emitter is preferably by the use of a special type of electrically conductive adhesive die-attach epoxy. These adhesives normally achieve good electrical conductivity by inclusion metallic fillers such as silver in the adhesive. Suitable die-attach adhesives are well known in the art and may be obtained from Quantum Materials of San Diego, Calif.; Ablestik division of National Starch and Chemical; and EpoTek of Billerica, Mass. Alternatively, solder may be used as a means of attaching the LED chip to the heat extraction member in some embodiments. Whether attached by electrically conductive adhesive or solder, the bond establishes good electrical and thermal conductivity between the emitter and the heat extraction member. In the case where the emitters having electrodes manifest as conductive bond pads at the top of the LED chips rather than at their base, the electrical attachment of all of the electrodes is by wire bond rather than by die attach to the heat extraction member.

The semiconductor optical radiation emitters comprise any component or material that emits electromagnetic radiation having a wavelength between 100 nm and 2000 nm by the physical mechanism of electroluminescence, upon passage of electrical current through the material or component. For purposes of generating head light illumination, different emitters can be used in the wells to generate the light, such as: all amber emitters the wells; or amber and cyan emitters positioned in each of the wells; or red-orange and cyan emitters placed in each of the wells; or cyan and amber emitters placed in some of the wells and red-orange and cyan emitters in other wells; phosphorous emitters in each of the wells; or the like. It is envisioned that four out of the five wells can have blue-green and amber emitters and one in five wells can have red-orange and amber emitters. Such an arrangement will produce a white light for illuminating the path of the vehicle.

The semiconductor optical emitter may comprise a light emitting diode (LED) chip or die as are well known in the art, light emitting polymers (LEPs), polymer light emitting diodes (PLEDs), organic light emitting diodes (OLEDs) or the like. Such materials and optoelectronic structures made from them are electrically similar to traditional inorganic materials known to those skilled in the art, and are available form a variety of different sources. Semiconductor optical radiation emitter, or emitter, as used herein refers to each of these and their equivalents. Examples of emitters suitable for headlamps include AlGaAs, AlInGaP, GaAs, GaP, InGaN, SiC, and may include emissions enhanced via the physical mechanism of fluorescence by the use of organic or inorganic dies or phosphors. LED chips suitable for use in the present invention are made by companies such as Hewlett-Packard, Nichia Chemical, Siemans Optoelectronics, Sharp, Stanley, Toshibe, Lite-On, Cree Research, Toyoda Gosei, Showa Denko, Tyntec, and others. Such chips are typically fashioned approximately in a square base between 0.008" and 0.016" long on each side and a height of about 0.008" to 0.020". To implement the headlight, a larger chip having a square base larger than 0.020" may be used, and in particular it is advantageous to have a size greater that 0.025" to 0.035" to generate light. An array of such emitters mounted to a substantial heat sink permits an LED lamp to generate sufficient light to operate as a vehicle headlight. Details of an emitter that can be used can be found in U.S. patent application Ser. No. 09/426,795, filed on Oct. 22, 1999, entitled SEMICONDUCTOR RADIATION EMITTER PACKAGE, by John K. Roberts et al., now U.S. Pat. No. 6,335,548, the disclosure of which is incorporated herein by reference. An electrical path for supplying control signals to the emitters is provided through conductors. The conductors are electrical strips applied to a surface of an insulative layer, the insulative layer being mounted to the top surface of the heat sink. The insulative layer may be a circuit board including openings over the cups, or it may comprise an epoxy or plastic layer. The conductor may be any suitable electrically conductive material such as copper, aluminum, an alloy, or the like, and may advantageously comprise circuit traces applied to the insulating material by conventional means. The circuit traces disclosed in FIG. 26a illustrate a pattern that may be used where separate supply is provided for the different emitters.

An encapsulant is a material or combination of materials that serves primarily to cover and protect the semiconductor optical radiation emitter and wire bonds. The encapsulant is transparent to wavelengths of radiation. For purposes of the present invention, a substantially transparent encapsulant refers to a material that, in a flat thickness of 0.5 mm, exhibits greater than 20 percent total transmittance of light at any wavelength in the visible light range between 380 nm and 800 nm. The encapsulant material typically includes a clear epoxy or other thermoset material, silicone or acrylate. Alternatively, the encapsulant may conceivably include glass or thermoplastic such as acrylic, polycarbonate, COC or the like. The encapsulant may include materials that are solid, liquid or gel at room temperature. The encapsulant may include transfer molding compounds such as NT 300H, available form Nitto Denko, or potting, encapsulation or other materials which start as a single part or multiple parts and are processed with a high temperature cure, two-part cure, ultraviolet cure, microwave cure, or the like. Suitable clear encapsulants may be obtained from Epoxy Technology of Billerica, Mass.; Nitto Denko America, Inc., of Fremont, Calif.; or from Dexter Electronic Materials of Industry, California.

The encapsulant may provide partial optical collimation or other beam formation of electromagnetic energy emitted by the emitter and or reflected by the surface of the heat extraction member. The encapsulant also serves as a chemical barrier, sealant, and physical shroud providing protection of emitters, internal adhesives such as bonds, bond pads, conductor wires, wire bonds and internal surfaces of heat extraction member and electrical leads from environmental damage due to oxygen exposure, exposure to humidity or other corrosive vapors, solvent exposure, mechanical abrasion or trauma, and the like. Encapsulant provides electrical insulation. Encapsulant may also provide for attaching or registering to adjacent components such as secondary optics, support members, secondary heat extractors, and the like.

The encapsulant may comprise a heterogeneous mass of more than one material, wherein each material occupies a portion of the overall encapsulant volume and provides a specialized function or property. For example, a stress relieving gel such as a silicone "glob top" may be placed over the emitter and wire bonds. Such a localized stress relieving gel remains soft and deformable and may serve to cushion the emitter and wire bonds from stress incurred during subsequent processing of the component or due to thermal expansion to shock. A hard molding compound such as an epoxy may then be formed over the stress relieving gel to provide structural integration for the various features of the component, to retain the electrical leads, to protect the internal mechanisms of the component from environmental influences, to electrically insulate the semiconductor radiation emitters, and to provide various optical moderation of radiant energy emitted by the emitter if desired.

Additionally, the filler used within the stress relieving gel may advantageously include a high thermal conductivity material such as diamond powder. Diamond is a chemically inert substance with an extremely high thermal conductivity. The presence of such a material may significantly increase the thermal conductivity of the gel and provide an additional path for heat generated in the emitter chip to reach the heat extraction member and ambient environment where it can be dissipated. Such additional heat extraction path will increase the efficiency of the emitter, and thus the light output of the lamp. The encapsulant, and manufacture of a device using such an encapsulant, is described in greater detail in U.S. Pat. No. 6,335,548, incorporated by reference hereinabove.

A steerable light emitting diode headlamp 2700 is illustrated in FIG. 27. The headlamp includes a heat extraction member 2701 having two lamp sections 2703 and 2705. The heat extraction member 2701 is configured to include the two lamp sections 2703 and 2705 each of which is substantially identical to lamp 2601, presenting two front faces at an angle of 5° to 45°, and may advantageously be angled at approximately 15°.

Figure 28:
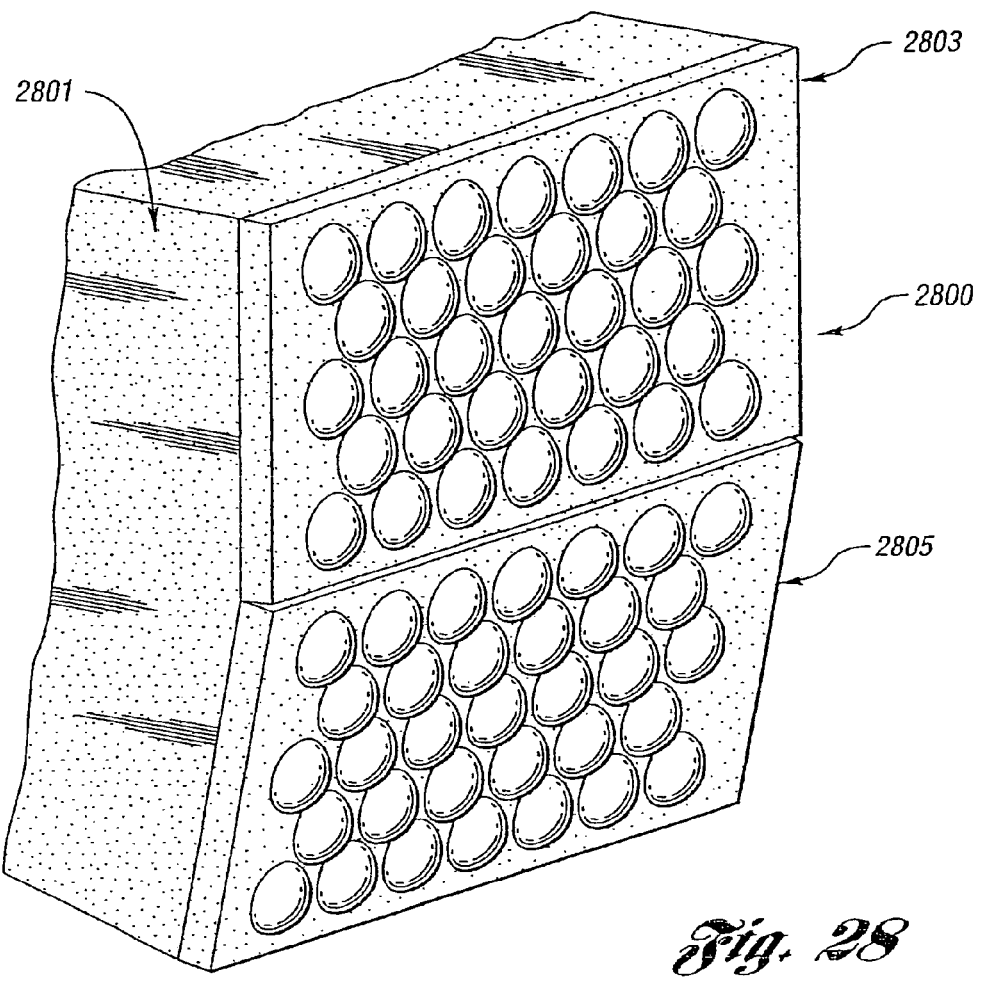
FIG. 28 is a top, front perspective view of an LED headlamp for projecting light in more than one vertical direction.

Another alternative design for a headlamp for providing low and high beams is illustrated in FIG. 28. The headlamp 2800 includes a heat extraction member 2801 having two lamp sections 2803 and 2805. The heat extraction member 2801 is configured to include the two lamp sections 2803 and 2805, each of which is substantially identical to lamp 2601. The heat extraction member provides two front faces at an angle of 1° to 2°, and may advantageously be angled at approximately 1.5°. The angle is exaggerated in FIG. 28 so that the angled surfaces are readily visible.

By controlling the selection of the LEDs that are illuminated, the headlights can be aimed. It is also envisioned that the front of the car can have LED chips positioned in a bar running across the front grill.

Figure 26C:
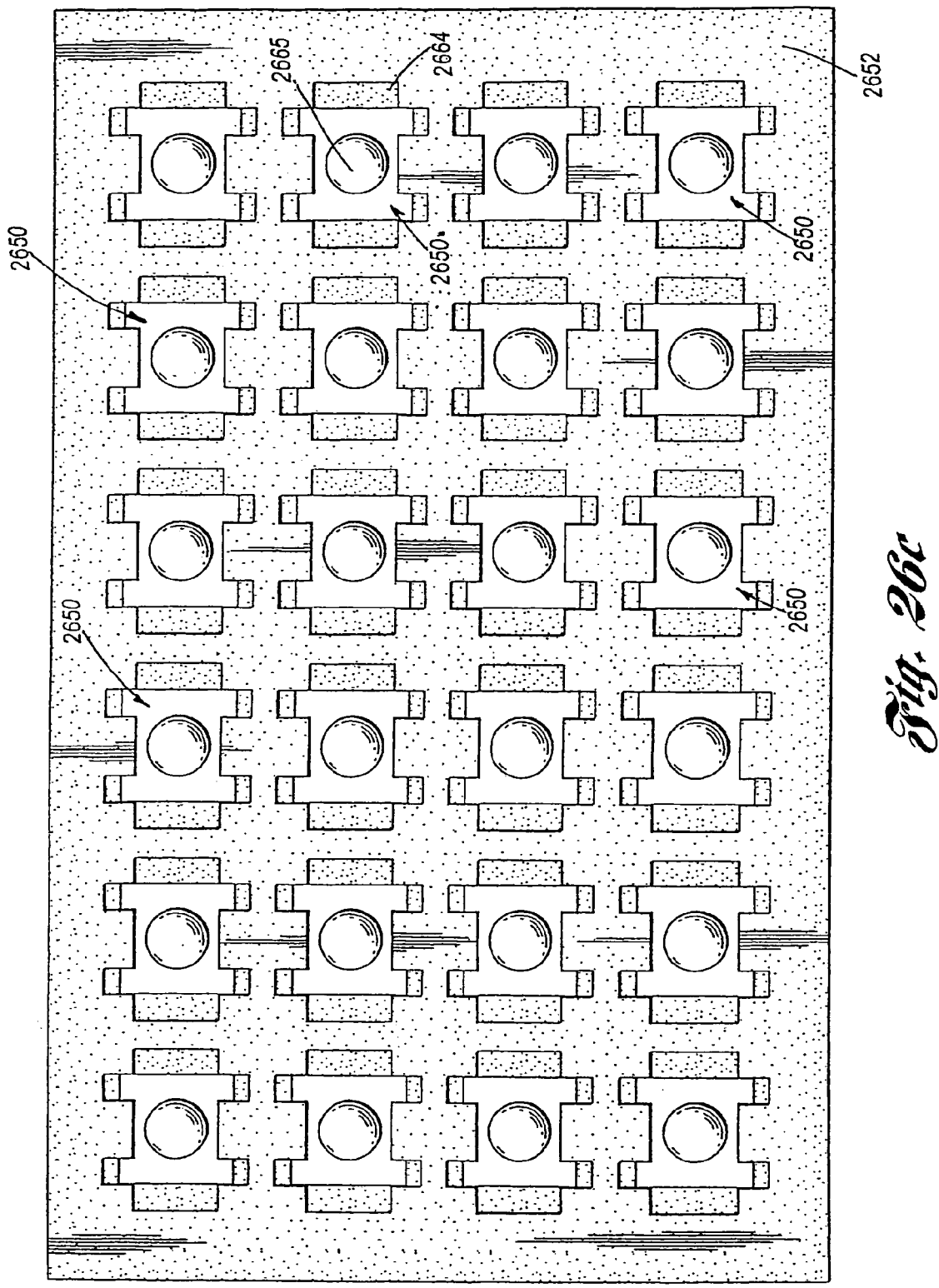
FIG. 26c is a front plan view illustrating an alternate embodiment of an LED lamp.

Whereas the above embodiment takes advantage of directly mounting a number of chips on a common heat sink, it is also envisioned that an array of discrete LED lamps can be used to implement an LED headlamp 2650 (FIGS. 26c and 26d). Each discrete LED lamp preferably includes a heat extraction member for dissipating power generated by the emitters to obtain a brighter light level without damaging the LED components. A particularly advantageous high power LED lamp which is uniquely adapted for conventional manufacturing processes is disclosed in U.S. patent application Ser. No. 09/426,795, entitled SEMICONDUCTOR RADIATION EMITTER PACKAGE, filed on Oct. 22, 1999, by John K. Roberts et al., now U.S. Pat. No. 6,335,548, the disclosure of which is incorporated herein by reference. Other LED lamps that could be used are commercially available from LED manufacturers such as Hewlett Packard Company.

The LED lamps 2650 (only some of which are numbered) are mounted to a circuit board 2652 and heat sink 2654 (FIG. 26d). The circuit board can provide a secondary heat sink, where the conductive layer 2660 of the circuit board is exposed to ambient air, by thermally coupling the heat extraction member 2664 of each LED lamp to the conductive layer 2662 of the circuit board. The heat extraction member of the LED lamp is also thermally coupled to the heat sink 2654. In the illustrated embodiment of FIGS. 26c and 26d, the thermally conductive material 2670 is positioned in a hole through the circuit board below the heat extraction member. The thermally conductive material is thicker than the circuit board, and resilient. For example, the thermally conductive material can be provided using a preformed thermal coupler such as a silicon based, cut resistant material commercially available from Bergquist, and identified as Silipad 600. Packages for LED lamps using the heat extraction member are disclosed in U.S. patent application Ser. No. 09/425,792, entitled INDICATORS AND ILLUMINATORS USING A SEMICONDUCTOR RADIATION EMITTER, filed on Oct. 22, 1999, by John K. Roberts et al., now U.S. Pat. No. 6,441,943, the disclosure of which is incorporated herein by reference thereto.

Where red-green-blue or binary complementary lighting is used, it is envisioned that only selected chips will be flashed OFF when attempting to distinguish reflective objects from lamps. Thus, for binary complementary emitters, only amber emitters need to have a briefly reduced intensity. Additionally, it will be recognized that instead of turning the headlamps OFF, the light level can be reduced to a level at which reflections will be below the pixel threshold at which the image sensor assembly will detect an object.

Other LED device/component structures that may be employed are disclosed in commonly assigned U.S. Provisional Application No. 60/265,487, entitled HIGH POWER RADIATION EMITTER DEVICE AND HEAT DISSIPATING PACKAGE FOR ELECTRONIC COMPONENTS, filed on Feb. 1, 2001, by John K. Roberts et al. and in commonly assigned U.S. Provisional Application No. 60/265,489, entitled RADIATION EMITTER DEVICES AND METHOD OF MAKING THE SAME, filed on Jan. 22, 2001, by John K. Roberts et al.

Surface Mounted Filter for Sensor

Figure 29A:
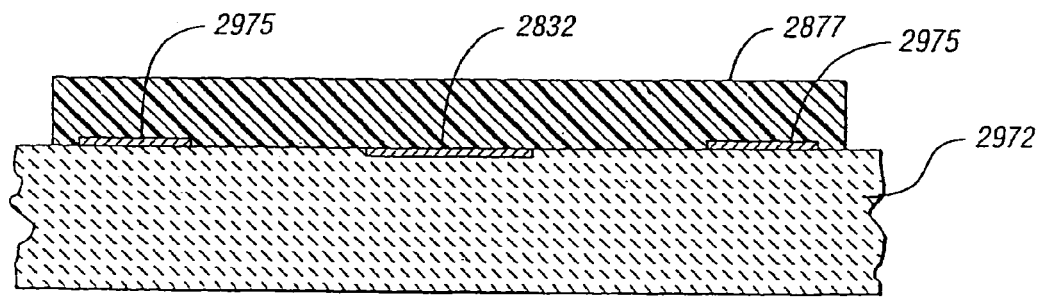
Figure 29B:
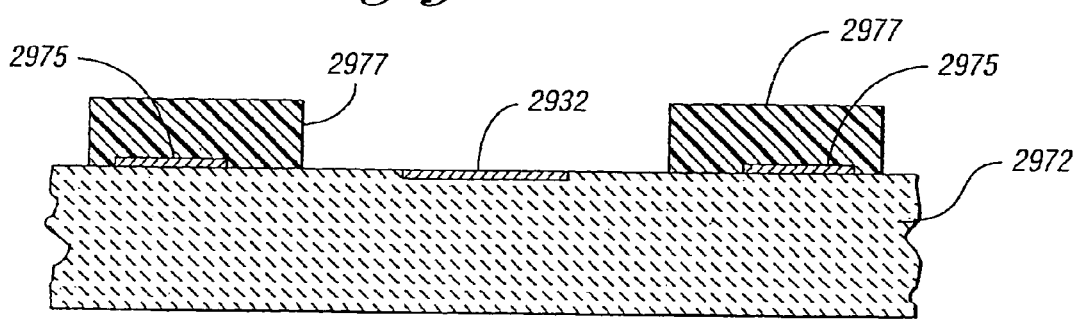
Figure 29C:
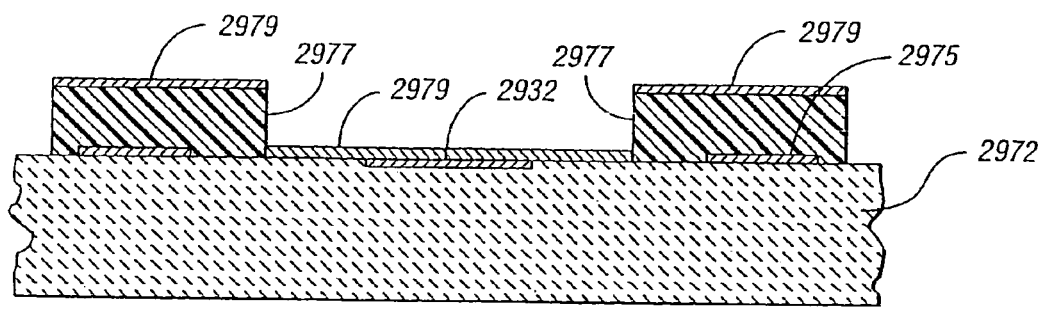
Figure 29B:
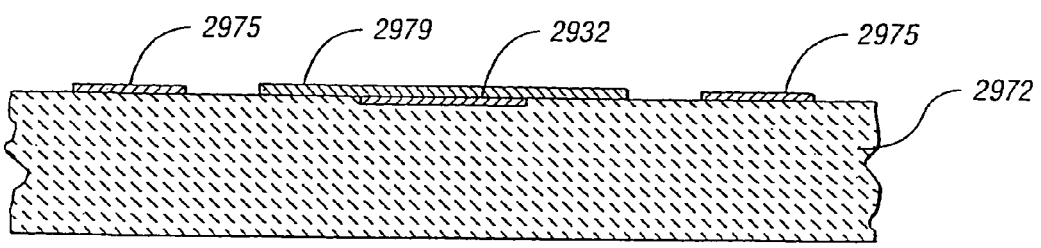

A method by which a filter can be directly deposited onto a semiconductor light sensor 201 will now be described with respect to FIGS. 29a through 29d. In the first step, a photoresist 2877 is deposited over the entire wafer 2972. The photoresist may be any suitable commercially available photoresist material. Portions of the photoresist may be removed such that the remaining photoresist 2877 is patterned to cover only those areas on the surface of the wafer requiring protection from the optical coating deposition, such as the bonding pad 2975, as shown in FIG. 29b. The optical film coating 2979 is then applied to the surface of the die 2972 as shown in FIG. 29c.

The thin film 2979 is deposited directly on the light sensor 2932 in multiple layers. The red and cyan filters, if red and cyan filters are desired, will be applied separately. An example of a cyan filter will be now described. To make a cyan filter, the layers of titanium dioxide ($TiO_2$) and silicon dioxide ($SiO_2$) described in Table 1 can be used. To make a red filter, the layers described in Table 2 can be used. The layer number is the order in which the material is applied to the wafer surface.

TABLE 1

| Layer | Material | Thickness(nm) |
|---|---|---|
| 1 | $SiO_2$ | 170 |
| 2 | $TiO_2$ | 124 |
| 3 | $SiO_2$ | 10 |
| 4 | $TiO_2$ | 134 |
| 5 | $SiO_2$ | 160 |
| 6 | $TiO_2$ | 79 |
| 7 | $SiO_2$ | 164 |
| 8 | $TiO_2$ | 29 |
| 9 | $SiO_2$ | 168 |
| 10 | $TiO_2$ | 68 |
| 11 | $SiO_2$ | 164 |
| 12 | $TiO_2$ | 33 |
| 13 | $SiO_2$ | 163 |
| 14 | $TiO_2$ | 69 |
| 15 | $SiO_2$ | 154 |
| 16 | $TiO_2$ | 188 |
| 17 | $SiO_2$ | 148 |
| 18 | $TiO_2$ | 88 |
| 19 | $SiO_2$ | 319 |

TABLE 2

| Layer | Material | Thickness(nm) |
|---|---|---|
| 1 | $TiO_2$ | 68 |
| 2 | $SiO_2$ | 64 |
| 3 | $TiO_2$ | 35 |
| 4 | $SiO_2$ | 138 |
| 5 | $TiO_2$ | 57 |
| 6 | $SiO_2$ | 86 |
| 7 | $TiO_2$ | 50 |
| 8 | $SiO_2$ | 78 |
| 9 | $TiO_2$ | 73 |
| 10 | $SiO_2$ | 94 |
| 11 | $TiO_2$ | 54 |
| 12 | $SiO_2$ | 89 |
| 13 | $TiO_2$ | 52 |
| 14 | $SiO_2$ | 87 |
| 15 | $TiO_2$ | 50 |
| 16 | $SiO_2$ | 74 |
| 17 | $TiO_2$ | 28 |
| 18 | $SiO_2$ | 61 |
| 19 | $TiO_2$ | 49 |
| 20 | $SiO_2$ | 83 |
| 21 | $TiO_2$ | 48 |
| 22 | $SiO_2$ | 78 |
| 23 | $TiO_2$ | 48 |
| 24 | $SiO_2$ | 91 |

After all of the layers are deposited, the photoresist is lifted off using a conventional lift off process, leaving the film deposited over the light sensitive region, but not over the bonding pads, as shown in FIG. 29d. The resulting die can be encapsulated to provide the image array sensor in conventional packaging.

Figure 31:
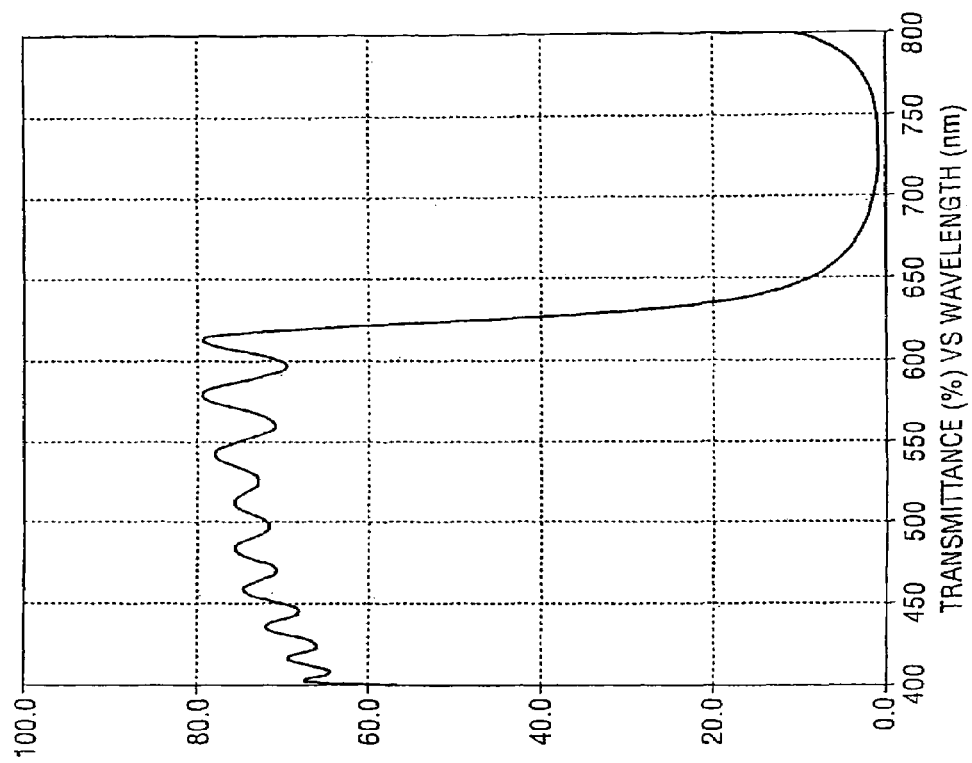
FIG. 31 is a chart illustrating the wavelengths passed by a cyan filter surface mounted to an image sensor.
Figure 30:
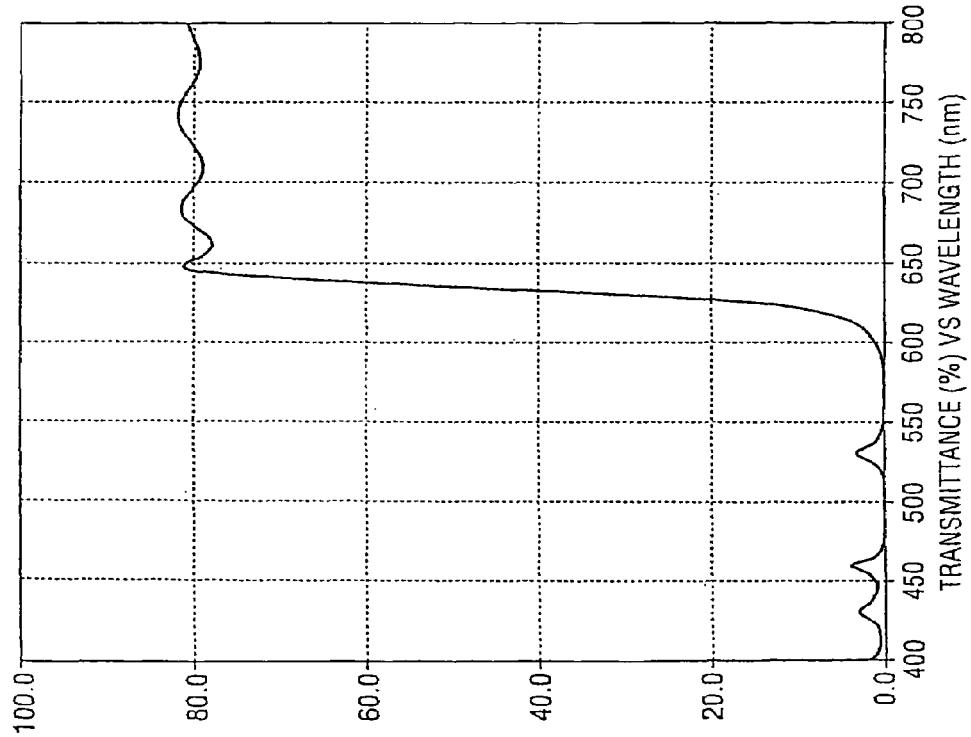
FIG. 30 is a chart illustrating the wavelengths passed by a red filter surface mounted to an image sensor.

The characteristics of the filters produced according to Table 1 and Table 2 are illustrated in FIGS. 30 and 31. In particular, the red filter will attenuate light below 625 nm whereas the blue filter will pass light between approximately 400 nm and 625 nm. Both filters will pass light above 800 nm. An infrared filter can be utilized to reduce the effect of infrared light on the performance of the headlight dimmer.

Those skilled in the art will recognize that the filters described herein are exemplary, and that other filters, materials, or material thickness could be used to implement the filter function. Other materials could be applied in a similar manner to provide these or other filter characteristics.

Those skilled in the art will also recognize that the layer thicknesses are rounded to the nearest nanometer. Although there will be some tolerance permitted, good precision in the stack construction is required. It will also be recognized that the layer thicknesses are exemplary. By surface mounting the filters, the cost of providing the image sensor can be greatly reduced, as components and manufacturing complexity are reduced. Additionally, an infrared filter can be applied as a coating between the pixels and the red and blue filters.

Package

Figure 32:
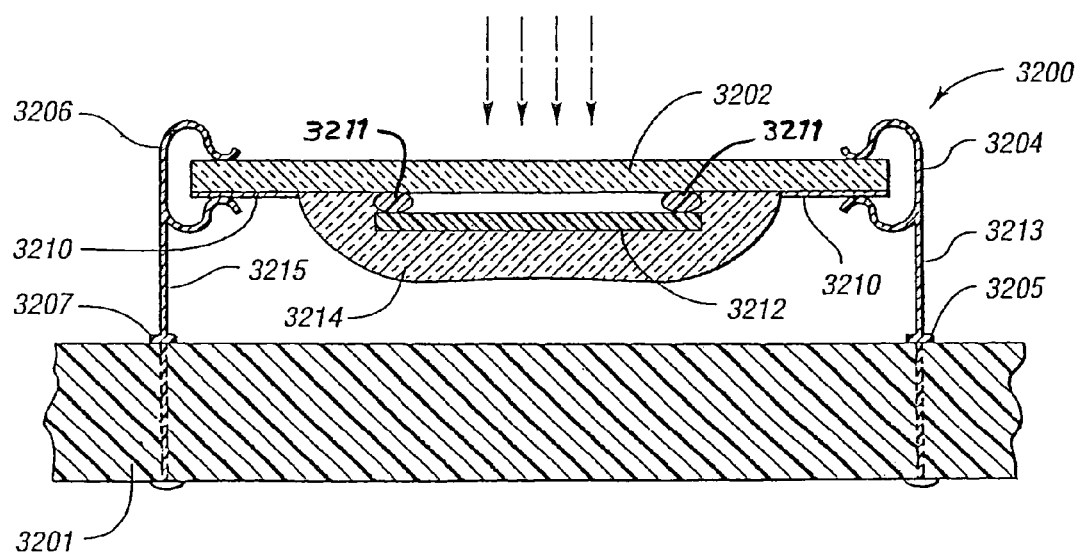
FIG. 32 illustrates another image sensor assembly.

An alternate optical sensor assembly 3200 is disclosed in FIG. 32. Optical sensor assembly 3200 includes a base substrate 3202, which is transparent. The substrate may be manufactured of any suitable material such as a transparent polymer, glass, or the like. Alternately, it is envisioned that the base substrate may be manufactured of a commercially available infrared interference filter such as those described hereinabove. Alternatively, a thin film filter may be attached to a transparent glass element to make the base substrate 3202.

The lower surface of the base substrate has conductive strips 3210 for connection to the image array sensor 3212. The base substrate is preferably an electrical insulator, whereby the strips can be any suitable electrically conductive material applied directly to the lower surface of the base substrate by conventional manufacturing processes. Alternatively, if the base substrate is an electrical conductor, the strips can be applied to an electrical insulator, which is in turn applied to the base substrate.

The image array sensor 3212 is flip chip bonded to the lower surface of the base substrate 3202 by soldering pads 3211. A dielectric material 3214, such as an epoxy, encloses the image array sensor. The dielectric material preferably bonds with the conductive strips 3210 and the transparent element 3202. Clips 3204 and 3206 clip onto the edges of the base substrate and make electrical contact with respective conductive strips 3210. A respective clip can be provided for each of the conductive strips 3210. Leads 3213, 3215 extend from the clips for insertion into support substrate 3201, which can be a printed circuit board, a housing, or the like. The support substrate is preferably a printed circuit board carried in a housing, such as a rearview mirror mount housing. The stops 3205, 3207 limit the length of the leads that can be inserted into the support substrate. Alternatively, the clips can be configured for surface mounting. Examples of surface mountable clips include NAS Interplex Edge Clips, from NAS Interplex, an Interplex Industries Company located in Flushing, N.Y., USA.

Packages for mounting the image array sensor are described in U.S. Pat. No. 6,130,448, OPTICAL SENSOR PACKAGE AND METHOD OF MAKING THE SAME, filed on Aug. 21, 1998, by Fred Bauer et al., the disclosure of which is incorporated herein by reference.

The assembly of the lens to the base substrate can be provided in the same manner as described hereinabove. In particular, the lens structure is carried on the base substrate 3202. The lens structure can be identical to the lens structure 202, and thus can be half clear and half red, or half cyan and half red, or entirely clear where a color filter is applied directly to the surface of the image sensor as described above with respect to FIGS. 29a-29d. To make the lens assembly, a transparent member and a UV curable adhesive can be used. The transparent member can be an epoxy member like members 230, 802. The UV curable adhesive can be identical to adhesive 232.

Radar

A wave transceiver 101 (FIG. 1) can be used to acquire additional intelligence usable for controlling the operation of the controlled vehicle 100. The wave transceiver can be used without the image array sensor 102, or it can be used with the image array sensor. The wave transceiver device 101 is mounted on a vehicle 100 and oriented in a generally forward direction. The wave transceiver device 101 is positioned to receive the reflections of waves emitted by the transceiver device after they have reflected off objects in front of the vehicle 100. The wave-emitting device may be a radar system operating, for example, in a frequency range exceeding 1 GHz (77 GHz is designated for vehicular radar in many European countries) or an optical radar utilizing, for example, laser diodes for the wave-emitting device. Alternatively, the wave-emitting device 101 may be an ultrasonic transducer emitting ultrasonic waves. The wave-emitting device may be scanned across the forward field to cover various angles. For the purposes of this invention, the term "radar" will be used to encompass all of these concepts. The wave transceiver should not be interpreted as being limited to any specific type or configuration of wave transmitting or wave receiving device. The transmitter and receiver may each be mounted within a different respective housing or they both may be mounted in a common housing.

Figure 33:
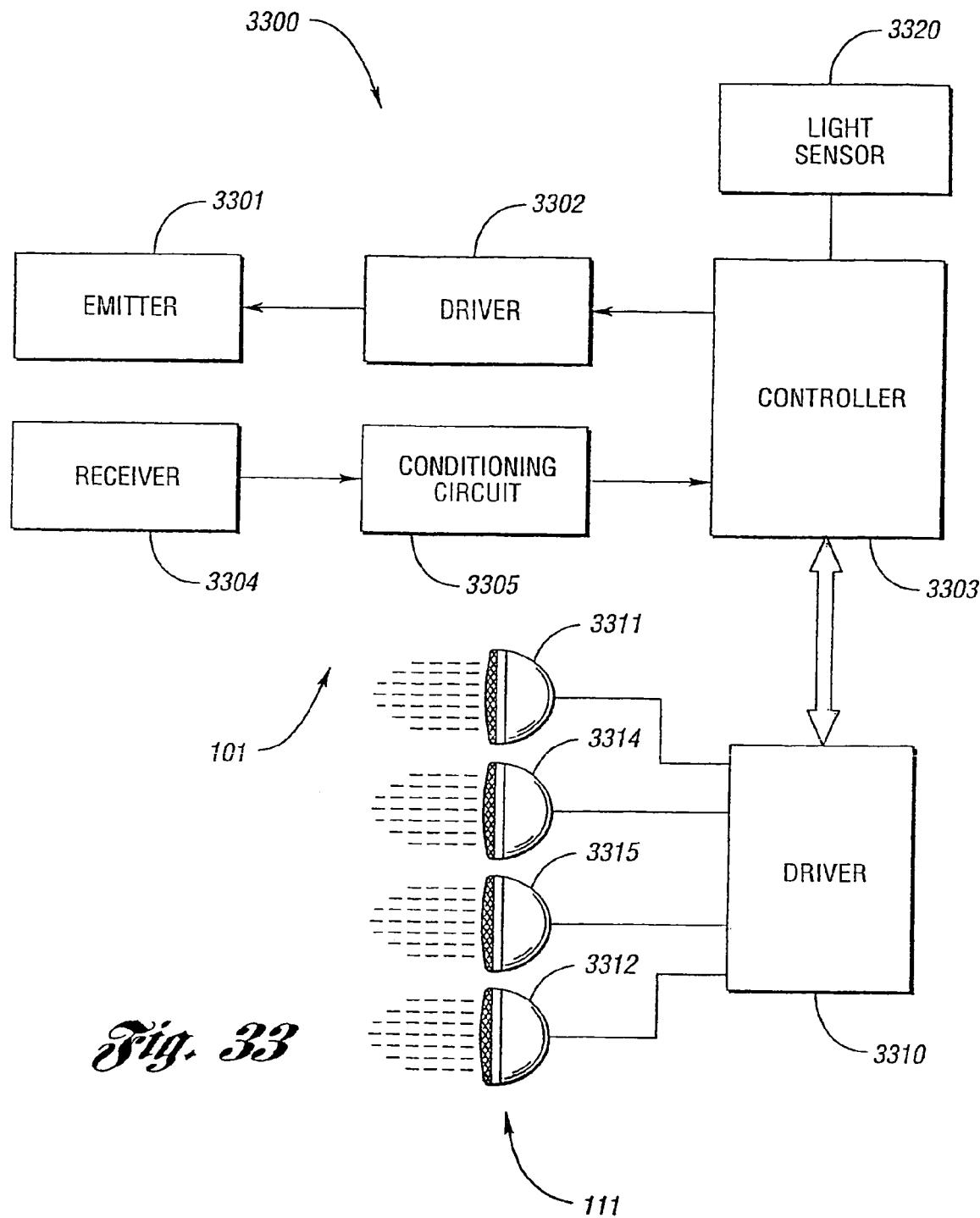
FIG. 33 illustrates an electrical system including a wave sensitive headlamp control.

A radar processing system 3300 (FIG. 33) controls the wave transmitting section 3301, 3302 and interprets the signal received by the wave receiving section 3304, 3305 to determine the presence of objects as well as the speed and direction of such objects. A headlamp controller 3303 receives target information from the radar processing system, and may optionally also receive signals from the vehicle speed sensor (such as a speedometer) and a vehicle direction sensor (such as a compass) and generates a control signal which determines the state of the vehicle headlamps 111. The communication between the radar processing system, the vehicle speed sensor, the vehicle direction system and the vehicle headlamps may be by one of many mechanisms including direct wiring through a wiring harness or by a vehicle communication bus such as the CAN bus. Additionally, systems such as the radar processing system and the headlamp controller may be implemented by a single integrated processor, multiple processors, digital signal processors, microcontrollers, microprocessors, programmable logic units, or combinations thereof.

More particularly, the system contains a radar system that includes a wave transmitting section and a wave receiving section. The wave transceiver 101 includes an emitter 3301 and a receiver 3304. The transmitter may be implemented using an antenna for a conventional radar, a light source for optical radar, an ultrasonic emitter, an antenna system for a Doppler radar system, or the like. The receiver 3304 may be implemented using an antenna in a conventional radar system, a light receiving element in an optical radar system, an ultrasonic receiver, a wave guide antenna in a Doppler radar system, or the like. A driver 3302 is connected to the emitter 3301 to condition signals from controller 3303 so that emitter 3301 produces signals, which, when reflected, can be detected by the receiver 3304. The driver 3302 may be implemented using a pulse modulator, a pulse shaper, or the like. The receiver 3304 is connected to a conditioning circuit 3305 which conditions the signals detected by the receiver for further processing by controller 3303. The conditioning circuit may include a demodulator, a filter, an amplifier, an analog-to-digital converter (ADC), combinations thereof, and the like. The controller 3303 may be implemented using a microprocessor, a digital signal processor, a microcontroller, a programmable logic unit, combinations thereof, or the like.

The operation of radars to determine the presence of objects relative to a vehicle are well known, and will not be described in greater detail hereinbelow. For example, the time between the transmitted wave and the detection of the reflected wave may be used to determine the distance of an object. The movement of an object over successive transmission/reception cycles may be used to determine an object's relative speed and direction. Doppler radar may also be used to determine the object's speed. The magnitude of the reflected wave may be used to determine the size or density of the detected object. Operation of radars is well known, and will not be described in greater detail herein.

In order to properly control the high beam state of the controlled vehicle 100 it is necessary to determine if an object detected by the radar is a vehicle or a stationary object and, if a vehicle, whether the vehicle is an oncoming vehicle 105 or preceding vehicle 110. This can be accomplished by comparing the speed and direction of the object with the speed and direction of the controlled vehicle 100. The speed and direction of travel of the object is obtained using the radar principles described above. The speed of the controlled vehicle 100 may be obtained from a speed sensor on the vehicle, a global positioning system (GPS) system, or the like. The direction of the control vehicle 100 may be obtained from a compass sensor, a steering wheel turn indicator, a GPS, or the like.

Once this information is obtained, a simple set of criteria is applied to determine if the object is a vehicle or a stationary object. If an object is stationary, it will be moving in a direction opposite the controlled vehicle 100 at the same speed as the controlled vehicle. If an object is an oncoming vehicle 105, it will be traveling in a direction approximately opposite the controlled vehicle 100 at a speed substantially faster than that of the controlled vehicle. Finally, if an object is not moving relative to the controlled vehicle or the object is moving at a rate substantially slower than the controlled vehicle, the object is likely a preceding vehicle 1110. The distance at which the high beams are dimmed may be a function of the speed of the controlled vehicle and may be a function of the angle between an axis straight forward of the controlled vehicle 100 and the oncoming vehicle 105 or preceding vehicle 110.

In a more advanced system the headlamp control system not only controls the high/low beam state of the headlamps 3311, 3312 and high beam lamps 3314, 3315 based on the presence of one or more vehicles, but may vary the brightness of the high beam headlamps and low beam headlamps to provide a continuous transition between the two beams as a function of the distance to the nearest other vehicle, thus maximizing the available luminance provided to the driver of the controlled vehicle without distraction to the other driver. A continuously variable headlamp system is disclosed in U.S. Pat. No. 6,049,171 entitled CONTINUOUSLY VARIABLE HEADLAMP CONTROL, filed on Sep. 18, 1998, by Joseph S. Stam et al., the disclosure of which is incorporated herein by reference. The system may also vary the aim of the controlled vehicle headlamps in the vertical direction. The system may be configured to transition between more than two beams or may be configured to perform a combination of aiming and varying the brightness or one or more lamps. The headlamp processing system may also use the vehicle direction input to determine the proper horizontal aim of the headlamps to provide better illumination when traveling on curves. An LED headlamp that facilitates aiming is described above.

A light sensor 3320 can be used to detect ambient light levels and may optionally provide other light conditions. The light sensor may be implemented using a non-imaging sensor such as a silicon photodiode, a particularly advantageous photodiode disclosed in U.S. patent application Ser. No. 09/237,107, entitled PHOTODIODE LIGHT SENSOR, filed by Robert Nixon et al., now abandoned, the disclosure of which is incorporated herein by reference, although other non-imaging photocells could be used such as cadmium sulphide (CdS) cells, or the like. The light sensor 3320 can alternately be implemented using an optical image sensor 102 in addition to, or instead of, a non-imaging light sensor.

The optical system may contain filters to determine the color of a light source. The combination of an optical system with a radar system may better overcome the limitations present if only one of the systems is used independently. For example, if a radar system is used independently of an imaging system, an oncoming or preceding vehicle waiting at an intersection would be perceived by the radar system as a stationary object. However, by combining an optical sensor with the radar system, the lights on the waiting vehicle would indicate that a vehicle is present and the radar can determine the actual distance to the vehicle. In general, if an optical system is used, the optical system may be used to determine the presence of oncoming or preceding vehicles and the radar system may be used to determine the actual distance to such oncoming or preceding vehicle as well as the speed of that vehicle. In this manner, the radar detector and the imaging sensor can be used to verify the presence of other objects. Additionally, the light sensors can be used to determine light conditions, such as ambient light levels.

The presence of the radar system on the vehicle may enable other features other than headlamp control to be implemented utilizing the same components as the headlamp radar, thus reducing the cost of the two systems combined. Such system may include, for example, adaptive cruise control, obstacle warning systems, collision avoidance systems, autonomous driving systems, or the like. In this case, the wave transmitting section, wave receiving section, and radar processing systems could be shared by all features while each feature has its own processing system for determining a course of action based upon the information received from the radar processing system. It is also possible to integrate the processing systems from each feature into a single processor.

A radar system is described in U.S. patent application Ser. No. 09/531,211, entitled AUTOMATIC HEADLAMP CONTROL SYSTEM, now U.S. Pat. No. 6,403,942, the disclosure of which is incorporated herein by reference.

Mirror Mount Accessory Housing

A preferred mounting structure for mounting the headlamp dimmer system of the present invention is shown in FIGS. 41-49. As illustrated, this structure includes a mount 4101 having a slot 4103 for receiving a mounting puck (not shown) that is adhesively secured to the vehicle windshield. An aperture 4105 is formed in mount 4101 and opens into slot 4103 to allow a mount screw 4107 to extend through aperture 4105 and engage a surface of the mounting puck so as to securely hold mount 4101 on the puck and thus on the vehicle windshield. Mount 4101 includes a ball 4109 to which the socket of a mirror mounting stem (not shown) may be secured in conventional fashion. The mounting stem may be secured to a similar ball extending from the rearview mirror housing or the stem may include a ball for engaging a socket formed in the mirror housing body.

Figure 44:
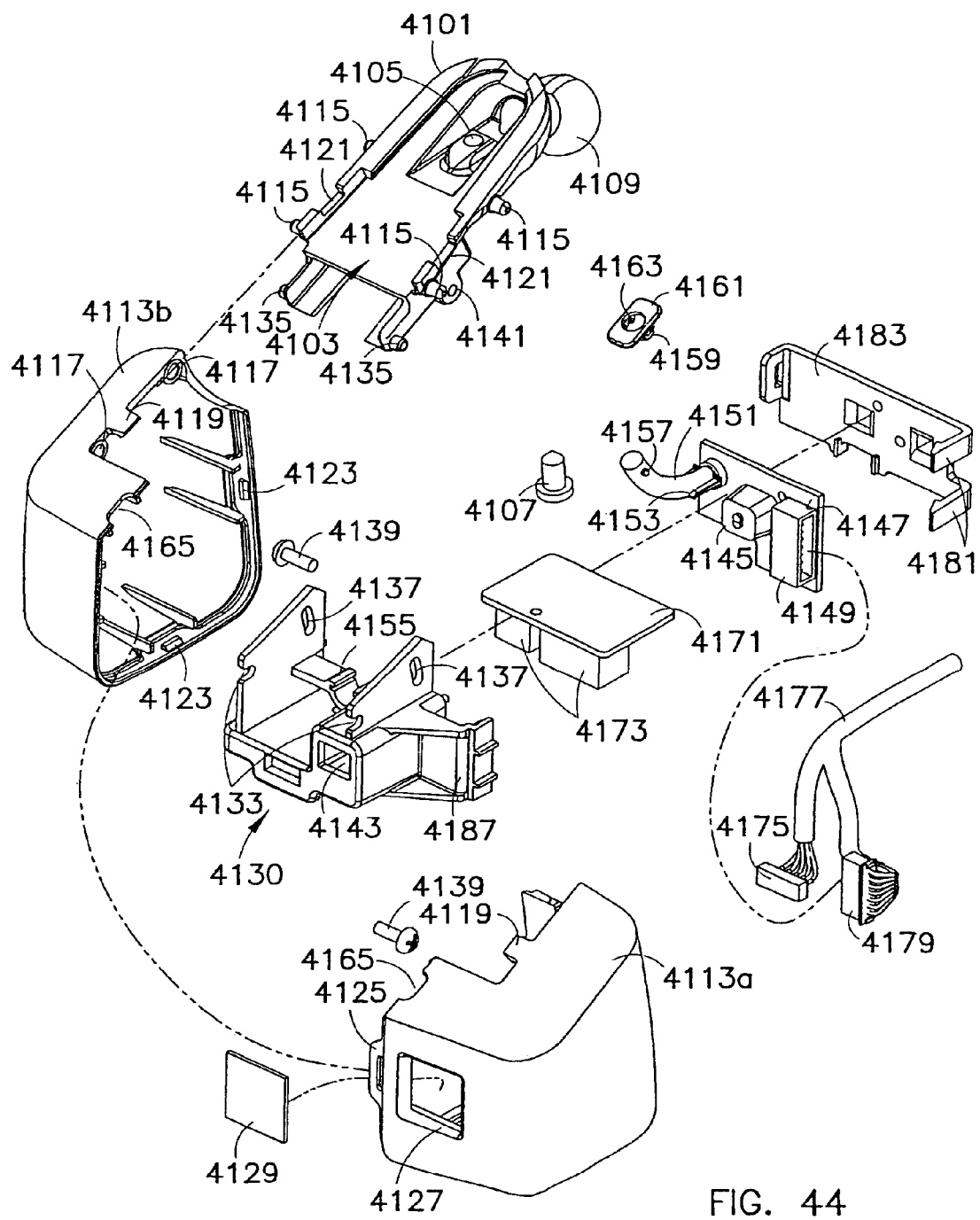
FIG. 44 is an exploded perspective view of the mirror mount accessory housing.
Figure 46:
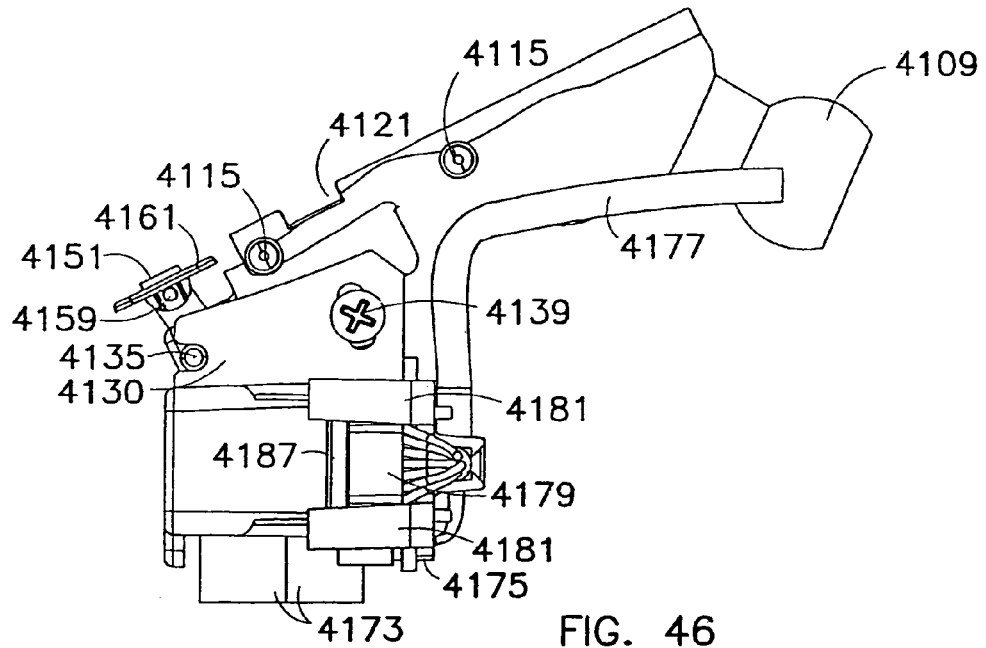
FIG. 46 is a side elevational view of the mirror mount accessory housing with the housing cover removed.
Figure 47:
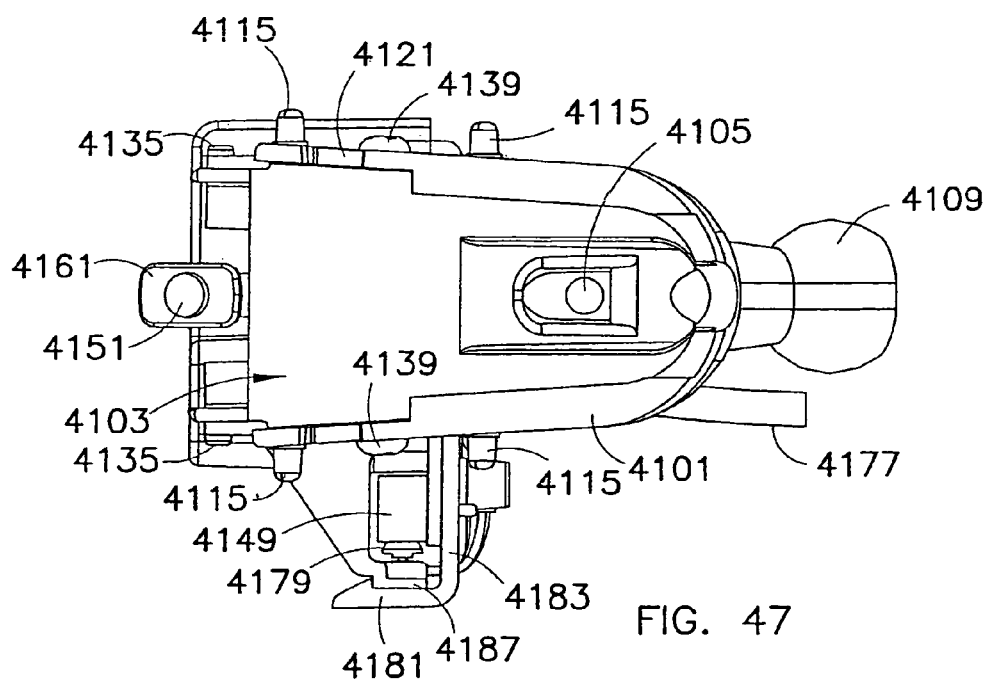
FIG. 47 is a top plan view of the mirror mount accessory housing with the housing cover removed.
Figure 48:
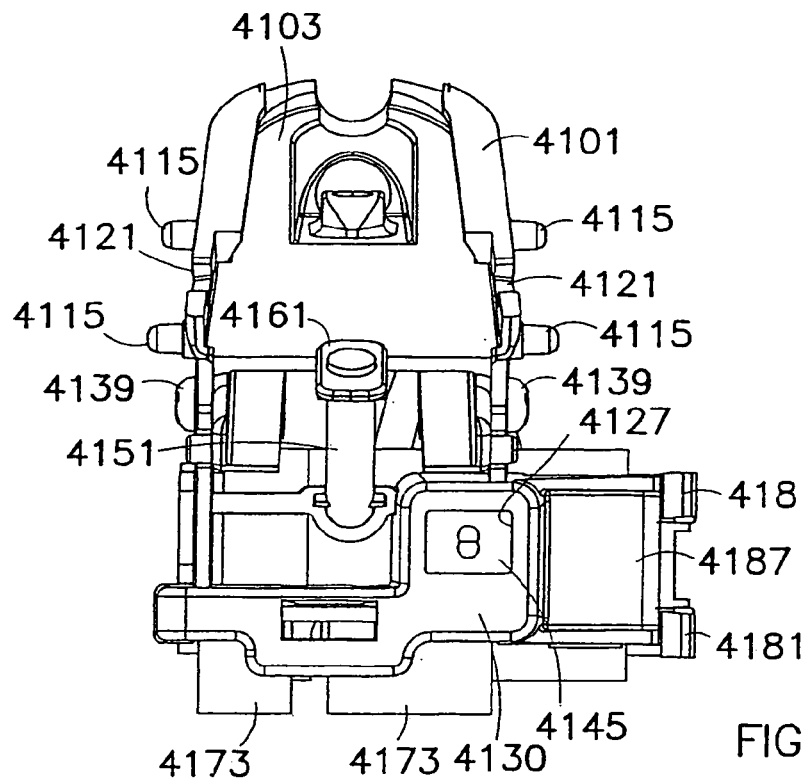
FIG. 48 is a front elevational view of the mirror mount accessory housing with the housing cover removed.
Figure 49:
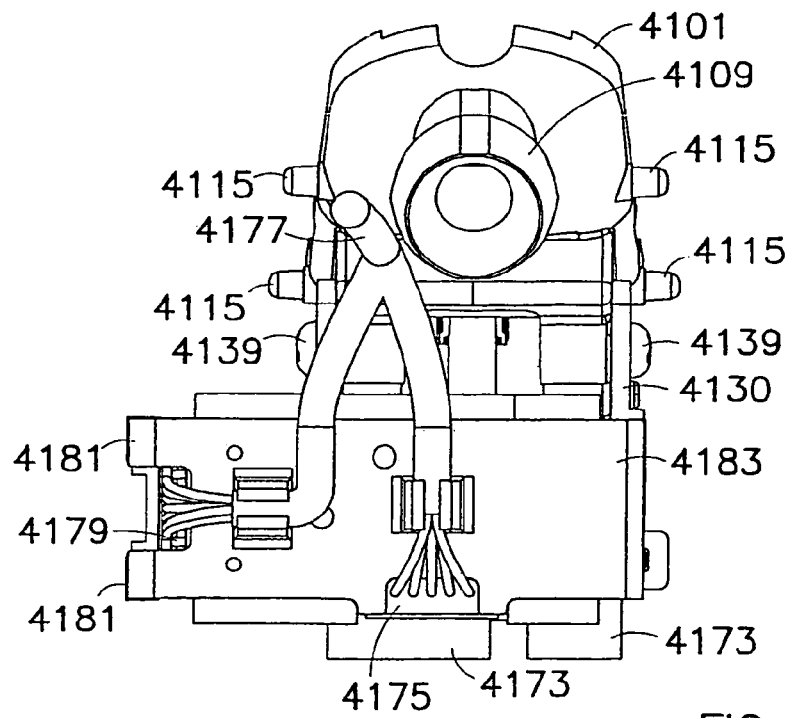
FIG. 49 is a rear elevational view of the mirror mount accessory housing with the housing cover removed.

As described in more detail below, a mirror mount accessory housing 4111 is secured to mount 4101 and includes a housing cover 4113 consisting of a right half portion 4113a and a left half portion 4113b. As best shown in FIG. 44, mount 4101 includes a plurality of laterally extending pegs 4115, which are inserted in corresponding holes 4117 provided in housing cover portions 4113a and 4113b. Additionally, housing cover portions 4113a and 4113b include resilient tabs 4119, which extend through a pair of slots 4121 on mount 4101 to securely hold housing cover 4113 on mount 4101. Housing cover portions 4113a and 4113b further include a plurality of tabs 4123 and a plurality of slotted tongues 4125, which snap together to thereby hold together portions 4113a and 4113b. Housing portion 4113a includes a forward facing aperture 4127 in which a glass filter 4129 may be mounted. As explained further below, aperture 4127 and glass filter 4129 provide a window through which the inventive camera senses images.

The inventive mirror mount accessory housing structure further includes a baffle/printed circuit board (PCB) holder 4130 (also generally referred to herein as a support structure) that is adjustably mounted to mirror mount 4101 and contained within housing cover 4113. As shown in FIG. 44, baffle/PCB holder 4130 includes a pair of slots 4133 for engaging laterally extending pins 4135 on mirror mount 4101. Baffle/PCB holder 4130 further includes a pair of elongated slots 4137 through which screws 4139 are inserted. Screws 4139 extend through slots 4137 and are threadably engaged in holes 4141 provided in mount 4101. By providing slots 4137 as elongated apertures, the tilt of baffle/PCB holder 4130 may be selectively adjusted relative to mount 4101. Such tilt adjustability is desirable given the variance of the slope of vehicle windshields from one model to another. As discussed further below, the image sensor and its associated circuit board are securely mounted to baffle/PCB holder 4130, and thus, the image sensor tilt relative to the vehicle windshield may be adjusted by adjusting the tilt of baffle/PCB holder 4130.

As illustrated in FIG. 44, baffle/PCB holder 4130 includes a baffle 4143 similar to the baffle discussed above. A forward end of baffle 4143 is positioned proximate aperture 4127 and glass filter 4129 while an image sensor 4145, which includes image chip 201, encapsulation block 230, UV cure epoxy 232, lens 202, and an aperture stop 203 (as shown in FIG. 2a), extends into the opposite and rearward end of baffle 4143. Image sensor 4145 is mounted on a PCB 4147 having a connector 4149 mounted thereon. Also mounted on PCB 4147 is an image sensing die (not shown), which functions as a sky sensor in the manner discussed above. To provide light from a skyward view relative to the vehicle, a light pipe 4151 is mounted over the die on PCB 4147 within a light pipe mount 4153, which engages a corresponding light pipe support 4155 on baffle/PCB holder 4130. Light pipe 4151 includes a pair of laterally extending protrusions 4157 that engage corresponding apertures 4159 in a light pipe filler 4161, which has an aperture 4163 through which the distal end of light pipe 4151 extends. Light pipe filler 4161 is mounted within an aperture 4165 formed in an upper surface of housing cover 4113. As will be apparent to those skilled in the art, light pipe 4151 captures the skyward light in its distal end that extends through filler 4161 towards the sky, and the skyward light is then directed through light pipe 4151 to the die on PCB 4147.

As discussed above, a processor may be mounted on PCB 4147 to preprocess some of the image data obtained from image sensor 4145.

A compass PCB 4171 may optionally be mounted within the inventive housing structure 4111. Compass PCB 4171 includes a pair of compass sensors 4173, which may be magneto resistive sensors, magneto inductive sensors, flux-gate sensors, or the like. By mounting compass PCB 4171 on baffle/PCB holder 4130, the relative tilt of sensors 4173 may be adjusted relative to the vehicle horizontal to ensure accurate sensing. Compass PCB 4171 includes a connector (not shown) to which a corresponding connector 4175 may be coupled. Connector 4175 connects compass PCB 4171 to a processor (not shown) in the mirror body via cable 4177. Cable 4177 also connects the same or a different processor within mirror body to PCB 4147 via a coupler 4179 and coupler 4149. A pair of resilient prongs 4181 of a clip structure 4183 is disposed behind PCB 4147 and secures to baffle/PCB holder 4130. Baffle/PCB holder 4130 includes a lateral extension 4187, which extends around connectors 4149 and 4179 and provides a ledge upon which resilient prongs 4181 may latch to secure the clip 4183 and PCB 4147 to baffle/PCB holder 4130 and to assist in securing the engagement of couplers 4149 and 4179.

The above-described mounting structure provides several advantageous features. Specifically, the tilt angle of the image sensor may be selectively adjusted while not requiring movement of the housing cover relative to the mirror mount. This avoids the need to have mounting screws accessible from the exterior of the housing and thus reduces the possibility of someone tampering with the adjustment subsequent to final adjustment by the manufacturer. Further, the interior components shown in FIGS. 46-49 may be secured to mirror mount 4101 after it has been secured to the vehicle windshield and the adjustment may then be made with the housing cover subsequently snapped into place following final adjustment.

An additional advantage is provided by the use of light pipe 4151. In the absence of light pipe 4151, an additional circuit board would need to be mounted at an angle relative to PCB 4147 to aim the die mounted on such an inclined PCB towards the sky above the vehicle.

Although the mirror mount accessory housing has been described for mounting an image sensor, sky sensor, and compass sensors, it will be appreciated that any one or combination of these components may be disposed in the housing. Further, other components may be disposed in the housing in addition to, or in place of, any or all of the above components.

While the present invention has generally been described as preferably utilizing the full capability of the exterior lights to produce a large number of potential beam patterns that may change discretely or through a continuum, it is possible to use the system to simply turn headlamps on and off, as disclosed, for example, in U.S. patent application Ser. No. 09/491,192, entitled VEHICLE EQUIPMENT CONTROL WITH SEMICONDUCTOR LIGHT SENSORS, filed by Jon Bechtel et al. on Jan. 25, 2000, now U.S. Pat. No. 6,379,013, the disclosure of which is incorporated herein by reference.

To the extent described above, the present invention may additionally or alternative include the following features.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield; and a control operable to receive a signal from the imaging sensor, the control being operable to control a headlamp of the vehicle and to control at least one of a windshield wiper of the vehicle and a defogging system of the vehicle in response to the signal wherein the imaging sensor is operable as a component of an active cruise control system.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield; and a control operable to receive a signal from the imaging sensor, the control being operable to control a headlamp of the vehicle and to control at least one of a windshield wiper of the vehicle and a defogging system of the vehicle in response to the signal, the imaging sensor being operable to sense water droplets at the exterior surface of the windshield and fog particles at the interior surface of the windshield, the control being operable to control a windshield wiper of the vehicle in response to the presence of water droplets at the exterior surface of the windshield and to control a defogging system of the vehicle in response to the presence of fog particles at the interior surface of the windshield, wherein the control is operable to control a headlamp of the vehicle in response to the presence of water droplets at the exterior surface of the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield; and a control operable to receive a signal from the imaging sensor, the control being operable to control a headlamp of the vehicle and to control at least one of a windshield wiper of the vehicle and a defogging system of the vehicle in response to the signal, the imaging sensor being operable to sense water droplets at the exterior surface of the windshield and fog particles at the interior surface of the windshield, the control being operable to control a windshield wiper of the vehicle in response to the presence of water droplets at the exterior surface of the windshield and to control a defogging system of the vehicle in response to the presence of fog particles at the interior surface of the windshield, the control being operable to vary a rate of wine of a windshield wiper of the vehicle wherein the control is operable to vary the rate of wipe according to a density of water droplets on the exterior surface of the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the magma sensor being operable to at least sense precipitation at least one of an exterior surface of the windshield and an interior surface of the windshield; and a control operable to receive a signal from the imaging sensor, the control being operable to control a headlamp of the vehicle and to control at least one of a windshield wiper of the vehicle and a defogging system of the vehicle in response to the signal, the imaging sensor being operable to sense fog particles at the interior surface of the windshield, the control being operable to control a defogging system of the vehicle in response to the imaging sensor sensing fog particles at the interior surface of the windshield wherein the control is operable to adjust a blower level of the defogging system of the vehicle in response to a density of the fog particles sensed at the interior surface of the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield; and a control operable to receive a signal from the imaging sensor, the control being operable to control a headlamp of the vehicle and to control at least one of a windshield wiper of the vehicle and a defogging system of the vehicle in response to the signal, the imaging sensor being operable to sense water droplets at an exterior surface of the windshield, the control being operable to control a windshield wiper of the vehicle in response to the imaging sensor sensing water droplets at the exterior surface of the windshield, the control being operable to adjust a rate of wipe of a windshield wiper of the vehicle and the control being operable to control a rear window wiper of the vehicle, the control being operable to control the rear window wiper in response to the imaging sensor sensing water droplets at the exterior surface of the windshield, wherein the control causes a rear window wiper to cycle for every N cycles of a windshield wiper, wherein N is greater than one.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield; a control operable to receive a signal from the imaging sensor, the control being operable to control a headlamp of the vehicle and to control at least one of a windshield wiper of the vehicle and a deforming system of the vehicle in response to the signal; and an illumination device for illuminating the field of view of the imaging sensor, the illumination device being pulsed on and off, wherein the imaging sensor comprises a shutter for exposing the imaging sensor to the field of view forwardly and through the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield; a control operable to receive a signal from the imaging sensor, the control being operable to control a headlamp of the vehicle and to control at least one of a windshield wiper of the vehicle and a defogging system of the vehicle in response to the signal; and an illumination device for illuminating the field of view of the imaging sensor, the illumination device being at least occasionally activated, wherein the illumination device is activated during low light conditions.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield; a control operable to receive a signal from the imaging sensor, the control being operable to control a headlamp of the vehicle and to control at least one of a windshield wiper of the vehicle and a defogging system of the vehicle in response to the signal; and an illumination device for illuminating the field of view of the imaging sensor, the illumination device being at least occasionally activated, wherein the imaging sensor is operable to sense a level of ambient light present at the windshield, the illumination device being activated in response to the imaging sensor sensing low light conditions.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor being positioned at the interior rearview mirror assembly and having a field of view forward and through the windshield, the imaging sensor being operable to at least sense precipitation at least one of an exterior surface of the windshield and an interior surface of the windshield wherein the video device includes a polarizing filter; and a control operable to receive a signal from the imaging sensor, the control being operable to control a headlamp of the vehicle and to control at least one of a windshield wiper of the vehicle and a defogging system of the vehicle in response to the signal.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle, and (iv) a movable window of the vehicle in response to the signal, wherein the imaging sensor is operable as a component of an active cruise control system.

An interior rearview mirror suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield, the imaging sensor being operable to sense water droplets at the exterior surface of the windshield and fog particles at the interior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle and (iv) a movable window of the vehicle in response to the signal, the control being operable to control a windshield wiper of the vehicle in response to the presence of water droplets at the exterior surface of the windshield and to control a defogging system of the vehicle in response to the presence of particles at the interior surface of the windshield wherein the control is operable to control a headlamp of the vehicle in response to the presence of water droplets at the exterior surface of the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield, the imaging sensor being operable to sense water droplets at the exterior surface of the windshield and fog particles at the interior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle and (iv) a movable window of the vehicle in response to the signal, the control being operable to control a windshield wiper of the vehicle in response to the presence of water droplets at the exterior surface of the windshield and to control a defogging system of the vehicle in response to the presence of fog particles at the interior surface of the windshield, the control being operable to vary a rate of wipe of a windshield wiper of the vehicle, wherein the control is operable to vary the rate of wipe according to a density of water droplets on the exterior surface of the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle, and (iv) a movable window of the vehicle in response to the signal, the imaging sensor being operable to sense fog particles at the interior surface of the windshield, the control being operable to control a defogging system of the vehicle in response to the imaging sensor sensing fog particles at the interior surface of the windshield wherein the control is operable to adjust a blower level of the defogging system of the vehicle in response to a density of the fog particles sensed at the interior surface of the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield, the imaging sensor being operable to sense water droplets at an exterior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle, and (iv) a movable window of the vehicle in response to the signal, the control being operable to control a windshield wiper of the vehicle in response to the imaging sensor sensing water droplets at the exterior surface of the windshield, the control being operable to adjust a rate of wipe of a windshield wiper of the vehicle, the control being operable to control a rear window wiper of the vehicle, the control being operable to control a rear window wiper in response to the imaging sensor sensing water droplets at the exterior surface of the windshield, wherein the control causes a rear window wiper to cycle for every N cycles of a windshield wiper, wherein N is greater than one.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle, and (iv) a movable window of the vehicle in response to the signal; and an illumination device for illuminating the field of view of the imaging sensor, the illumination device being pulsed on and off, wherein the imaging sensor comprises a shutter for exposing the imaging sensor to the field of view forwardly and through the windshield.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle, and (iv) a movable window of the vehicle in response to the signal; and an illumination device for illuminating the field of view of the imaging sensor, the illumination device being at least occasionally activated, wherein the illumination device is activated during low light conditions.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield; and a control operable to receive a signal from the imaging sensor, the control being operable to digitally process the signal and to control at least two of (i) a headlamp of the vehicle, (ii) a windshield wiper of the vehicle, (iii) a defogging system of the vehicle, and (iv) a movable window of the vehicle in response to the signal; and an illumination device for illuminating the field of view of the imaging sensor, the illumination device being at least occasionally activated wherein the imaging sensor is operable to sense a level of ambient light present at the windshield, the illumination device being activated in response to the imaging sensor sensing low light conditions.

An interior rearview mirror system suitable for use in a vehicle, the interior rearview mirror system comprising: an interior rearview mirror assembly adapted for attachment to an interior portion of the vehicle, the interior rearview mirror assembly comprising a housing and a reflective element included within the housing; and a video device, the video device including an imaging sensor, the imaging sensor having a field of view forward through the windshield, the imaging sensor being operable to at least sense precipitation at least one of an exterior surface of the windshield and an interior surface of the windshield wherein the video device includes a polarizing filter; and a control operable to receive a signal from the imaging sensor, the control being operable to digitally process the signal and to control at least two of (i) a headlamp of the vehicle, (ii) a windshield wiper of the vehicle, (iii) a defogging system of the vehicle, and (iv) a movable window of the vehicle in response to the signal.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing the electrochromic interior rearview mirror assembly comprising electrochromic control circuitry for controlling the electrochromic reflective element; and a video device, the video device including an imaging array sensor, the imaging array sensor having a field of view forward through the windshield; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (iii) a defogging system of the vehicle, and (iv) a movable window of the vehicle in response to the signal, wherein the imaging array sensor is operable as a component of an active cruise control system.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing, the electrochromic interior rearview mirror assembly comprising electrochromic control circuitry (or controlling the electrochromic reflective element; and a video device, the video device including an imaging array sensor, the imaging array sensor having a field of view forward through the windshield, the imaging array sensor being operable to sense precipitation at least one of an exterior surface of the windshield and an interior surface of the windshield, the imaging array sensor being operable to sense water droplets at the exterior surface of the windshield and fog particles at the interior surface of the windshield; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (ii) a defogging system of the vehicle, and (iv) a movable window of the vehicle in response to the signal, the control being operable to control a windshield wiper of the vehicle in response to the presence of water droplets at the exterior surface of the windshield and to control a defogging system of the vehicle in response to the presence of fog particles at the interior surface of the windshield, wherein the control is operable to control a headlamp of the vehicle in response to the presence of water droplets at the exterior surface of the windshield.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing, the electrochromic interior rearview mirror assembly comprising electrochromic control circuitry for controlling the electrochromic reflective element; and a video device, the video device including an imaging array sensor, the imaging array sensor having a field of view forward through the windshield, the imaging array sensor being operable to sense precipitation at least one of an exterior surface of the windshield and an interior surface of the windshield, the imaging array sensor being operable to sense water droplets at the exterior surface of the windshield and fog particles at the interior surface of the windshield; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (iii) a defogging system of the vehicle, and (iv) a movable window of the vehicle in response to the signal, the control being operable to control a windshield wiper of the vehicle in response to the presence of water droplets at the exterior surface of the windshield and to control a defogging system of the vehicle in response to the presence of fog particles at the interior surface of the windshield, the control being operable to vary a rate of wipe of a windshield wiper of the vehicle, wherein the control is operable to vary the rate of wipe according to a density of water droplets present at the exterior surface of the windshield.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing, the electrochromic interior rearview mirror assembly comprising electrochromic control circuitry for controlling the electrochromic reflective element; and a video device, the video device including an imaging array sensor, the imaging array sensor having a field of view forward through the windshield, the imaging array sensor being operable to sense fog particles at an interior surface of the windshield; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (iii) a defogging system of the vehicle, and (iv) a movable window of the vehicle in response to the signal, the control being operable to control a defogging system of the vehicle in response to the imaging array sensor sensing fog particles at the interior surface of the windshield, wherein the control is operable to adjust a blower level of the defogging system of the vehicle in response to a density of the fog particles sensed at the interior surface of the windshield.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing the electrochromic interior rearview mirror assembly comprising electrochromic control circuitry for controlling the electrochromic reflective element; and a video device, the video device including an imaging array sensor, the imaging array sensor having a field of view forward through the windshield, the imaging array sensor being operable to sense water droplets at an exterior surface of the windshield; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (iii) a defogging system of the vehicle, and (iv) a movable window of the vehicle in response to the signal, the control being operable to control a windshield wiper of the vehicle in response to the imaging array sensor sensing water droplets at the exterior surface of the windshield, the control being operable to adjust a rate of wipe of a windshield wiper of the vehicle, the control being operable to control a rear window wiper of the vehicle in response to the imaging array sensor sensing water droplets at the exterior surface of the windshield wherein the control causes a rear window wiper to cycle for every N cycles of a windshield wiper, wherein N is greater than one.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing, the electrochromic interior rearview mirror assembly comprising electrochromic control circuitry for controlling the electrochromic reflective element; and a video device, the video device including an imaging array sensor, the imaging array sensor having a field of view forward through the windshield; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (iii) a defogging system of the vehicle, and (iv) a movable window of the vehicle in response to the signal; and an illumination device for illuminating the field of view of the imaging array sensor, the illumination device being pulsed on and off wherein the imaging array sensor comprises a shutter for exposing the imaging array sensor to the field of view forwardly and through the windshield.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing, the electrochromic interior rearview mirror assembly comprising electrochromic control circuitry for controlling the electrochromic reflective element; and a video device, the video device including an imaging array sensor, the imaging array sensor having a field of view forward through the windshield; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (iii) a defogging system of the vehicle, and (iv) a movable window of the vehicle in response to the signal; and an illumination device for illuminating the field of view of the imaging array sensor, the illumination device being at least occasionally activated, wherein the illumination device is activated during low light conditions.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing, the electrochromic interior rearview mirror assembly comprising electrochromic control circuitry for controlling the electrochromic reflective element; and a video device, the video device including an imaging array sensor, the imaging array sensor having a field of view forward through the windshield; and a control sharing at least one component of the electrochromic control circuitry, the control receiving a signal from the imaging array sensor and being operable to digitally process the signal and to control at least two of (i) a headlamp, of the vehicle, (ii) a windshield wiper of the vehicle, (iii) a defogging system of the vehicle, and (iv) a movable window of the vehicle in response to the signal; and an illumination device for illuminating the field of view of the imaging array sensor, the illumination device being at least occasionally activated, wherein the imaging array sensor is operable to sense a level of ambient light present at the windshield, the illumination device being activated in response to the imaging array sensor sensing low light conditions.

An interior rearview mirror system suitable for use in a vehicle, the interior rearview mirror system comprising: an electrochromic interior rearview mirror assembly adapted for attachment to an interior portion of the vehicle, the interior rearview mirror assembly comprising a housing and an electrochromic reflective element included within the housing, the electrochromic interior rearview mirror assembly comprising electrochromic control circuitry for controlling the electrochromic reflective element; and a video device, the video device including an imaging array sensor, the imaging array sensor having a field of view forward through the windshield, wherein the video device includes a polarizing filter; and a control sharing at least one component of the electrochromic control circuitry, the control receiving a signal from the imaging array sensor and being operable to digitally process the signal and to control at least two of (i) a headlamp of the vehicle, (ii) a windshield wiper of the vehicle, (iii) a defogging system of the vehicle, and (iv) a movable window of the vehicle in response to the signal.

An interior rearview mirror system suitable for use in a vehicle, the interior rearview mirror system comprising: an interior rearview mirror assembly adapted for attachment to an interior portion of the vehicle, the interior rearview mirror assembly comprising an electrochromic reflective element; electronic circuitry operable to control the electrochromic reflective element; an imaging sensor positioned with a field of view through a window of the vehicle; a rain sensor control responsive to an output signal of the imaging sensor, the rain sensor control being operable to control at least one of a windshield wiper of the vehicle and a defogging system of the vehicle in response to the output signal; a headlamp control responsive to an output signal of the imaging sensor, the headlamp control being operable to control a headlamp of the vehicle in response to the output signal; and wherein the rain sensor control and the headlamp control at least one of (a) access a common component of the electronic circuitry, and (b) share a common component of the electronic circuitry.

While the invention has been described in detail herein in accordance with certain embodiments thereof, many modifications and changes may be effected by those skilled in the art without departing from the spirit of the invention. Accordingly, it is intended that the appended claims not be limited by way of details and instrumentalities describing the embodiments shown herein.

The invention claimed is:

1. A control system to control the headlamps of a vehicle, the vehicle having a microwave receiver for receiving signals from satellites, said control system comprising:
a control circuit for receiving signals from the microwave receiver indicative of the location of the vehicle, said control circuit controls the headlamps to limit the perceived brightness of the headlamps from exceeding a predetermined level less than their capacity when the vehicle is traveling on a residential street.

2. The control system of claim 1, wherein said control circuit determines whether the vehicle is traveling on a residential street based on the signals received from the microwave receiver.

3. The control system of claim 2, wherein the headlamps of the vehicle operate in at least a high beam mode and a low beam mode, and wherein said control circuit inhibits operation of the headlamps in the high beam mode when the vehicle is traveling on a residential street.

4. The control system of claim 2, wherein the headlamps of the vehicle operate in at least a high beam mode, a super-high beam mode, and a low beam mode, and wherein said control circuit inhibits operation of the headlamps in the super-high beam mode when the vehicle is not traveling on an expressway or divided highway.

5. The control system of claim 4, wherein said control circuit inhibits operation of the headlamps in the super-high beam mode when the vehicle is traveling in a geographic region in which the operation of headlamps in a super-high beam mode is prohibited.

6. The control system of claim 2, wherein said control circuit uses the location of the vehicle to determine whether the vehicle is presently driving in a region where vehicles are driven on the left-hand side of the road or in a region where vehicles are driven on the right-hand side of the road.

7. A control system to control the headlamps of a vehicle, the vehicle having a microwave receiver for receiving signals from satellites and further having headlamps operable in at least a high beam mode, a super-high beam mode, and a low beam mode, said control system comprising:
a control circuit for receiving signals from the microwave receiver indicative of the location of the vehicle and for determining whether the vehicle is traveling on either an expressway or a divided highway based upon the signals received from the microwave receiver, said control circuit inhibits operation of the headlamps in the super-high beam mode when the vehicle is not traveling on either an expressway or a divided highway.

8. The control system of claim 7, wherein the headlamps are operated in a super-high beam mode when the headlamps produce illumination having an intensity of greater than 75,000 cd at 0° vertical and horizontal.

9. The control system of claim 7, wherein said control circuit inhibits operation of the headlamps in the super-high beam mode when the vehicle is traveling in a geographic region in which the operation of headlamps in a super-high beam mode is prohibited.

10. A control system to control the headlamps of a vehicle, the vehicle having a microwave receiver for receiving signals from satellites and further having headlamps operable in at least a high beam mode, a super-high beam mode, and a low beam mode, said control system comprising:
a control circuit for receiving signals from the microwave receiver indicative of the location of the vehicle and for determining a geographic region in which the vehicle is traveling based upon the signals received from the microwave receiver, said control circuit inhibits operation of the headlamps in the super-high beam mode when the vehicle is traveling in a geographic region in which the operation of headlamps in a super-high beam mode is prohibited.

11. The control system of claim 10, wherein the headlamps are operated in a super-high beam mode when the headlamps produce illumination having an intensity of greater than 75,000 cd at 0° vertical and horizontal.

* * * * *

UNITED STATES PATENT AND TRADEMARK OFFICE
CERTIFICATE OF CORRECTION

PATENT NO. : 7,653,215 B2  Page 1 of 1
APPLICATION NO. : 11/251554
DATED : January 26, 2010
INVENTOR(S) : Joseph S. Stam It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 991 days.

Signed and Sealed this

Twenty-third Day of November, 2010

David J. Kappos
*Director of the United States Patent and Trademark Office*